United States Patent
Louie et al.

(10) Patent No.: US 11,818,878 B2
(45) Date of Patent: *Nov. 14, 2023

(54) NAND STRING UTILIZING FLOATING BODY MEMORY CELL

(71) Applicant: Zeno Semiconductor, Inc., Sunnyvale, CA (US)

(72) Inventors: Benjamin S Louie, Fremont, CA (US); Jin-Woo Han, San Jose, CA (US); Yuniarto Widjaja, San Jose, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/868,722

(22) Filed: Jul. 19, 2022

(65) Prior Publication Data

US 2022/0367472 A1 Nov. 17, 2022

Related U.S. Application Data

(60) Continuation of application No. 17/219,564, filed on Mar. 31, 2021, now Pat. No. 11,417,658, which is a
(Continued)

(51) Int. Cl.
| | |
|---|---|
| *G11C 5/06* | (2006.01) |
| *H10B 12/00* | (2023.01) |
| *H01L 21/265* | (2006.01) |
| *G11C 16/04* | (2006.01) |
| *H01L 27/088* | (2006.01) |

(Continued)

(52) U.S. Cl.
CPC ............. *H10B 12/20* (2023.02); *G11C 5/063* (2013.01); *G11C 11/4096* (2013.01); *G11C 11/4099* (2013.01); *G11C 16/0416* (2013.01); *G11C 16/0483* (2013.01); *H01L 21/26586* (2013.01); *H01L 23/528* (2013.01); *H01L 27/0886* (2013.01); *H01L 29/1087* (2013.01); *H01L 29/1095* (2013.01); *H01L 29/66659* (2013.01); *H01L 29/785* (2013.01); *H01L 29/7841* (2013.01); *H10B 12/50* (2023.02);
(Continued)

(58) Field of Classification Search
CPC ........ H10B 12/20; H10B 69/00; H10B 43/35; H10B 41/35; H10B 12/50; G11C 5/063; G11C 11/4096; G11C 11/4099; G11C 16/0416; G11C 16/0483; G11C 2211/4016
USPC .......................................................... 365/72
See application file for complete search history.

(56) References Cited

U.S. PATENT DOCUMENTS

| | | |
|---|---|---|
| 4,300,212 A | 11/1981 | Simko |
| 4,385,308 A | 5/1983 | Uchida |

(Continued)

OTHER PUBLICATIONS

Chatterjee, et al. "Taper isolated dynamic gain RAM cell." Electron Devices Meeting, 1978 International. vol. 24. IEEE, 1978, pp. 698-699.

(Continued)

*Primary Examiner* — Huan Hoang
(74) *Attorney, Agent, or Firm* — Law Office of Alan W. Cannon

(57) ABSTRACT

NAND string configurations and semiconductor memory arrays that include such NAND string configurations are provided. Methods of making semiconductor memory cells used in NAND string configurations are also described.

18 Claims, 37 Drawing Sheets

Related U.S. Application Data continuation of application No. 16/706,148, filed on Dec. 6, 2019, now Pat. No. 10,991,697, which is a continuation of application No. 16/132,675, filed on Sep. 17, 2018, now Pat. No. 10,546,860, which is a continuation of application No. 15/628,931, filed on Jun. 21, 2017, now Pat. No. 10,103,148, which is a continuation of application No. 15/161,493, filed on May 23, 2016, now Pat. No. 9,704,578, which is a division of application No. 14/267,112, filed on May 1, 2014, now Pat. No. 9,368,625.

(60) Provisional application No. 61/829,262, filed on May 31, 2013, provisional application No. 61/818,305, filed on May 1, 2013.

(51) Int. Cl.
*H01L 29/66* (2006.01)
*H10B 41/35* (2023.01)
*H10B 43/35* (2023.01)
*H10B 69/00* (2023.01)
*H01L 29/78* (2006.01)
*H01L 23/528* (2006.01)
*G11C 11/4096* (2006.01)
*G11C 11/4099* (2006.01)
*H01L 29/10* (2006.01)

(52) U.S. Cl.
CPC ............ *H10B 41/35* (2023.02); *H10B 43/35* (2023.02); *H10B 69/00* (2023.02); *G11C 2211/4016* (2013.01)

(56) References Cited

U.S. PATENT DOCUMENTS

| | | |
|---|---|---|
| 4,959,812 A | 9/1990 | Momodoni et al. |
| 5,519,831 A | 5/1996 | Holzhammer |
| 5,581,504 A | 12/1996 | Chang et al. |
| 5,748,538 A | 5/1998 | Lee et al. |
| 5,767,549 A | 6/1998 | Chen et al. |
| 5,999,444 A | 12/1999 | Fujiwara et al. |
| 6,005,818 A | 12/1999 | Ferrant et al. |
| 6,064,100 A | 5/2000 | Wen |
| 6,141,248 A | 10/2000 | Forbes et al. |
| 6,163,048 A | 12/2000 | Hirose et al. |
| 6,166,407 A | 12/2000 | Ohta |
| 6,243,293 B1 | 6/2001 | Van Houdt et al. |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,625,057 B2 | 9/2003 | Iwata |
| 6,661,042 B2 | 12/2003 | Hsu |
| 6,686,624 B2 | 2/2004 | Hsu |
| 6,714,447 B2 | 3/2004 | Satoh et al. |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,845,042 B2 | 1/2005 | Ichige et al. |
| 6,870,751 B2 | 3/2005 | van Brocklin et al. |
| 6,885,581 B2 | 4/2005 | Nemati et al. |
| 6,912,150 B2 | 6/2005 | Portman et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,209,384 B1 | 4/2007 | Kim |
| 7,224,019 B2 | 5/2007 | Hieda et al. |
| 7,259,420 B2 | 8/2007 | Anderson et al. |
| 7,259,992 B2 | 8/2007 | Shirota |
| 7,280,399 B2 | 10/2007 | Fazan et al. |
| 7,285,820 B2 | 10/2007 | Park et al. |
| 7,301,803 B2 | 11/2007 | Okhonin et al. |
| 7,301,838 B2 | 11/2007 | Waller et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,498,630 B2 | 3/2009 | Ichige et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,933,139 B2 | 4/2011 | Lung |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,868 B2 | 4/2012 | Widjaja |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja |
| 8,243,499 B2 | 8/2012 | Widjaja |
| 8,264,875 B2 | 9/2012 | Widjaja et al. |
| 8,294,193 B2 | 10/2012 | Widjaja |
| 8,391,066 B2 | 3/2013 | Widjaja |
| 8,461,035 B1 | 6/2013 | Cronquist et al. |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,797,804 B2 | 8/2014 | Tanzawa |
| 8,817,548 B2 | 8/2014 | Widjaja et al. |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,025,358 B2 | 5/2015 | Widjaja |
| 9,029,922 B2 | 5/2015 | Han et al. |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,208,880 B2 | 12/2015 | Louie et al. |
| 9,209,188 B2 | 12/2015 | Widjaja |
| 9,230,651 B2 | 1/2016 | Widjaja et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,275,723 B2 | 3/2016 | Louie et al. |
| 9,391,079 B2 | 7/2016 | Widjaja |
| 9,401,206 B2 | 7/2016 | Widjaja |
| 9,431,401 B2 | 8/2016 | Han et al. |
| 9,455,262 B2 | 9/2016 | Widjaja |

(56) References Cited

U.S. PATENT DOCUMENTS

| | | |
|---|---|---|
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja et al. |
| 9,524,970 B2 | 12/2016 | Widjaja |
| 9,576,962 B2 | 2/2017 | Widjaja et al. |
| 9,589,963 B2 | 3/2017 | Widjaja |
| 9,601,493 B2 | 3/2017 | Widjaja |
| 9,601,993 B2 | 3/2017 | Kawano |
| 9,614,080 B2 | 4/2017 | Widjaja |
| 9,646,693 B2 | 5/2017 | Widjaja |
| 9,653,467 B2 | 5/2017 | Widjaja et al. |
| 9,666,275 B2 | 5/2017 | Widjaja |
| 9,679,648 B2 | 6/2017 | Widjaja |
| 9,704,578 B2 | 7/2017 | Louie et al. |
| 9,704,870 B2 | 7/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 9,812,203 B2 | 11/2017 | Widjaja |
| 9,812,456 B2 | 11/2017 | Widjaja |
| 9,831,247 B2 | 11/2017 | Han et al. |
| 9,847,131 B2 | 12/2017 | Widjaja |
| 9,865,332 B2 | 1/2018 | Louie et al. |
| 9,893,067 B2 | 2/2018 | Widjaja et al. |
| 9,905,564 B2 | 2/2018 | Widjaja et al. |
| 9,922,711 B2 | 3/2018 | Widjaja |
| 9,922,981 B2 | 3/2018 | Widjaja |
| 9,928,910 B2 | 3/2018 | Widjaja |
| 9,960,166 B2 | 5/2018 | Widjaja |
| 9,978,450 B2 | 5/2018 | Widjaja |
| 10,008,266 B1 | 6/2018 | Widjaja |
| 10,026,479 B2 | 7/2018 | Louie et al. |
| 10,032,514 B2 | 7/2018 | Widjaja |
| 10,032,776 B2 | 7/2018 | Widjaja et al. |
| 10,056,387 B2 | 8/2018 | Widjaja |
| 10,074,653 B2 | 9/2018 | Widjaja |
| 10,079,236 B2 | 9/2018 | Widjaja |
| 10,103,148 B2 | 10/2018 | Louie et al. |
| 10,103,149 B2 | 10/2018 | Han et al. |
| 10,109,349 B2 | 10/2018 | Widjaja |
| 10,141,315 B2 | 11/2018 | Widjaja et al. |
| 10,163,907 B2 | 12/2018 | Widjaja et al. |
| 10,181,471 B2 | 1/2019 | Widjaja et al. |
| 10,192,872 B2 | 1/2019 | Widjaja et al. |
| 10,204,684 B2 | 2/2019 | Widjaja |
| 10,204,908 B2 | 2/2019 | Widjaja |
| 10,210,934 B2 | 2/2019 | Widjaja |
| 10,211,209 B2 | 2/2019 | Widjaja |
| 10,242,739 B2 | 3/2019 | Widjaja |
| 10,249,368 B2 | 4/2019 | Widjaja |
| 10,340,006 B2 | 7/2019 | Widjaja |
| 10,340,276 B2 | 7/2019 | Widjaja et al. |
| 10,347,636 B2 | 7/2019 | Widjaja |
| 10,373,685 B2 | 8/2019 | Louie et al. |
| 10,388,378 B2 | 8/2019 | Widjaja |
| 10,403,361 B2 | 9/2019 | Widjaja |
| 10,453,847 B2 | 10/2019 | Widjaja et al. |
| 10,461,083 B2 | 10/2019 | Han et al. |
| 10,461,084 B2 | 10/2019 | Widjaja |
| 10,468,102 B2 | 11/2019 | Widjaja |
| 10,497,443 B2 | 12/2019 | Widjaja |
| 10,504,585 B2 | 12/2019 | Louie et al. |
| 10,515,968 B2 | 12/2019 | Widjaja |
| 10,529,424 B2 | 1/2020 | Widjaja |
| 10,546,860 B2 | 1/2020 | Louie et al. |
| 10,553,281 B2 | 2/2020 | Widjaja |
| 10,593,675 B2 | 3/2020 | Widjaja et al. |
| 10,615,163 B2 | 4/2020 | Widjaja |
| 10,622,069 B2 | 4/2020 | Widjaja |
| 10,629,599 B2 | 4/2020 | Widjaja et al. |
| 10,644,001 B2 | 5/2020 | Widjaja et al. |
| 10,644,002 B2 | 5/2020 | Widjaja |
| 10,707,209 B2 | 7/2020 | Widjaja |
| 10,734,076 B2 | 8/2020 | Widjaja |
| 10,748,904 B2 | 8/2020 | Widjaja et al. |
| 10,797,055 B2 | 10/2020 | Widjaja et al. |
| 10,804,276 B2 | 10/2020 | Widjaja |
| 10,818,354 B2 | 10/2020 | Widjaja |
| 10,825,520 B2 | 11/2020 | Widjaja |
| 10,839,905 B2 | 11/2020 | Louie et al. |
| 10,861,548 B2 | 12/2020 | Widjaja |
| 10,867,676 B2 | 12/2020 | Widjaja |
| 10,978,455 B2 | 4/2021 | Widjaja et al. |
| 10,991,697 B2 | 4/2021 | Louie et al. |
| 10,991,698 B2 | 4/2021 | Widjaja |
| 11,004,512 B2 | 5/2021 | Widjaja |
| 11,011,232 B2 | 5/2021 | Widjaja |
| 11,018,136 B2 | 5/2021 | Widjaja et al. |
| 11,031,401 B2 | 6/2021 | Han et al. |
| 11,037,929 B2 | 6/2021 | Widjaja |
| 11,063,048 B2 | 7/2021 | Widjaja |
| 11,100,994 B2 | 8/2021 | Louie et al. |
| 11,133,313 B2 | 9/2021 | Widjaja |
| 11,183,498 B2 | 11/2021 | Widjaja et al. |
| 11,211,125 B2 | 12/2021 | Widjaja |
| 11,217,200 B2 | 1/2022 | Louie et al. |
| 11,295,813 B2 | 4/2022 | Widjaja |
| 11,348,922 B2 | 5/2022 | Widjaja et al. |
| 11,348,923 B2 | 5/2022 | Widjaja |
| 11,404,420 B2 | 8/2022 | Widjaja |
| 11,417,657 B2 | 8/2022 | Widjaja et al. |
| 11,417,658 B2 * | 8/2022 | Louie .................. H01L 29/1095 |
| 2002/0018366 A1 | 2/2002 | von Schwerin et al. |
| 2002/0048193 A1 | 4/2002 | Tanikawa et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0018164 A1 | 1/2006 | Wu |
| 2006/0044915 A1 | 3/2006 | Park et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0263466 A1 | 11/2007 | Morishita et al. |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0111154 A1 | 5/2008 | Voldman |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173985 A1 | 7/2009 | Lee et al. |
| 2009/0190402 A1 | 7/2009 | Hsu et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0157664 A1 | 6/2010 | Chung |
| 2010/0246277 A1 | 9/2010 | Widjaja |
| 2010/0246284 A1 | 9/2010 | Widjaja |
| 2010/0290271 A1 | 11/2010 | Lung |
| 2011/0032756 A1 | 2/2011 | Widjaja |
| 2011/0042736 A1 | 2/2011 | Widjaja |
| 2011/0044110 A1 | 2/2011 | Widjaja |
| 2011/0170329 A1 | 7/2011 | Kang |

(56) References Cited

U.S. PATENT DOCUMENTS

| | | |
|---|---|---|
| 2011/0228591 A1 | 9/2011 | Widjaja |
| 2011/0228617 A1 | 9/2011 | Wang et al. |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0081976 A1 | 4/2012 | Widjaja et al. |
| 2012/0106234 A1 | 5/2012 | Widjaja |
| 2012/0113712 A1 | 5/2012 | Widjaja |
| 2012/0195123 A1 | 8/2012 | Lee |
| 2012/0217549 A1 | 8/2012 | Widjaja |
| 2012/0230123 A1 | 9/2012 | Widjaja et al. |
| 2012/0241708 A1 | 9/2012 | Widjaja |
| 2012/0281475 A1 | 11/2012 | Oh et al. |
| 2013/0015517 A1 | 1/2013 | Widjaja et al. |
| 2013/0058169 A1 | 3/2013 | Lee et al. |
| 2013/0094280 A1 | 4/2013 | Widjaja |
| 2013/0229857 A1 | 9/2013 | Kajigaya |
| 2013/0250685 A1 | 9/2013 | Widjaja |
| 2013/0264656 A1 | 10/2013 | Widjaja et al. |
| 2014/0036577 A1 | 2/2014 | Widjaja |
| 2014/0159156 A1 | 6/2014 | Widjaja |
| 2014/0160868 A1 | 6/2014 | Widjaja et al. |
| 2014/0198551 A1 | 7/2014 | Louie et al. |
| 2014/0307501 A1 | 10/2014 | Louie et al. |
| 2014/0328128 A1 | 11/2014 | Louie et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0023105 A1 | 1/2015 | Widjaja et al. |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0213892 A1 | 7/2015 | Widjaja |
| 2015/0221650 A1 | 8/2015 | Widjaja et al. |
| 2015/0221653 A1 | 8/2015 | Han et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0086954 A1 | 3/2016 | Widjaja et al. |
| 2016/0111158 A1 | 4/2016 | Widjaja |
| 2016/0148675 A1 | 5/2016 | Louie et al. |
| 2016/0267982 A1 | 9/2016 | Louie et al. |
| 2016/0300613 A1 | 10/2016 | Widjaja |
| 2016/0300841 A1 | 10/2016 | Widjaja |
| 2016/0336326 A1 | 11/2016 | Han et al. |
| 2016/0365444 A1 | 12/2016 | Widjaja |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0092359 A1 | 3/2017 | Louie et al. |
| 2017/0092648 A1 | 3/2017 | Widjaja |
| 2017/0125421 A1 | 5/2017 | Widjaja et al. |
| 2017/0133091 A1 | 5/2017 | Widjaja |
| 2017/0133382 A1 | 5/2017 | Widjaja |
| 2017/0154888 A1 | 6/2017 | Widjaja |
| 2017/0169887 A1 | 6/2017 | Widjaja |
| 2017/0213593 A1 | 7/2017 | Widjaja |
| 2017/0229178 A1 | 8/2017 | Widjaja |
| 2017/0229466 A1 | 8/2017 | Widjaja et al. |
| 2017/0271339 A1 | 9/2017 | Widjaja |
| 2017/0294230 A1 | 10/2017 | Widjaja |
| 2017/0294438 A1 | 10/2017 | Louie et al. |
| 2017/0365340 A1 | 12/2017 | Widjaja |
| 2017/0365607 A1 | 12/2017 | Widjaja |
| 2018/0012893 A1 | 1/2018 | Widjaja et al. |
| 2018/0025780 A1 | 1/2018 | Widjaja |
| 2018/0047731 A1 | 2/2018 | Widjaja |
| 2018/0069008 A1 | 3/2018 | Han et al. |
| 2018/0075907 A1 | 3/2018 | Widjaja |
| 2018/0096721 A1 | 4/2018 | Louie et al. |
| 2018/0158825 A1 | 6/2018 | Widjaja et al. |
| 2018/0166446 A1 | 6/2018 | Widjaja |
| 2018/0174654 A1 | 6/2018 | Widjaja |
| 2018/0182458 A1 | 6/2018 | Widjaja |
| 2018/0182460 A1 | 6/2018 | Widjaja |
| 2018/0219013 A1 | 8/2018 | Widjaja |
| 2018/0233199 A1 | 8/2018 | Widjaja |
| 2018/0301191 A1 | 10/2018 | Widjaja |
| 2018/0301192 A1 | 10/2018 | Louie et al. |
| 2018/0308848 A1 | 10/2018 | Widjaja et al. |
| 2018/0330790 A1 | 11/2018 | Widjaja |
| 2018/0331109 A1 | 11/2018 | Widjaja |
| 2018/0358360 A1 | 12/2018 | Widjaja |
| 2019/0006367 A1 | 1/2019 | Widjaja |
| 2019/0027220 A1 | 1/2019 | Widjaja |
| 2019/0027476 A1 | 1/2019 | Louie et al. |
| 2019/0067289 A1 | 2/2019 | Widjaja et al. |
| 2019/0096889 A1 | 3/2019 | Widjaja et al. |
| 2019/0131305 A1 | 5/2019 | Widjaja et al. |
| 2019/0139962 A1 | 5/2019 | Widjaja |
| 2019/0148381 A1 | 5/2019 | Widjaja et al. |
| 2019/0156889 A1 | 5/2019 | Widjaja |
| 2019/0156890 A1 | 5/2019 | Widjaja |
| 2019/0164974 A1 | 5/2019 | Widjaja |
| 2019/0180820 A1 | 6/2019 | Widjaja |
| 2019/0189212 A1 | 6/2019 | Widjaja |
| 2019/0259763 A1 | 8/2019 | Widjaja et al. |
| 2019/0267089 A1 | 8/2019 | Widjaja |
| 2019/0267382 A1 | 8/2019 | Widjaja |
| 2019/0295646 A1 | 9/2019 | Widjaja |
| 2019/0311769 A1 | 10/2019 | Louie et al. |
| 2019/0355419 A1 | 11/2019 | Widjaja |
| 2020/0013780 A1 | 1/2020 | Widjaja |
| 2020/0013781 A1 | 1/2020 | Widjaja et al. |
| 2020/0035682 A1 | 1/2020 | Han et al. |
| 2020/0051633 A1 | 2/2020 | Widjaja |
| 2020/0075091 A1 | 3/2020 | Louie et al. |
| 2020/0091155 A1 | 3/2020 | Widjaja |
| 2020/0111792 A1 | 4/2020 | Louie et al. |
| 2020/0118627 A1 | 4/2020 | Widjaja |
| 2020/0118628 A1 | 4/2020 | Widjaja |
| 2020/0168609 A1 | 5/2020 | Widjaja et al. |
| 2020/0203346 A1 | 6/2020 | Widjaja |
| 2020/0227415 A1 | 7/2020 | Widjaja et al. |
| 2020/0243529 A1 | 7/2020 | Widjaja et al. |
| 2020/0243530 A1 | 7/2020 | Widjaja |
| 2020/0312855 A1 | 10/2020 | Widjaja |
| 2020/0335503 A1 | 10/2020 | Widjaja et al. |
| 2020/0342939 A1 | 10/2020 | Widjaja |
| 2020/0411521 A1 | 12/2020 | Widjaja et al. |
| 2021/0005608 A1 | 1/2021 | Widjaja |
| 2021/0050059 A1 | 2/2021 | Widjaja |
| 2021/0057027 A1 | 2/2021 | Louie et al. |
| 2021/0074358 A1 | 3/2021 | Widjaja |
| 2021/0217754 A1 | 7/2021 | Louie et al. |
| 2021/0225844 A1 | 7/2021 | Widjaja et al. |
| 2021/0249078 A1 | 8/2021 | Widjaja |
| 2021/0257025 A1 | 8/2021 | Widjaja |
| 2021/0257365 A1 | 8/2021 | Widjaja |
| 2021/0288051 A1 | 9/2021 | Han et al. |
| 2021/0327880 A1 | 10/2021 | Widjaja |
| 2021/0358547 A1 | 11/2021 | Louie et al. |
| 2021/0375870 A1 | 12/2021 | Widjaja |
| 2021/0398981 A1 | 12/2021 | Widjaja |
| 2022/0059537 A1 | 2/2022 | Widjaja et al. |
| 2022/0093175 A1 | 3/2022 | Widjaja |
| 2022/0115061 A1 | 4/2022 | Louie et al. |
| 2022/0199160 A1 | 6/2022 | Widjaja |
| 2022/0262800 A1 | 8/2022 | Widjaja |
| 2022/0278104 A1 | 9/2022 | Widjaja et al. |

OTHER PUBLICATIONS

Chatterjee, et al. Circuit Optimization of the Paper Isolated Dynamic Gain RAM Cell for VLSI Memories, pp. 22-23, 1979.

(56) References Cited

OTHER PUBLICATIONS

Chatterjee, et al. "a survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21. IEEE, 1978, pp. 24-25.
Lanyon et al., "Bandgap Narrowing in Moderately to Heavily Doped Silicon", pp. 1014-1018, No. 7, vol. ED-26, 1979 IEEE.
Leiss, et al, "dRAM Design Using the Taper-Isolated Dynamic RAM Cell." Solid-State Circuits, IEEE Journal of 17.2 (1982): 337-344.
Lin et al., "A new 1T DRAM Cell with enhanced Floating Body Effect", pp. 1-5, Proceedings of the 2006 IEEE International Workshop on Memory Technology.
Ohsawa et al., "Autonomous refresh of floating body cell (FBC)", Electron Devices Meeting, 2008. IEDM 2008. IEEE International. IEEE 2008, pp. 801-804.
Oh et al., "A 4-Bit Double SONOS memory (DSM) with 4 Storage Nodes Per Cell for Ultimate Multi-Bit Operation", pp. 1-2, 2006 Symposium on VLSI Technology Digest of Technical Papers.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Ranica, et al. "Scaled IT-Bulk devices built with CMOS 90nm technology for low-cost eDRAM applications." VLSI Technology, 2005. Digest of Technical Papers. 2005 Symposium on. IEEE, 2005, pp. 38-39.
Reisch, "On bistable behavior and open-base breakdown of bipolar transistors in the avalanche regime-modeling and applications." Electron Devices, IEEE Transactions on 39.6 (1992): 1398-1409.
Sakui et al., "A new static memory cell based on reverse bias current (RBC) effect of bipolar transistor", Electron Devices Meeting, 1988. IEDM'88. Technical Digest, International IEEE, 1988, pp. 44-47.
Sakui et al., "A new static memory cell based on the reverse bias current effect of bipolar transistors", Electron Devices, IEEE Transactions on 36.6 (1989): 1215-1217.
Sze et al., "Physics of Semiconductor Devices", Wiley-Interscience, 2007, p. 104.
Terada et al., "A new VLSI memory cell using capacitance coupling (CC) cell", Electron Devices, IEEE Transactions on 31.9 (1984); pp. 1319-1324.
Villaret et al., "Further insight into the physics and modeling of floating-body capacitorless DRAMs", Electron Devices, IEEE Transactions on 52.11 (2005); pp. 2447-2454.
Ohsawa et al., "Autonomous refresh of floating-body cell due to Current Anomaly of Impact Ionization", vol. 56, No. 10, pp. 2301-2311, 2009.
Ban et al., "A Scaled Floating Body Cell (FBC) memory with High-k+Metal Gate on Thin-Silicon and Thin-BOX fro 16-nm Technology Node and Beyond", Symposium on VLSI Technology, 2008, pp. 92-93.
Campardo et al., VLSI Design of Non-Volatile Memories, Springer-Berlin Heidelberg New York, 2005, pp. 94-95.
Han et al., "Programming/Erasing Characteristics of 45 nm NOR-Type Flash Memory Based on SOI Fin FET Structure", J. Korean Physical Society, vol. 47, Nov. 2005, pp. S564-S567.
Headland, Hot electron injection, Feb. 19, 2004.
Pellizer et al., "A 90 nm Phase Change Memory Technology for Stand-Alone Non-Volatile Memory Applications", Symposium on VLSI Technology Digest of Technical Papers, IEEE, 2006, pp. 1-2.
Ranica et al., "Scaled 1T-Bulk devices built with CMOS 90nm technology for low-cost eDRAM applications", 2005 Symposium on VLSI Technology Digest of Technical Papers, pp. 38-39.
Pierret, Semiconductor Device Fundamentals, ISBN: 0-201-54393-1, 1996, Addison-Wesley Publishing Company, Inc., PNPN Devices 463-476.
Tack et al., "The Multistable Charge-Controlled Memory Effect in SOI Transistors at Low Temperatures", IEEE Transactions on Electron Devices, vol. 37, May 1990, pp. 1373-1382.
Okhonin et al., "A SOI Capacitor-less 1T DRAM Concept", 2001 IEEE International SOI Conference, pp. 153-154.
Ohsawa et al., "An 18.5ns 128Mb SOI DRAM with a Floating Body Cell", IEEE International Solid-State Circuits Conference, 2005, pp. 458-459 and 609.
Okhonin et al., "Principles of Transient Charge Pumping on Partially Depleted SOI MOSFETs", IEEE Electron Device Letters, vol. 23, No. 5, May 2002, pp. 279-281.
Okhonin et al., "A Capacitor-less 1T DRAM Cell", IEEE Electron device Letters, vol. 23, No. 2, Feb. 2002, pp. 85-87.
Ohsawa et al., "Memory Design using One-Transistor Gain Cell on SOI", Tech. Digest, IEEE Internataional Solid-State Circuits, vol. 37, No. 11, 2002, pp. 1510-1522.
Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.
Bawedin et al., "Floating-Body SOI Memory: Concepts, Physics and Challenges", ECS Transactions 19.4 (2009) pp. 243-256.
Ban et al., "Integration of Back-Gate doping for 15-nm node floating body cell (FBC) memory", VLSI Technology (VLSIT), 2010 Symposium on IEEE, 2010, pp. 159-160.
Chiu et al., "Characteristics of a new trench oxide thin film transistor and its 1T-DRAM applications", Solid-State and Integrated Circuit Technology (ICSICT), 2010 10th IEEE International Conference on IEEE, 2010, pp. 1106-1108.
Chiu et al., "A simple process of thin-film transistor using the trench-oxide layer for improving 1T-DRAM performance", Next Generation Electronics (ISNE), 2010 International Symposium on IEEE, 2010, pp. 254-257.
Chun et al., "A 1.1 V, 667 MHZ random cycle, asymmetric 2T gain cell embedded DRAM with a 99.9 percentile retention time of 110 microsec", VLSI Circuits (VLSIC), 2010 IEEE Symposium on, IEEE, 2010, pp. 191-192.
Collaert et al., "A low voltage biasing scheme for aggressively scaled bulk FinFET 1T-DRAM featuring 10s retention at 85 C", VLSI Technology (VLSIT), 2010 Symposium on. IEEE, 2010, pp. 161-162.
Giusi et al., "Bipolar mode operation and scalability of double gate capacitorless 1T-DRAM cells", Electron Devices, IEEE Transactions on, vol. 57, No. 8 (2010), pp. 1743-1750.
Gupta et al., "32nm high-density, high-speed T-RAM embedded memory technology", Electron Devices Meeting (IEDM), 2010 IEEE International, IEEE, 2010, pp. 12.1.1-12.1.4.
Han et al., "Bistable resistor (biristor)-gateless silicon nanowire memory", VLSI Technology (VLSIT), 2010 Symposium on. IEEE, 2010, pp. 171-172.
Han et al., "Biristor-bistable resistor based on a silicon nanowire", Electron Device Letters, IEEE 31.8 (2010), pp. 797-799.
Hubert et al., "Experimental comparison of programming mechanisms in 1T-DRAM cells with variable channel length", Solid-State Device Research Conference (ESSDERC), 2010 Proceedings of the European., pp. 150-153, Sep. 14-16, 2010.
Kim et al., "Vertical double gate Z-RAM technology with remarkable low voltage operation for DRAM application", VLSI Technology (VLSIT), 2010 Symposium on . . . , 2010, pp. 163-164.
Kim et al., "Silicon on replacement insulator (SRI) floating body cell (FBC) memory", VLSI Technology (VLSIT), 2010 Symposium on . . . , IEEE, 2010, pp. 165-166.
Kim et al., "Investigation of 1T DRAM cell with non-overlap structure and recessed channel", Silicon Nanoelectronics Workshop (SNW), 2010, IEEE, 2010, pp. 1-2.
Lu et al., "A simplified superior floating-body/gate DRAM cell", IEEE Elec. Dev. Letters, vol. 30, No. 3, Mar. 2009, pp. 282-284.
Moon et al., "fin-width dependance of BJT-based 1T-DRAM implemented on FinFET", Electron Device Letters, vol. 31, No. 9 (2010), pp. 909-911.
Moon et al., "An optically assisted program method for capacitor-less 1T-DRAM", Electron Devices, IEEE Transactions on . . . , vol. 57, No. 7, 2010, pp. 1714-1718.

(56) References Cited

OTHER PUBLICATIONS

Moon et al., "Ultimately scaled 20nm unified-RAM", Electron Devices Meeting (IEDM), 2010 IEEE International, IEEE, 2010, pp. 12.2.1-12.2.4.
Pulcani et al., "Simulation of intrinsic bipolar transistor mechanisms for future capacitor-less eDRAM on bulk substrate", Electronics, Circuits and Systems (ICECS), 2010 17th IEEE International Conference on . . . , IEEE, 2010, pp. 966-969.
Rodriguez et al., "A-RAM memofy cell: concept and operation", Electron Device Letters, IEEE, vol. 31, No. 9 (2010), pp. 972-974.
Rodriguez et al., "A-RAM Novel capacitor-less DRAM memory", Intl SOI Conference, 2009 IEEE International . . . , pp. 1-2, IEEE, 2009.
Zhang et al., "Total ionizing Dose Effects on FinFET-Based Capacitorless 1T-DRAMs", Nuclear Science, IEEE Trnasactions on . . . , vol. 57, No. 6, 2010, pp. 3298-3304.
Villaret et al., "Mechanisms of charge modulation in the floating body of triple-well nMOSFET capacitor-less DRAMs", Microelectronic Engineering 72 (2004) 434-439.
Almeida et al., "Comparison between low and high read bias in FB-RAM on UTBOX FDSOI devices", IEEE, 1978-1-4673-0192-3/12, 2012, pp. 61-64.
Andrade et al., "The impact of Back Bias on the Floating Body Effect in UTBOX SOI Devices for 1T-FBRAM Memory Applications", 2012 8th International Caribbean Conferences on Devices, Circuits and Systems (ICCDCS), IEEE, 2012,, 978-1-4577-1117-6/12/$26.00.
Aoulaiche et al., "Hot Hole Induced Damage in 1T-FBRAM on Bulk FinFET", 978-1-4244-911-7/11/$26.00. IEEE, 2011, pp. 2D.3.1-2D.3.6.
Aoulaiche et al., "Junction Field Effect on the Retention Time for One-Transistor Floating-Body RAM", IEEE Transactions on Electron Devices, vol. 59, No. 8, Aug. 2012, pp. 2167-2172.
Avci et al., "Floating-Body Diode—A Novel DRAM Device", IEEE Electron Device Letters, vol. 33, No. 2, Feb. 2012, pp. 161-163.
Cao et al., "A Novel 1T-DRAM Cell for Embedded Application", IEEE Transactions on Electron Devices, vol. 59, No. 5, May 2012, pp. 1304-1310.
Cho et al., "Variation-Aware Study of BJT-based Capacitorless DRAM Cell Scaling Limit", Silicon Nanoelectronics Workshop (SNW), 2012 IEEE; 978-1-4673-0996-7.
Cho et al., "Variation Study and Implications for BJT-BasedThin-Body Capacitorless DRAM", IEEE Electron Device Letters, vol. 33, No. 3, Mar. 2012, pp. 312-314.
Chun et al., "A 667 MHZ Logic-Compatible Embedded DRAM Featuring an Asymmetric 2T Gain Cell for High Speed On-Die Caches", IEEE Journal of Solid-State Circuits, vol. 47, No. 2, Feb. 2012, pp. 547-559.
Collaert et al., "Substrate bias dependency of sense margin and retention in bulk FinFET 1T-DRAM cells", Solid-State Electronics 65-66 (2011) 205-210.
Galeti et al., "BJT effect analysis in p- and n-SOI MuGFETs with high-k gate dielectrics and TiN metal gate electrode for a 1T-DRAM application", 978-1-61284-760-3/11/$26.00 © 2011 IEEE.
Gamiz et al., "3D Trigate 1T-DRAM memory cell for 2x nm nodes", 978-1-4673-1081-9/12/$31.00 © 2012 IEEE.
Gamiz et al., "A 20nm Low-Power Triple-Gate Multibody 1T-DRAM cell", 978-1-4577-2084-0/12/$26.00 © 2012 IEEE.
Hwang et al., "Offset Buried Metal Gate Vertical Floating Body Memory Technology with Excellent Retention Time for DRAM Application", 2011 Symposium on VLSI Technology Digest of Technical Papers, pp. 172-173.
Kim et al., "Optical Charge-Pumping: A Universal Trap Characterization Technique for Nanoscale Floating Body Devices", 2011 Symposium on VLSI Technology Digest of Technical Papers, pp. 190-191.
Lee et al., "A Novel Capacitorless 1T DRAM Cell for Data Retention Time Improvement", IEEE Transactions On Nanotechnology, vol. 10, No. 3, May 2011; pp. 462-466.
Liu et al., "A three-dimensional DRAM using floating body cell in FDSOI devices", 978-1-4673-1188-5/12/$31.00 © 2012 IEEE.
Lu et al., "A Floating-Body/Gate DRAM Cell Upgraded for Long Retention Time", IEEE Electron Device Letters, vol. 32, No. 6, Jun. 2011, pp. 731-733.
Mahatme et al., "Total Ionizing Dose Effects on Ultra Thin Buried Oxide Floating Body Memories", 978-1-4577-1680-5/12/$26.00 © 2012 IEEE; pp. MY.3.1-MY.3.5.
Moon et al., "Multi-Functional Universal Device using a Band-Engineered Vertical Structure", 978-1-4577-0505-2/11/$26.00 © 2011 IEEE, pp. 24.6.1-24.6.4.
Nicoletti et al., "The Dependence of Retention Time on Gate Length in UTBOX FBRAM With Different Source/Drain Junction Engineering", IEEE Electron Device Letters, vol. 33, No. 7, Jul. 2012, pp. 940-942.
Pulicani et al., "Simulation of Intrinsic Bipolar Transistor Mechanisms for future capacitor-less eDRAM on bulk substrate." 978-1-4244-8157-6/10/$26.00 2010 IEEE pp. 966-969.
Rodriguez et al., "A-RAM: Novel capacitor-less DRAM memory", 978-1-4244-5232-3/09/$25.00 © 2009 IEEE.
Rodriguez et al., "A-RAM Memory Cell: Concept and Operation", IEEE Electron Device Letters, vol. 31, No. 9, Sep. 2010, pp. 972-974.
Rodriguez et al., "Novel Capacitorless 1T-DRAM Cell for 22-nm Node Compatible With Bulk and SOI Substrates", IEEE Transactions On Electron Devices, vol. 58, No. 8, Aug. 2011, pp. 2371-2377.
Romanjek et al., "Compact (Wg/Lg)=80/85 nm FDSOI 1T-DRAM programmed by Meta Stable Dip", 978-1-4673-0192-3/12/$31.00 © 2012 IEEE, pp. 199-202.
Rothemund et al., "The importance of being modular", 584 | Nature | vol. 485 | May 31, 2012, pp. 584-585.
Shim et al., "A BJT-Based Heterostructure 1T-DRAM for Low-Voltage Operation", IEEE Electron Device Letters, vol. 33, No. 1, Jan. 2012, pp. 14-16.
Shin et al., "A Novel Double HBT-Based Capacitorless 1T DRAM Cell With Si/SiGe Heterojunctions", IEEE Electron Device Letters, vol. 32, No. 7, Jul. 2011, pp. 850-852.
Shin et al., "Vertical-Gate Si/SiGe Double-HBT-Based Capacitorless 1T DRAM Cell for Extended Retention Time at Low Latch Voltage", IEEE Electron Device Letters, vol. 33, No. 2, Feb. 2012, pp. 134-136.
Ventrice et al., "Analytical model of deeply-scaled thyristors for memory applications", Microelectronics and Electron Devices (WMED), 2012 IEEE Workshop on, 978-1-4577-1735-2, pp. 1-4.
Wu et al., "Experimental Demonstration of the High-Performance Floating-Body/Gate DRAM Cell for Embedded Memories", IEEE Electron Device Letters, vol. 33, No. 6, Jun. 2012, pp. 743-745.
Zhang et al., "Total Ionizing Dose Effects on FinFET-Based Capacitor-Less 1T-DRAMs", IEEE Transactions On Nuclear Science, vol. 57, No. 6, Dec. 2010, pp. 3298-3304.
Pelizzer et al., "A 90nm Phase Change Memory Technology for Stand-Alone Non-Volatile Memory Applications", 2006 Symposium on VLSI Technology Digest of Technical Papers, 1-4244-0005-8/06/$20.00 (c) 2006 IEEE.

\* cited by examiner

Floating Body 24 is positively charged and V(SL 16) = 0.0V

FB is neutrally charged: and V(SL 16) = V(FB 24) = 0V

NAND STRING UTILIZING FLOATING BODY MEMORY CELL

CROSS-REFERENCE

This application is a continuation of co-pending application Ser. No. 17/219,564, filed Mar. 31, 2021, which is a continuation of application Ser. No. 16/706,148, filed Dec. 6, 2019, now U.S. Pat. No. 10,991,697, issued on Apr. 27, 2021, which is a continuation of application Ser. No. 16/132,675, filed Sep. 17, 2018, now U.S. Pat. No. 10,546,860, issued on Jan. 28, 2020, which is a continuation of application Ser. No. 15/628,931, filed Jun. 21, 2017, now U.S. Pat. No. 10,103,148, issued on Oct. 16, 2018, which is a continuation of application Ser. No. 15/161,493, filed May 23, 2016, now U.S. Pat. No. 9,704,578, issued on Jul. 11, 2017, which is a division of application Ser. No. 14/267,112, filed May 1, 2014, now U.S. Pat. No. 9,368,625, issued on Jun. 14, 2016, which claims the benefit of U.S. Provisional Application No. 61/818,305, filed on May 1, 2013 and of U.S. Provisional Application No. 61/829,262, filed on May 31, 2013, all of which applications and patents are hereby incorporated herein, in their entireties, by reference thereto, and to which applications we claim priority.

FIELD OF THE INVENTION

The present invention relates to semiconductor memory technology. More specifically, the invention relates to a semiconductor device utilizing an electrically floating body transistor.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

A DRAM cell without a capacitor has been investigated previously. Such memory eliminates the capacitor used in the conventional 1T/1C memory cell, and thus is easier to scale to smaller feature size. In addition, such memory allows for a smaller cell size compared to the conventional 1T/1C memory cell. Chatterjee et al. have proposed a Taper Isolated DRAM cell concept in "Taper Isolated Dynamic Gain RAM Cell", P. K. Chatterjee et al., pp. 698-699, International Electron Devices Meeting, 1978 ("Chatterjee-1"), "Circuit Optimization of the Taper Isolated Dynamic Gain RAM Cell for VLSI Memories", P. K. Chatterjee et al., pp. 22-23, IEEE International Solid-State Circuits Conference, February 1979 ("Chatterjee-2"), and "DRAM Design Using the Taper-Isolated Dynamic RAM Cell", J. E. Leiss et al., pp. 337-344, IEEE Journal of Solid-State Circuits, vol. SC-17, no. 2, April 1982 ("Leiss"), which are hereby incorporated herein, in their entireties, by reference thereto. The holes are stored in a local potential minimum, which looks like a bowling alley, where a potential barrier for stored holes is provided. The channel region of the Taper Isolated DRAM cell contains a deep n-type implant and a shallow p-type implant. As shown in "A Survey of High-Density Dynamic RAM Cell Concepts", P. K. Chatterjee et al., pp. 827-839, IEEE Transactions on Electron Devices, vol. ED-26, no. 6, June 1979 ("Chatterjee-3"), which is hereby incorporated herein, in its entirety, by reference thereto, the deep n-type implant isolates the shallow p-type implant and connects the n-type source and drain regions.

Terada et al. have proposed a Capacitance Coupling (CC) cell in "A New VLSI Memory Cell Using Capacitance Coupling (CC) Cell", K. Terada et al., pp. 1319-1324, IEEE Transactions on Electron Devices, vol. ED-31, no. 9, September 1984 ("Terada"), while Erb has proposed Stratified Charge Memory in "Stratified Charge Memory", D. M. Erb, pp. 24-25, IEEE International Solid-State Circuits Conference, February 1978 ("Erb"), both of which are hereby incorporated herein, in their entireties, by reference thereto.

DRAM based on the electrically floating body effect has been proposed both in silicon-on-insulator (SOI) substrate (see for example "The Multistable Charge-Controlled Memory Effect in SOI Transistors at Low Temperatures", Tack et al., pp. 1373-1382, IEEE Transactions on Electron Devices, vol. 37, May 1990 ("Tack"), "A Capacitor-less 1T-DRAM Cell", S. Okhonin et al., pp. 85-87, IEEE Electron Device Letters, vol. 23, no. 2, February 2002 ("Okhonin") and "Memory Design Using One-Transistor Gain Cell on SOI", T. Ohsawa et al., pp. 152-153, Tech. Digest, 2002 IEEE International Solid-State Circuits Conference, February 2002 ("Ohsawa"), which are hereby incorporated herein, in their entireties, by reference thereto) and in bulk silicon (see for example "A one transistor cell on bulk substrate (1T-Bulk) for low-cost and high density eDRAM", R. Ranica et al., pp. 128-129, Digest of Technical Papers, 2004 Symposium on VLSI Technology, June 2004 ("Ranica-1"), "Scaled 1T-Bulk Devices Built with CMOS 90 nm Technology for Low-Cost eDRAM Applications", R. Ranica et al., 2005 Symposium on VLSI Technology, Digest of Technical Papers ("Ranica-2"), "Further Insight Into the Physics and Modeling of Floating-Body Capacitorless DRAMs", A. Villaret et al, pp. 2447-2454, IEEE Transactions on Electron Devices, vol. 52, no. 11, November 2005 ("Villaret"), "Simulation of intrinsic bipolar transistor mechanisms for future capacitor-less eDRAM on bulk substrate", R. Pulicani et al., pp. 966-969, 2010 17th IEEE International Conference on Electronics, Circuits, and Systems (ICECS) ("Pulicani"), which are hereby incorporated herein, in their entireties, by reference thereto).

Widjaja and Or-Bach describe a bi-stable SRAM cell incorporating a floating body transistor, where more than one stable state exists for each memory cell (for example as described in U.S. Patent Application Publication No. 2010/00246284 to Widjaja et al., titled "Semiconductor Memory Having Floating Body Transistor and Method of Operating" ("Widjaja-1") and U.S. Patent Application Publication No. 2010/0034041, "Method of Operating Semiconductor Memory Device with Floating Body Transistor Using Silicon Controlled Rectifier Principle" ("Widjaja-2"), which are both hereby incorporated herein, in their entireties, by reference thereto). This is bi-stability is achieved due to the applied back bias which causes impact ionization and generates holes to compensate for the charge leakage current and recombination. The applied back bias may be a constant voltage back bias or, alternatively, a periodic pulse of voltage.

Memories are often configured into arrays to improve density and efficiency. For single transistor memories, the most commonly used array configuration are the NOR and NAND array. Memory technologies such as Flash, EEPROM, EPROM, ROM, PROM, Metal Programmable ROM and Antifuse have all been published using variations of both the NAND and/or NOR array structures. The term NOR or NAND configuration refers to how memory elements are connected in the bit line direction. Typically memory arrays are arranged in rows and columns. When an array is arranged so the memory elements in the column direction directly connect to the same common node/line, the connection is said to be in a NOR configuration. For example, 1-transistor NOR Flash Memory has the column configuration where every memory cell has its drain terminal directly connected to common metal line often called the bit line. Note that in a NOR configuration, care must be taken to ensure that unselected cells within a bit line do not interfere with the reading, write or erase of the selected memory cell. This is often a major complication for arrays configured in the NOR orientation since they all share a single electrically connected bit line.

A NAND connection on the other hand has multiple memory cells connected serially together (for example, as described in U.S. Pat. No. 8,514,622, "Compact Semiconductor Memory Device Having Reduced Number of Contacts, Methods of Operating and Methods of Making", which is hereby incorporated herein, in its entirety, by reference thereto). A large group of serially connected memory cells will then be connected to a select or access transistor. These access or select devices will then connect to the bit line, source line or both. For example NAND Flash has a Select Drain Gate (SGD) which connects to 32 to 128 serially connected NAND memory cells. NAND Flash also has a second select gate for the source typically called Select Gate Source (SGS). These NAND groupings of SGD, NAND memory cells and SGS are typically referred to as a NAND String. These Strings are connected through the SGD device to the bit line. Note that the SGD device blocks any interaction between the NAND Memory cells within the string to the bit line.

SUMMARY OF THE INVENTION

In one aspect of the present invention, a NAND string configuration is provided that includes: a plurality of semiconductor memory cells serially connected to one another to form a string of semiconductor memory cells; a select gate drain device connecting one end of the string of semiconductor memory cells to a bit line; and a select gate source device connecting an opposite end of said string of semiconductor memory cells to a common source line; wherein serial connections between at least two of the semiconductor memory cells are contactless.

In at least one embodiment, all serial connections between the semiconductor memory cells are contactless, so that only a contact to the select gate drain device and a contact to the select gate source device are provided.

In at least one embodiment, the NAND string is configured to perform at least one of: injecting charge into or extracting charge out of a portion of at least one of the semiconductor memory cells to maintain a state of the at least one semiconductor memory cell.

In at least one embodiment, at least one of the semiconductor memory devices each comprise a floating body region configured to store data as charge therein to define a state of the semiconductor memory cell; and a back bias region configured to perform the at least one of injecting charge into or extracting charge out of at least a portion of the floating body region.

In at least one embodiment, the floating body region is provided in a fin structure that extends vertically above the back bias region.

In another aspect of the present invention, a semiconductor memory array is provided that includes: a plurality of NAND string configurations, each NAND string configuration including: a plurality of semiconductor memory cells serially connected to one another to form a string of semiconductor memory cells; a select gate drain device connected at one end of the string of semiconductor memory cells; and a select gate source device connected an opposite end of the string of semiconductor memory cells; wherein serial connections between at least two of the semiconductor memory cells are contactless; and wherein the semiconductor memory array comprises at least one of: at least two of the select gate drain devices connected to a common bit line; or at least two of the select gate source devices connected to a common source line.

In at least one embodiment, the semiconductor array includes: a first set of two or more NAND string configurations connected to the common bit line, wherein the common bit line is a first common bit line; and at least a second set of two or more NAND string configurations connected to at least a second common bit line; wherein the first common bit line and the at least a second common bit line are connected to a primary bit line.

In at least one embodiment, the semiconductor array includes: a first set of two or more NAND string configurations connected to the common source line, wherein the common source line is a first common source line; and at least a second set of two or more NAND string configurations connected to at least a second common source line; wherein the first common source line and the at least a second common source line are connected to a primary source line.

In at least one embodiment, at least one of the semiconductor memory cell each include a floating body region configured to store data as charge therein to define a state of the semiconductor memory cell; and a back-bias region configured to perform at least one of injecting charge into or extracting charge out of at least a portion of the floating body region.

In at least one embodiment, the floating body region is provided in a fin structure that extends vertically above the back bias region.

In another aspect of the present invention, a semiconductor memory cell is provided that includes: a floating body region configured to be charged to a level indicative of a state of the memory cell, the floating body region have a first conductivity type selected from p-type conductivity type and n-type conductivity type; the floating body region having a bottom surface bounded by an insulator layer; a first region in electrical contact with the floating body region, the first region exposed at or proximal to a top surface of the floating body region and extending to contact the insulator layer; a second region in electrical contact with the floating body region and spaced apart from the first region, the second region exposed at or proximal to the top surface of the floating body region and extending into the floating body region, wherein the floating body region underlies the second region such that the second region does not extend to contact the insulator layer; a third region in electrical contact with the floating body region and spaced apart from the first and second regions, the third region exposed at or proximal to the top surface of the floating body region and extending to contact the insulator layer; and a gate positioned between the first and second regions; wherein the third region is configured to function as a collector region to maintain a charge of the floating body region, thereby maintaining the state of the floating body region.

In at least one embodiment, the floating body is formed in a substrate having the first conductivity type and the insulator is a buried layer positioned between the bottom surface of the floating body region and a lower portion of the substrate.

In at least one embodiment the top surface of the floating body region is a top surface of the substrate.

In at least one embodiment, the first, second and third regions have a second conductivity type selected from the p-type conductivity type and the n-type conductivity type, and wherein the second conductivity type is different from the first conductivity type.

In at least one embodiment, the semiconductor memory cell further includes a second gate positioned between the second and third regions.

In at least one embodiment, the first and third regions electrically isolate the floating body region from neighboring floating body regions of adjacent ones of the semiconductor memory cell when a plurality of the semiconductor memory cells are joined in an array.

In at least one embodiment, the floating body region and the first, second and third regions are provided in a fin structure that extends vertically above the insulator layer.

In another aspect of the present invention, a method of making a memory cell includes: providing a substrate including a floating body region configured to be charged to a level indicative of a state of the memory cell, the floating body region have a first conductivity type selected from p-type conductivity type and n-type conductivity type; forming first and second gate regions above a top surface of the floating body region, wherein the first and second gate regions are spaced apart from one another. performing an ion implantation process at first angle to a normal to the top surface and at a second angle to the normal to the top surface, wherein the first and second angles are applied from opposite sides of the memory cell and are mirror images of one another; and wherein the gate regions partially block the ion implantation therebetween, resulting in a shallow ion implantation in between the gate regions as a second region; and wherein first and third regions formed outside of the gate regions are deep ion implantation regions.

In at least one embodiment, the method further includes adjusting a distance between the gate regions to vary the depth of the resultant shallow region, wherein decreasing the distance makes the shallow region more shallow and, conversely, increasing the distance makes the shallow region relatively deeper.

In another aspect of the present invention, a method of making a memory cell includes: providing a substrate including a floating body region configured to be charged to a level indicative of a state of the memory cell, the substrate and floating body region have a first conductivity type selected from p-type conductivity type and n-type conductivity type; forming a buried insulator layer between a bottom surface of the floating body region and a lower region of the substrate: forming a first region in electrical contact with the floating body region, the first region exposed at or proximal to a top surface of the substrate and extending to contact the insulator layer; forming a third region in electrical contact with the floating body region and spaced apart from the first, the third region exposed at or proximal to the top surface and extending to contact the insulator layer; contacting a member to the top surface at a location between the first and third regions and spaced apart from the first and third regions, the member being doped with a second conductivity type material selected from p-type conductivity type and n-type conductivity type and different from the first conductivity type; thermally annealing the member a floating body region, whereby dopant outdiffusion from the member forms a second region in the floating body spaced apart from the first and third regions and shallower than the first and third regions, the second region being in electrical contact with the floating body region, exposed at or proximal to the top surface and extending into the floating body region, wherein the floating body region underlies the second region such that the second region does not extend to contact the insulator layer.

In at least one embodiment, the member comprises polysilicon material doped with the second conductivity type material.

In at least one embodiment, the member comprises conductive material.

In at least one embodiment, the conductive material includes at least one of: tungsten, tantalum, titanium, nitrides of tungsten, nitrides of tantalum and nitrides of titanium.

Other aspects of the present invention include the construction, use and operation of floating body memory cells in an array configured in a NAND orientation.

These and other features of the invention will become apparent to those persons skilled in the art upon reading the details of the arrays, strings, memory cells and methods as more fully described below.

DETAILED DESCRIPTION OF THE INVENTION

Before the present memory cells, strings, arrays and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a string" includes a plurality of such strings and reference to "the memory cell" includes reference to one or more memory cells and equivalents thereof known to those skilled in the art, and so forth.

The dates of publication provided regarding the publications described herein may be different from the actual publication dates which may need to be independently confirmed.

Figure 1:
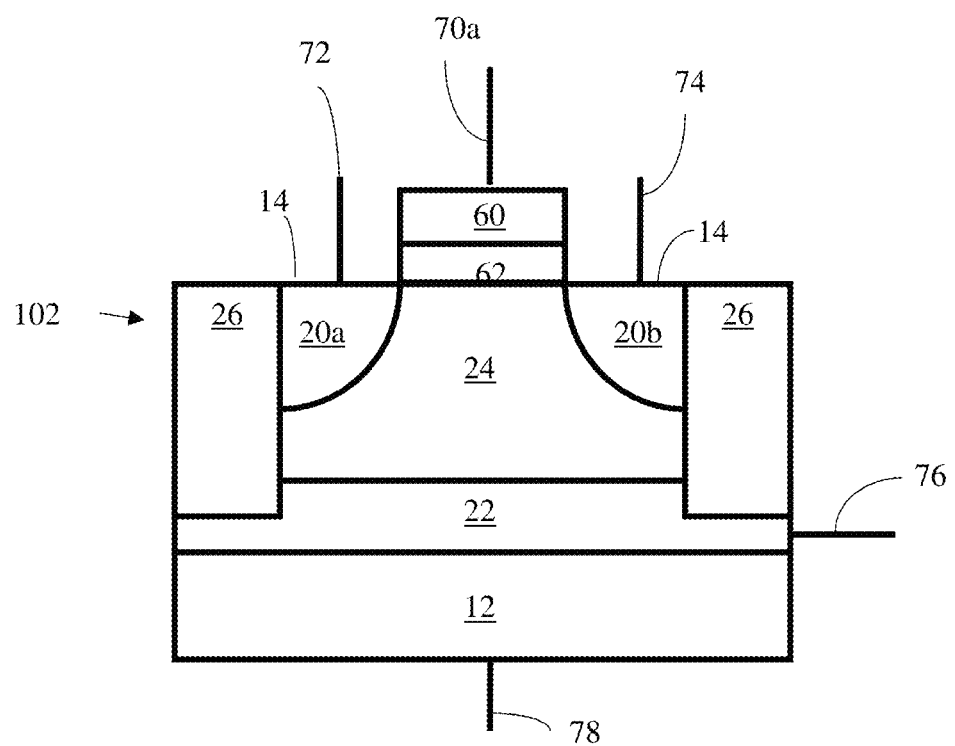
FIG. 1 is a cross-sectional, illustration of a floating body memory cell previously described in Widjaja-1 and Widjaja-2.

FIG. 1 shows a floating body memory cell (FBMC) 102 that has been described for example in Widjaja-1 and Widjaja-2. The cell 102 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 20a having a second conductivity type, such as n-type, for example, is provided in substrate 12 and is exposed at surface 14. A second region 20b having the second conductivity type is also provided in substrate 12, and is also exposed at surface 14. Second region 20b is spaced apart from the first region 20a, as shown. First region 20a and second region 20b may be formed by an implantation process on the material making up substrate 12, according to any of implantation processes known and typically used in the art. Alternatively, a solid state diffusion process may be used to form first region 20a and second region 20b.

A buried layer 22 of the second conductivity type is also provided in the substrate 12, buried in the substrate 12, as shown. Buried layer 22 may also be formed by an ion implantation process on the material of substrate 12. Alternatively, buried layer 22 can be grown epitaxially. A floating body region 24 of the substrate 12 having a first conductivity type, such as a p-type conductivity type, is bounded by surface 14, first and second regions 20a, 20b, insulating layers 26 and buried layer 22. Insulating layers 26 (e.g., shallow trench isolation (STI)), may be made of silicon oxide, for example. Insulating layers 26 insulate cell 102 from neighboring cells 102 when multiple cells 102 are joined in an array. A gate 60 is positioned in between the regions 20a and 20b, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

In another embodiment, the memory cell 102 may be provided with n-type conductivity type as the first conductivity type and p-type conductivity type as the second conductivity type.

Operation of floating body memory cell (FBMC) 102 of FIG. 1 is described, for example in Widjaja-1 and Widjaja-2, which are hereby incorporated herein, in their entireties by reference thereto.

Figure 2:
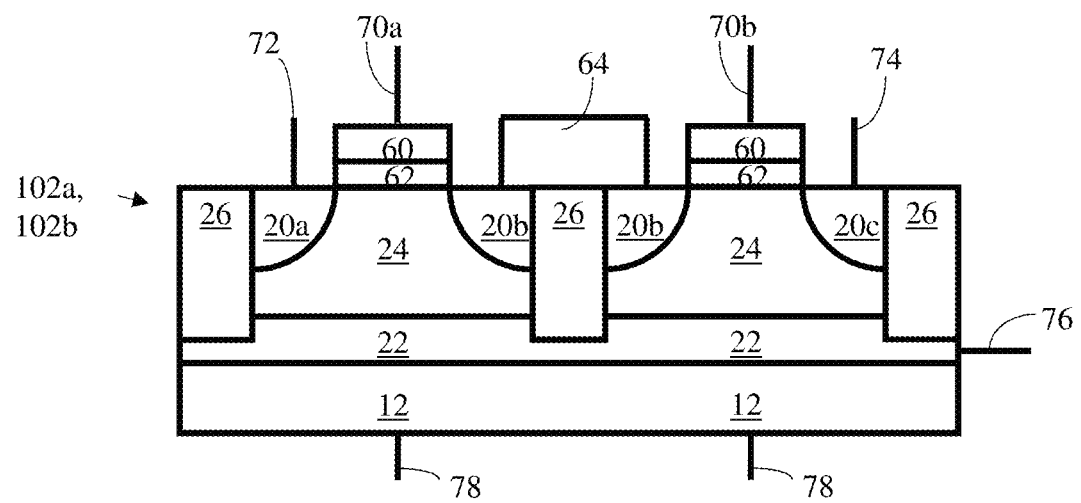
FIG. 2 is a cross-sectional illustration of two floating body memory cells connected in a NAND string configuration, according to an embodiment of the present invention.

FIG. 2 is a cross-sectional illustration of two serially connected floating body memory cells to be used in a FB NAND string 100 according to an embodiment of the present invention. Node 70 (70a, 70b) is the gate connection to the FBMC 102, 102a, 102b (node 70a is gate connection to FBMC 102a and node 70b is gate connection to FBMC 102b), which is typically constructed of a polysilicon or metal material. In FIG. 2, nodes 72 and 74 are the source/drain lines which are connected to node 20a and 20c, (the n+ regions for the NMOS transistor), respectively. Region 24 is the p-type floating body; region 22 is the buried well region, while node 76 is the connection to the DNWell. Region 12 is the substrate and node 78 is the connection to the substrate. Region 26 is the shallow trench isolation (STI). Reference numeral 64 indicates the serial connection between two adjacent cells in the NAND configuration.

Figure 3A:
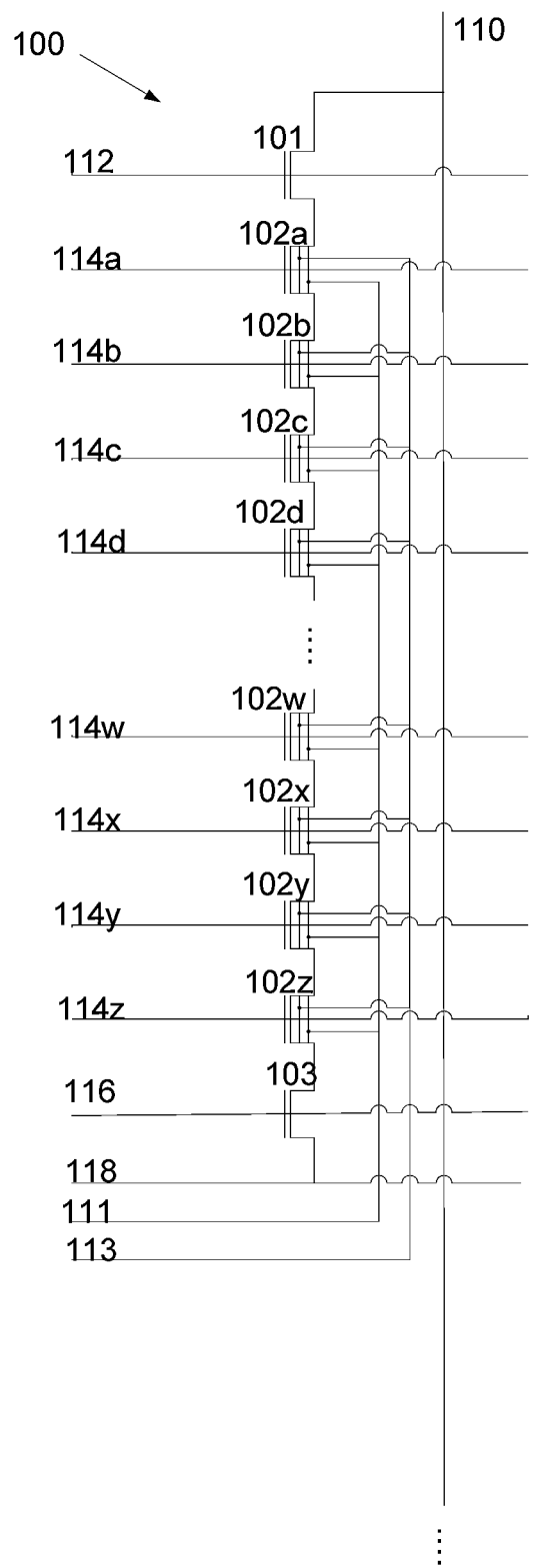
FIG. 3A is a schematic representation of floating body memory cells arranged into a NAND string formation, according to an embodiment of the present invention.
Figure 3B:
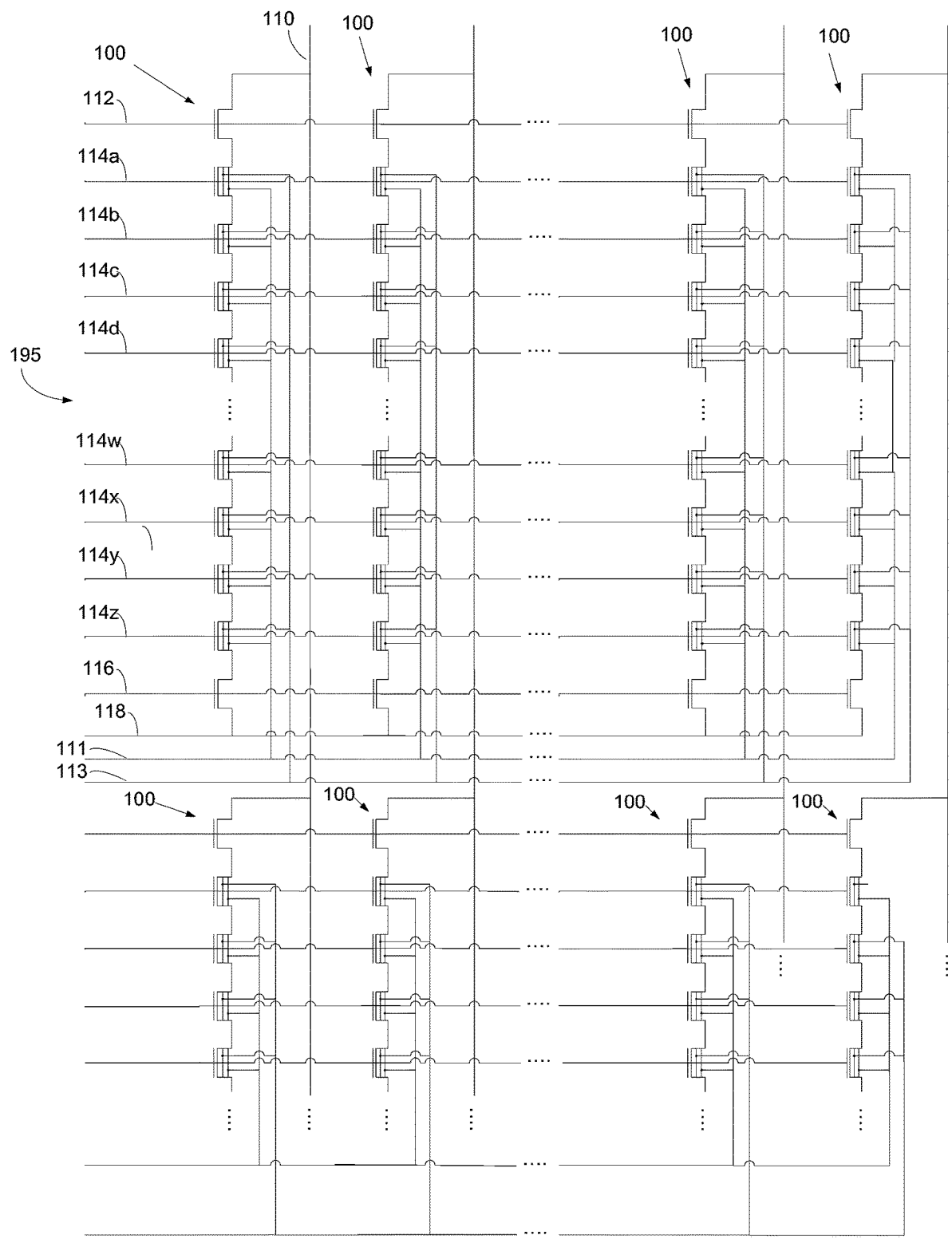
FIG. 3B is a schematic representation of an array of multiple rows and columns of floating body memory cells arranged in NAND strings, according to an embodiment of the present invention.

FIG. 3A is a schematic representation of floating body memory cells (FBMC) 102 arranged into a NAND string formation according to an embodiment of the current invention. The floating body NAND string 100 is strung with a plurality of floating body memory cells 102 (e.g., 102a-102z, as illustrated, although greater or fewer numbers of floating body memory cells 102 may be employed to make floating body NAND string 100). The number of cells provided in the figure are meant for exemplary purposes only and not meant to limit the scope of this invention. Examples include but are not limited to having a string length of 32, 64 or 128 floating body memory cells in length. An NMOS (n-channel MOS (metal-oxide-semiconductor)) transistor 101 is connected to a series of serially connected floating body memory cells (102a to 102z). NMOS transistor 101 is also connected to the bit line 110. This NMOS device 101 will be referred to as the Select Gate Drain or SGD 101. Multiple floating body NAND strings 100 will be connected to the same common bit line 110 through these SGD devices 101. The floating body memory cells 102a to 102z are connected serially together. The last floating body memory cell in the string 102z is connected to NMOS device 103. This device 103 is connected to a common source 118, which can be shared with other floating body NAND strings 100 along columns and/or rows as shown in FIG. 3B, which shows an example of how multiple rows and columns may be configured together to form an array 195. The gate of device 103 is connected to line 116 and is shared among other floating body NAND (FB NAND) strings 100 along the same row. Line 113 is shared between all cells within the floating body NAND string 100 and is connected to the buried well layer 22 to each of the floating body memory cells 102 within the string 100. Line 111 is connected to the substrate 12 and is shared between all FBMC 102 within the NAND string 100 as well as the select transistors SGD 101 and Select Gate Source (SGS) 103. Substrate 12 is typically made of silicon, but may also comprise, for example, germanium, silicon germanium, gallium arsenide, carbon nanotubes, or other semiconductor materials. A buried layer 22 of a second conductivity type such as n-type, for example, is provided in the substrate 12. Buried layer 22 may be formed by an ion implantation process on the material of substrate 12. Alternatively, buried layer 22 can be grown epitaxially on top of substrate 12. Note that this invention is being described as being formed on bulk silicon. This invention also applies to silicon on insulator (SOI) substrates as well.

As described in Widjaja-1 and Widjaja-2, each FBMC 102a to 102z has two distinct stable states which will be referred to as state "1" and state "0" throughout this disclosure. State "1" is defined as a stable state where the floating body 24 voltage is at a high voltage such as 0.6V, while state "0" is defined as a stable state where the floating body 24 is at a low voltage such as 0V. A FBMC 102 that is set to be in state "1" will have a high potential at the floating body 24 which in turn will also lower the FBMC 102 threshold voltage better known as Vt. By lowering the Vt of the FBMC 102, the high floating body potential makes the FBMC 102 easier to conduct by requiring less voltage on the gate 60 to induce conduction between source (20a or 20b) and drain (the other of 20a and 20b), than that required when FBMC is in state "0". Alternatively, a FBMC 102 that is set to be in state "0" will have a floating body voltage close to 0V. FBMC 102 in state "0" will have a higher Vt than FBMC in state "1" and thus require a higher bias on the gate 60 terminal in order to turn on this FBMC 102 and allow conduction between source (one of 20*a* and 20*b*) and drain (the other of 20*a* and 20*b*) of the FBMC 102.

The floating body NAND string 100 has a static or standby condition where the bit line 110 is kept at a low potential such as 0V, the Select Gate Drain or SGD Device 101 is driven high through line 112, the Select Gate Source or SGS device 103 is driven high through line 116, and the source line 118 is driven to a low potential such as 0V. All word lines 114*a* through 114*z* are held at a high enough potential to ensure the NMOS transistor of each FBMC 102*a*-102*z* is turned on regardless of the floating body 24 bias of each. As an example, 1.8V may be used for the word line standby voltage. The voltage applied to the DNWell connection 113 is kept at a high potential to allow proper bi-stable operation of the floating body memory cell 102. As an example 1.8V may be used here. The substrate 12 connection 111 will be held at a low potential such as 0V. Throughout this disclosure, unless specifically mentioned, the DNWell 113 and substrate 111 connections can always be assumed to be a high voltage (1.8V) and a low voltage (0v), respectively, to ensure proper operation of the FBMC 102. Those skilled in the art will appreciate that the detailed voltages, descriptions and examples provided throughout this disclosure are meant for exemplary purposes only and are in no way meant to limit the scope and range of this invention.

Figure 4A:
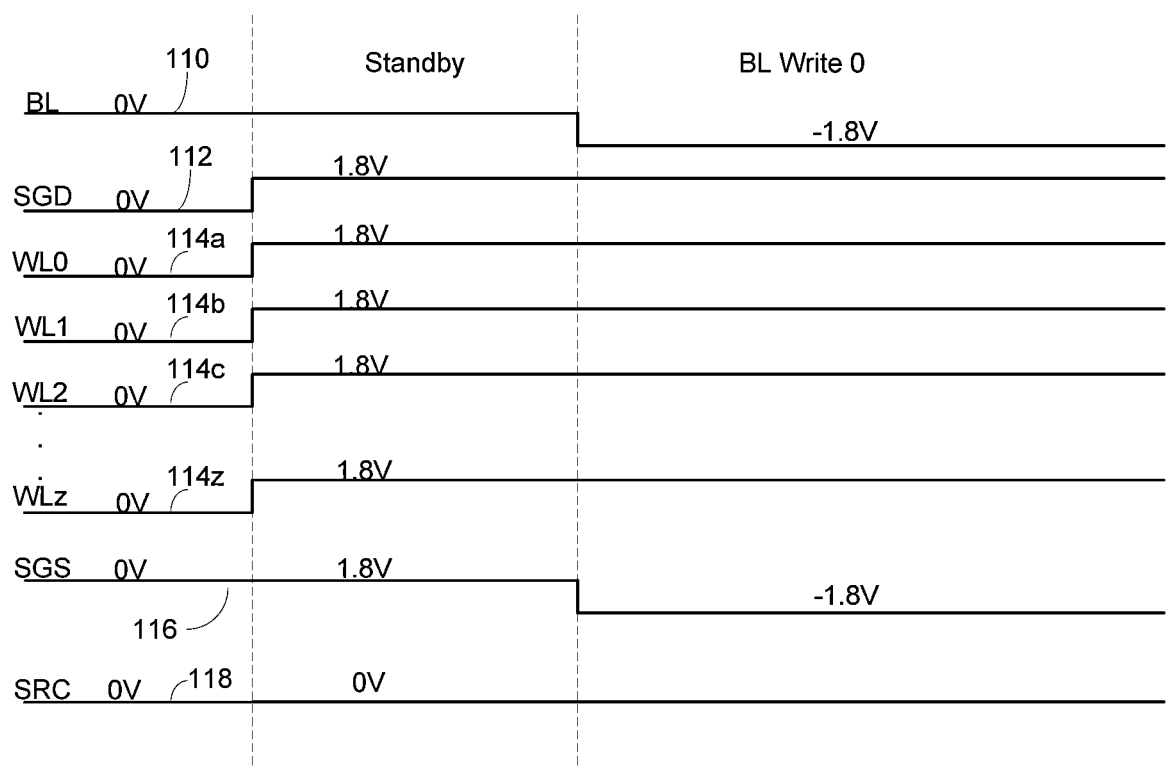
FIG. 4A is a waveform diagram of a bit line write 0 operation, according to an embodiment of the present invention.
Figure 4B:
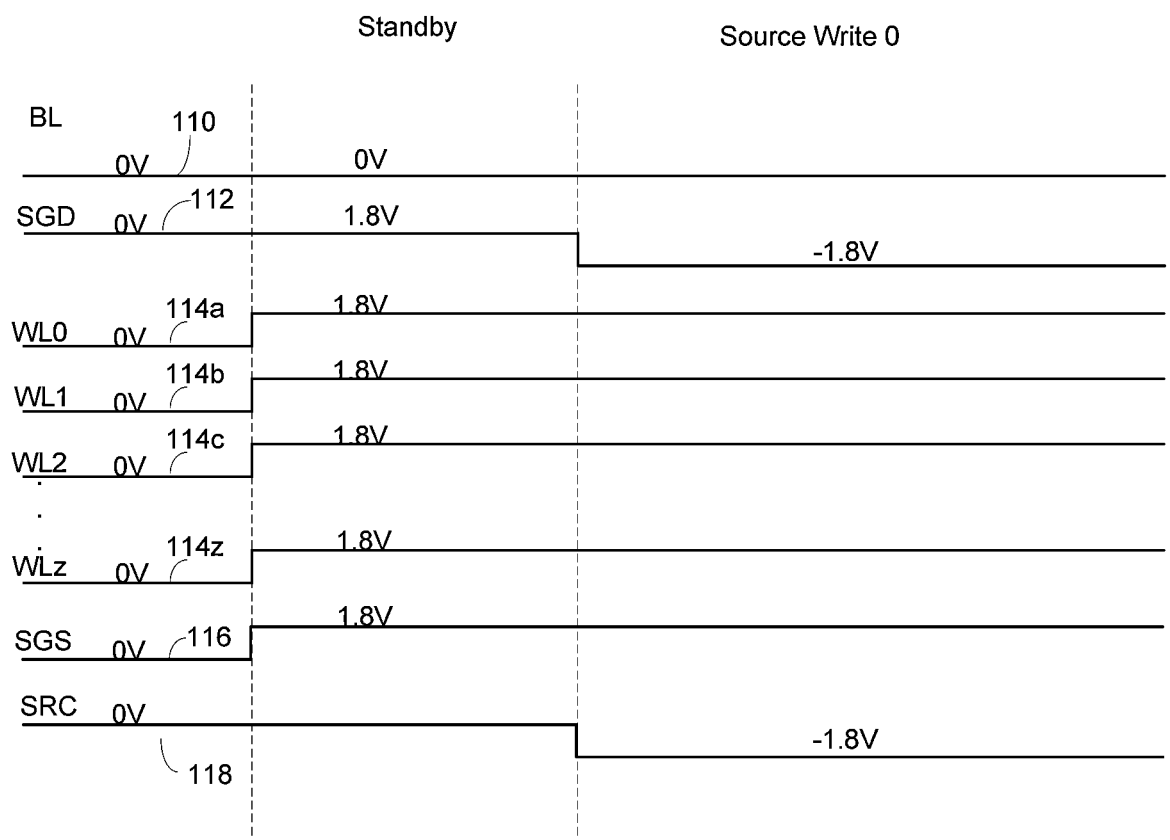
FIG. 4B is a waveform diagram of a source write 0 operation, according to an embodiment of the present invention.
Figure 4C:
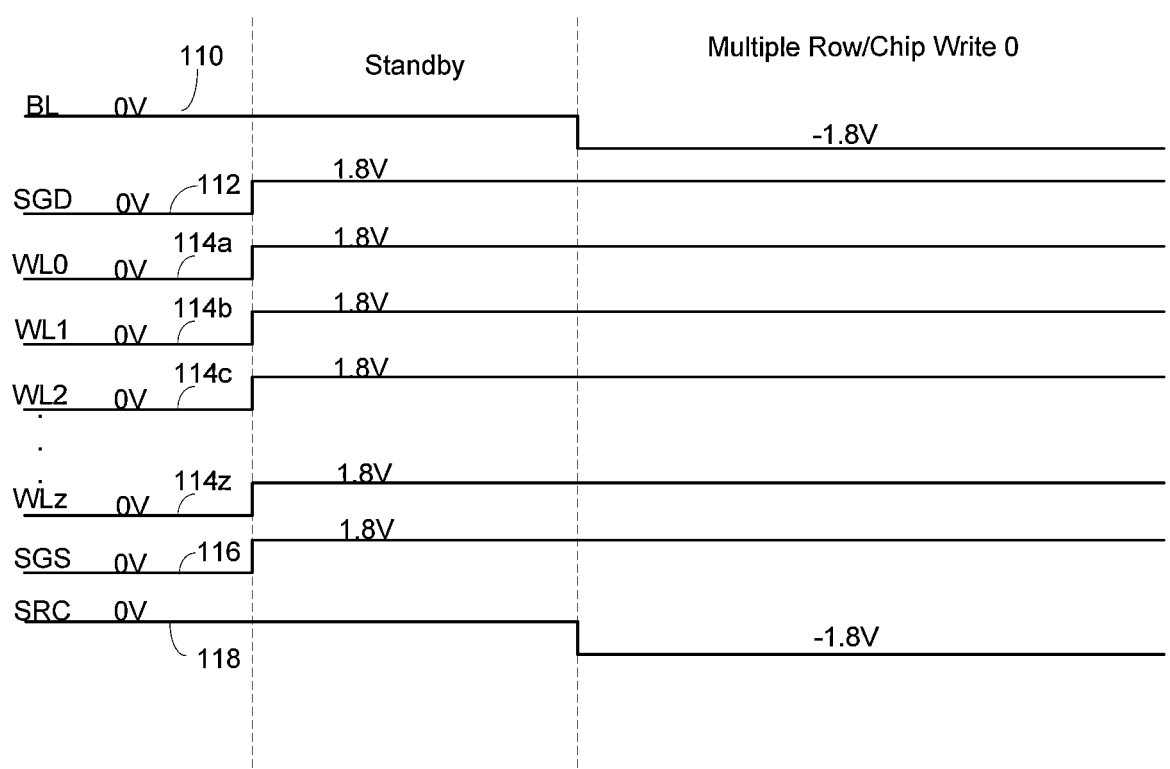
FIG. 4C is a waveform diagram of a multiple row/chip write 0 operation, according to an embodiment of the present invention.

To set all the FBMC 102 within the FB NAND string 100 to state "0", a high negative voltage in the range of −1.0V to −3.0V can be applied to the bit line 110, such as −1.8V as shown in FIG. 4A. Word lines 114*a* to 114*z* can be kept at the standby voltage of 1.8V. Assuming that the SGD 101 device is initially at the standby voltage of 1.8V, the high negative voltage will propagate through the SGD device 101 since the potential between gate and source will be considerably higher than the Vt of the NMOS device 101 and FBMC 102. This propagation of the negative bit line 110 voltage will continue throughout the entire string 100 proceeding to pass through devices 102*a* to 102*z*. In each of the floating body memory cells 102, a highly negative source/drain voltage will forward bias the p-n junction diode between floating body 24 and the n+ source/drain 20*a*/20*b* thereby causing evacuation of holes from the floating body 24. The SGS line 116 will be driven to a negative voltage in order to turn off and prevent the propagation of the negative voltage from the bit line into the source line. Note that this operation will also affect any other cells 102 attached to the same bit line 110 depending on the bias of SGD 112 along other strings attached to the same bit line. If all SGD 112 devices attached to the same bit line are enabled this can be used to erase an entire bit line 110 of memory array 195. Alternately, the write 0 operation may also be implemented through the source as shown in FIG. 4B. In this case, the SGS line 116 is enabled and the SGD line 112 is disabled to prevent propagation of the negative source into the bit line. This would allow for all the cells attached to the same source line to be set to a write 0 condition simultaneously. FIG. 4C shows yet another embodiment of the write 0 operation where both source and bit lines are being driven negative and the SGD 112 and SGS 116 lines are both enabled. In this situation, the negative voltage required to implement write 0 can propagate across the bit line and source line. Those skilled in the art will appreciate how the principle identified in FIG. 4C provides the ability to implement a write 0 operation across multiple rows, blocks or even a full chip by enabling multiple rows of the SGD 112 and SGS 116 lines. Note all the waveform diagrams provided within this disclosure are for exemplary purposes only and are not meant to limit the scope or range of this invention.

An alternate method to perform a write "0" operation (illustrated in FIG. 5, Selective String Write 0) can be employed by selectively setting an FB NAND string 100 to state "0" without using a negative voltage on the SGD 101 and SGS 103 devices. In this method, the SGD device 101 is used as a state "0" select device. A slightly negative voltage is applied through bit line 110 that is below the NMOS Vt (e.g., about −0.4V), which is negative enough to forward bias the p-n junction between the p-type floating body 24 and the transistor n+ source/drain (20*a*/20*b*), but low enough to avoid turning on SGD/SGS NMOS devices (101 and 103) when those devices are driven to a low potential like 0V. For example if an NMOS device has Vt of around 0.6V, the bit line 110 can be biased with a −0.4V bias. This voltage will not pass through the SGD device 101 unless a voltage of at least 0.2V is applied to the gate 112 of the SGD device 101.

Once the negative bit line 110 voltage has been passed through the SGD device 101, it will then set FBMC 102*a* to state "0" due to the forward biasing of the p-n junction between floating body and n+ region of the floating body NMOS device 102. Note that the assumed p-n junction forward bias is only in the situation where the floating body 24 is at a high potential such as 0.6V. If the floating body is already at state "0", there may be little to no current being consumed, since the p-n junction may not have enough potential to forward bias. Since FBMC 102*a* is also an NMOS device similar to the SGD device 101, it also will be required to have the gate 114*a* to be high in order to pass the negative voltage to device 102*b*. If all the word line voltages 114*a* to 114*z* are high, then the entire string will pass the negative bit line voltage. During this operation the SGS device 103 will be turned off by driving the gate 116 to a low enough potential to disable this device 103. An exemplary waveform diagram of this selective write "0" operation is shown in FIG. 5.

Figure 5:
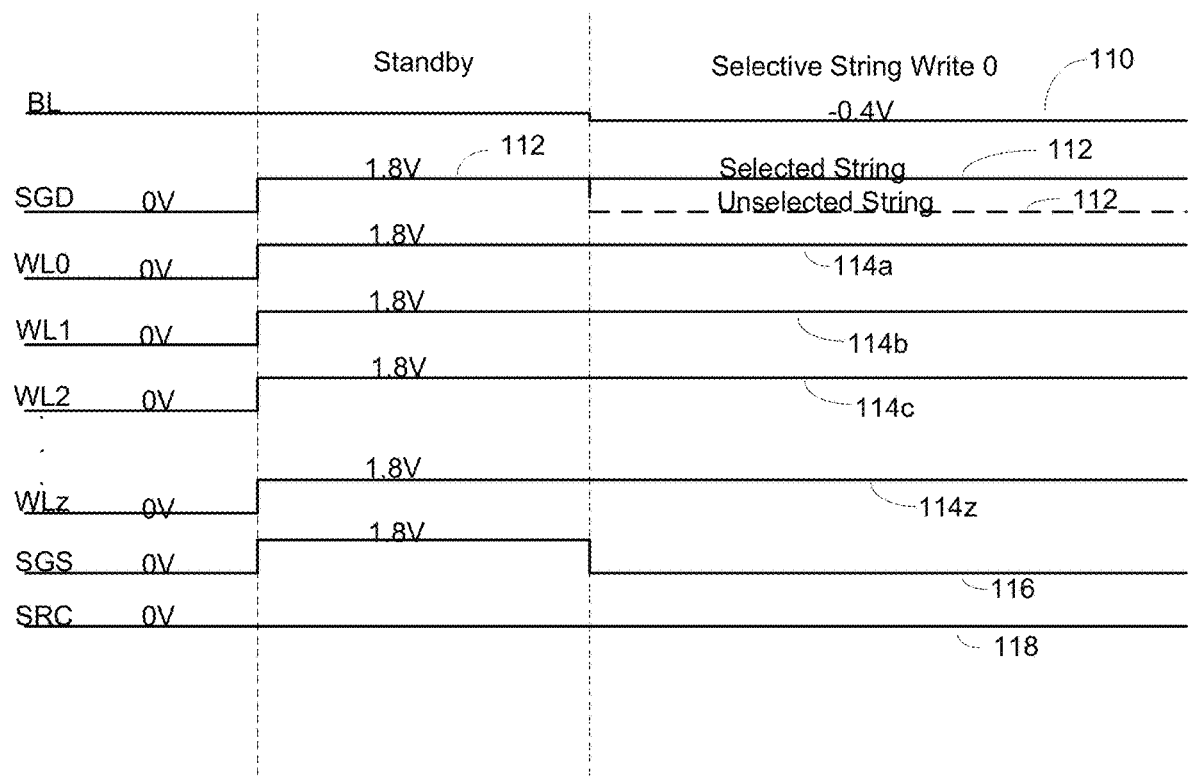
FIG. 5 is a waveform diagram of a string selective write 0 operation, according to an embodiment of the present invention.
Figure 6:
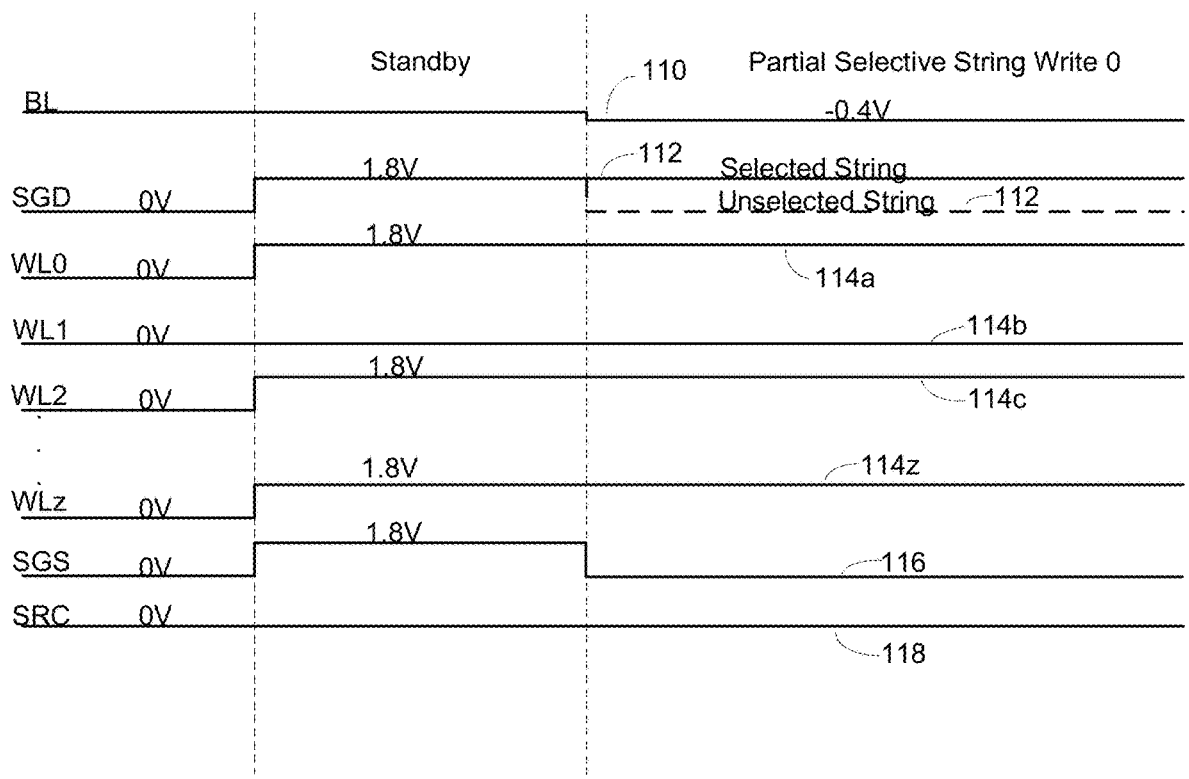
FIG. 6 is a waveform diagram of a partial string selective write 0 operation, according to an embodiment of the present invention.

The method of write "0" described with regard to FIG. 5 can be slightly modified to provide additional selectivity within the NAND string 100 for which bits are set to state "0" by controlling the word line voltages (refer to FIG. 6, Partial Selective String Write 0). By selectively setting the word lines high or low, the user has the option to control how many cells 102 within the NAND string 100 or rows of the array 195 will be set to state "0". However there is a limitation in that the negative voltage must be contiguously passed from the bit line 110 or source 118. Any word line set to 0V can stop the propagation of the negative voltage thus limiting the number of cells 102 or rows of the array 195 that are set to state "0". For example, if a negative voltage is driven from the bit line 110 through the SGD device 101 and 114*b* is set to 0V, while 114*a*, 114*c*, and 114*z* are set to a high positive voltage, then the first cell 102*a* will be set to state "0", while all the remaining cells below (in this example, 114*b* to 114*z*) will be unaffected. This allows for additional selectivity while setting bits to state "0", with the limitation that the number of rows must be connected to the negative bit line or source line voltage. An exemplary waveform diagram of this partial selective write "0" operation is provided in FIG. 6.

Figure 7:
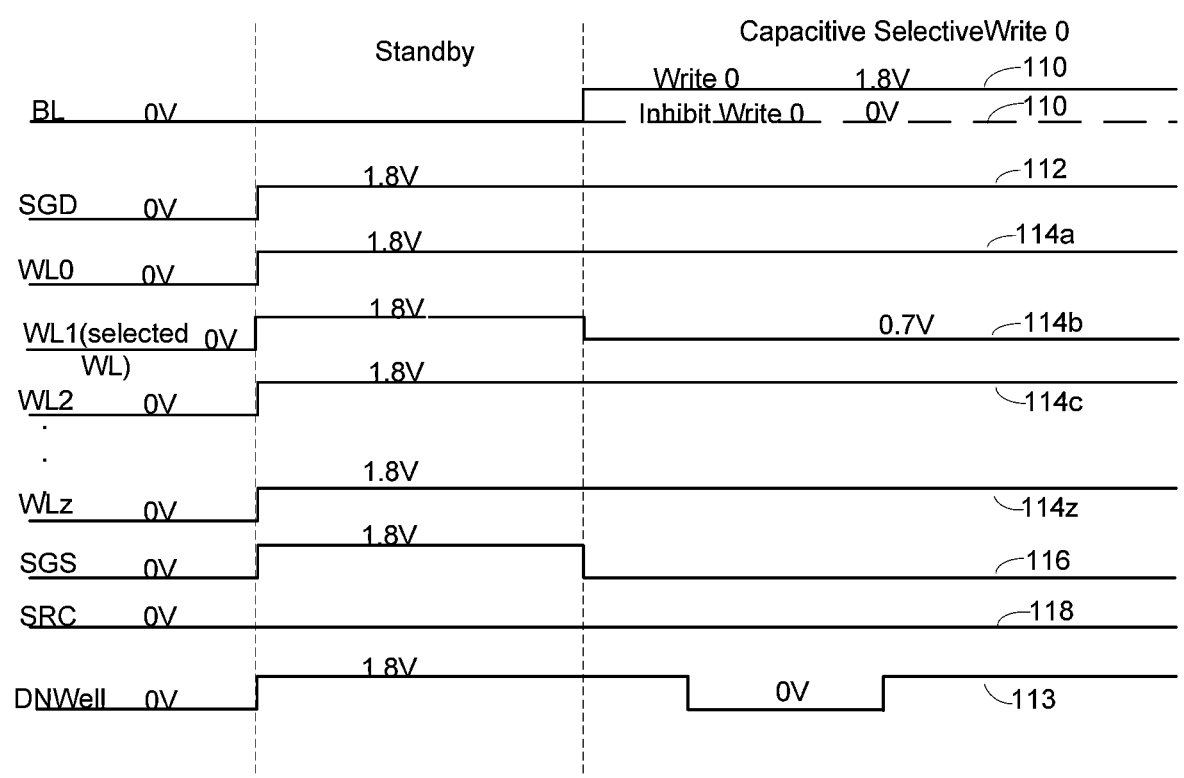
FIG. 7 is a waveform diagram of a capacitive selective write 0, according to an embodiment of the present invention.

To selectively set a single cell to state "0", capacitive coupling may be employed in conjunction with toggling the state of the DNWell, an example of which is illustrated in FIG. 7. To implement this alternative method to write a state "0", the bit line 110 is used to indicate whether it is desired to perform a write "0" operation or inhibit a write "0" operation. A high positive voltage, such as about +1.8V is applied if it is desired to perform a write "0" operation. A low voltage, such as about 0V is applied if it is desired to inhibit a write "0" operation. At the same time all the FBMC word lines 114a-z are driven to a high potential to turn on the selected and unselected cells 102 while the SGD device 101 is driven to a high potential such that under normal operation the SGD device 101 will properly conduct. The SGS device 103 of the selected string 100 is turned off by grounding the SGS gate line 116. At this point the DNWell 113 will be driven from its standby high voltage to a low voltage such that the bi-stable behavior of the FBMC 102 is temporarily disabled. The selected word line (114b in FIG. 7) will then be driven from a high potential to a low potential, however the low potential must still be high enough to ensure that the selected word line will still conduct. For example a voltage of 1.8V may be used as the high selected word line potential and 0.7V may be used for the low bit line potential. This will cause the floating body to couple down through gate coupling in the case where the bit line 110 is high and the FB NAND String 100 is electrically isolated. In the case where the bit line 110 was set to an inhibit 0V state, the 0V will pass through the FB NAND string 100 and act as a shield against any coupling from the gate.

Figure 8:
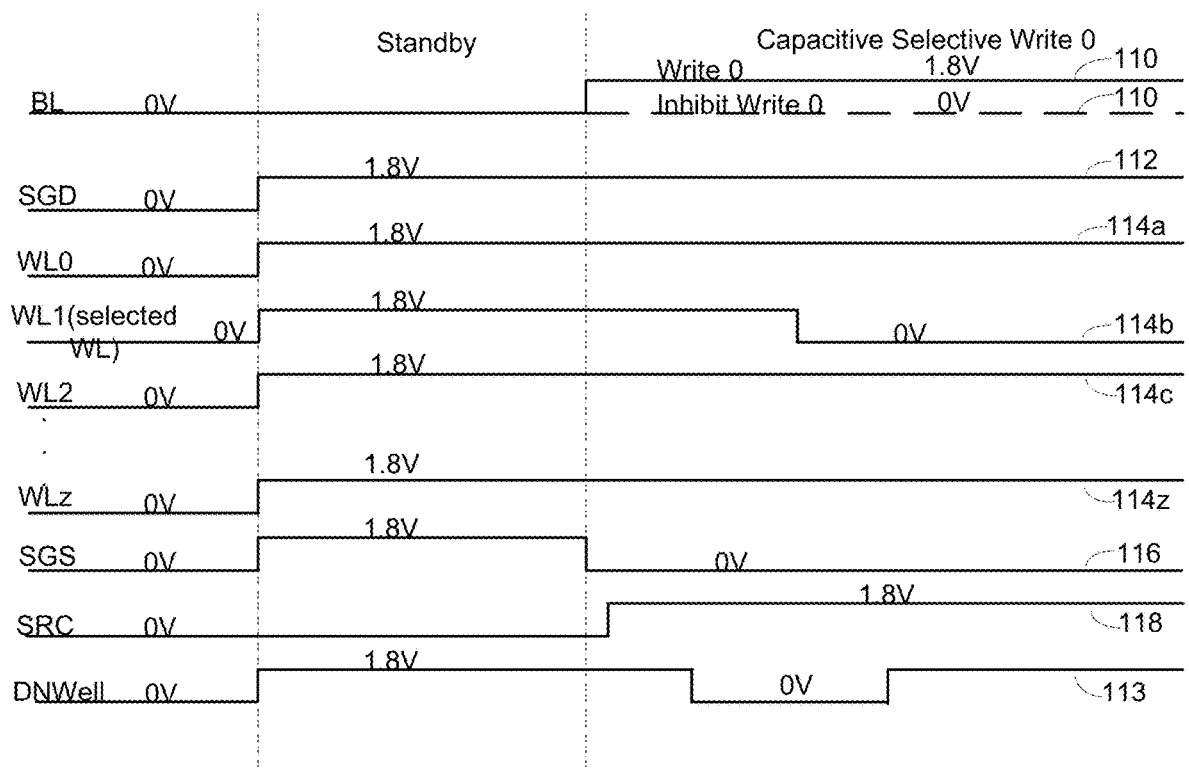
FIG. 8 is a waveform diagram of a capacitive selective write 0 with a high source bias, according to an embodiment of the present invention.

An exemplary waveform diagram of the capacitive selective write "0" operation can be found in FIG. 7. The source 118 bias as shown in FIG. 7 may alternatively be driven to high, as shown in FIG. 8, to prevent any sort of leakage from the string 100 that may occur when the source line is grounded as in FIG. 7. In both FIG. 7 and FIG. 8 it is possible to, alternatively (but not shown) keep the DNWell bias high throughout the entire capacitive selective write 0 operation. This may cause a higher write current and may require additional coupling due to the need to compete against the bi-stable behavior of the floating body memory cell 102.

Figure 9:
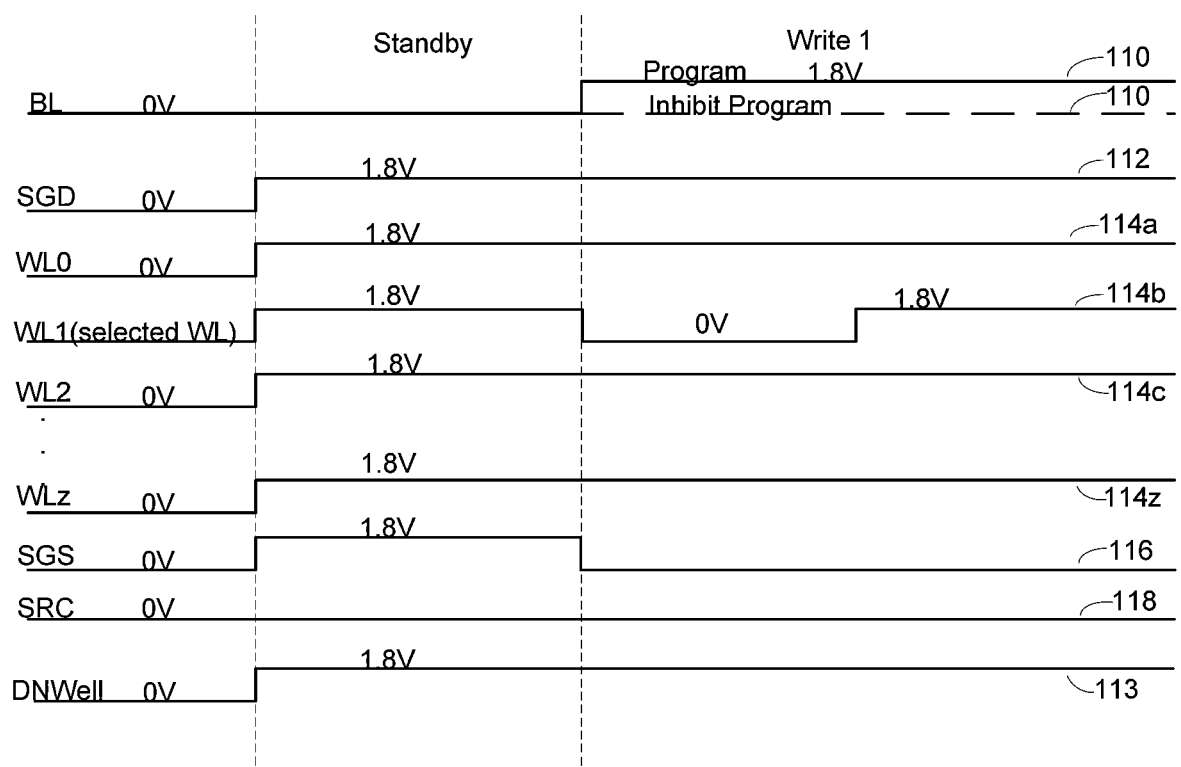
FIG. 9 is a waveform diagram of a selective write 1 operation, according to an embodiment of the present invention.

To set an individual cell 102 to state "1" within the floating body NAND string 100 (e.g., see FIG. 9), a high bit line 110 voltage can be applied such as 1.8V. The SGD device 101 of the selected string 100 is driven to 1.8V through line 112. The SGD device 101 is in cutoff since the voltage between gate and source is less than the NMOS transistor threshold voltage (Vt). All word lines are initially held at a high potential such as 1.8V per the standby state. The selected word line is driven to a low voltage such as 0V. The SGS gate line 116 is set to 0V to turn off the SGS device 103. The selected word line is then driven from 0V, to a high voltage such as 1.8V. The low to high voltage ramp on the word line will cause floating gate potential due to the capacitive coupling between gate 60 to floating body 24. Once the selected word line has been driven above the state "1" voltage, the bi-stable behavior of the FBMC 102 will take effect and hold the floating body 24 to this state until power is removed. This will effectively set the FBMC 102 to state "1" using capacitive coupling. Note that the sequence presented above is for exemplary purposes only and can be modified to various different orders. It is also possible, but not diagramed here, to remove the DNWell bias before the selected word line voltage is applied. The DNWell voltage in this scenario would be reapplied once the FBMC has been set to state "1".

To inhibit the setting of state "1" to other (nonselected) cells 102 within the same word line, the bit line 110 can be held at 0V instead of 1.8V. This causes the SGD device 101 to turn on. Since all the unselected FBMC 102 are biased to a high voltage the 0V can pass through the FB NAND string 100 to the selected FBMC 102. When the selected word line goes high a channel will develop since the transistor is now fully turned on. This channel will be at a near ground potential and prevent the floating body coupling to the rising gate voltage. This will inhibit programming in unselected columns. Note that between setting state "1" and state "0" the only difference is the bit line voltage. This provides bit selectivity during the write state "1" process, while the write state "0" process is limited to an entire FB NAND string or a portion of a FB NAND string.

Figure 10:
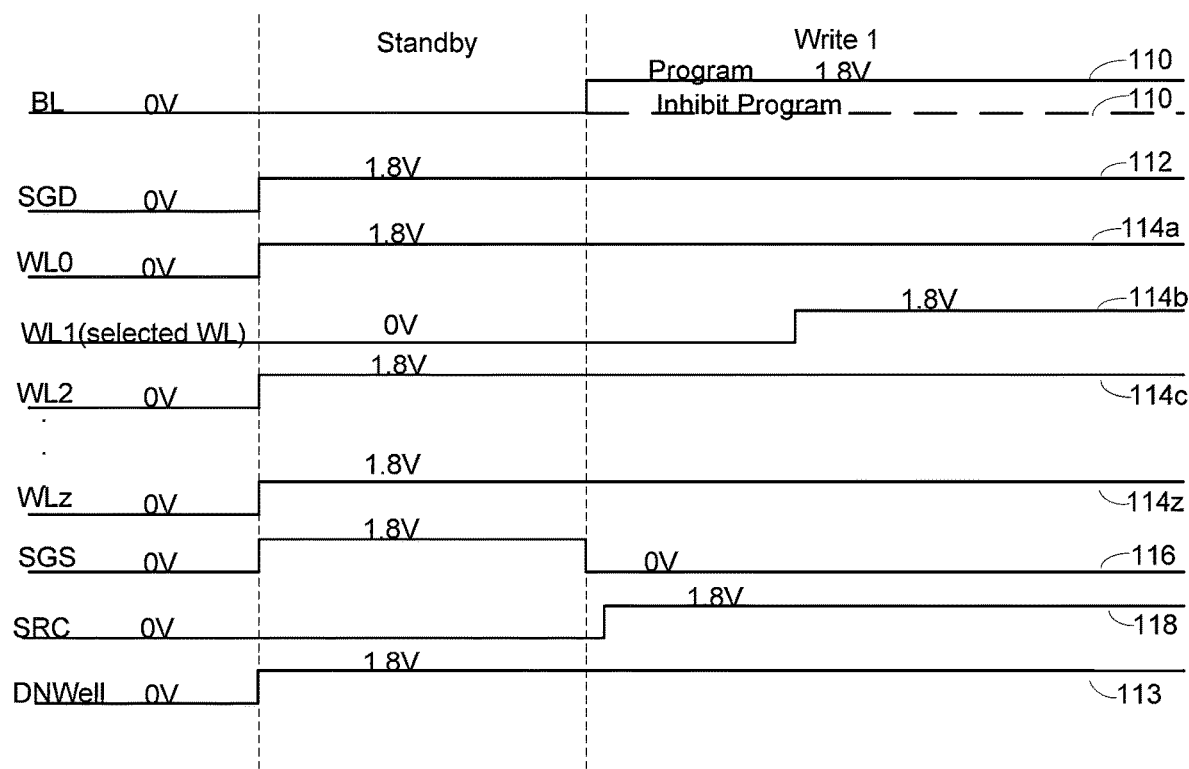
FIG. 10 is a waveform diagram of a selective write 1 operation with a high source bias, according to an embodiment of the present invention.

Unselected floating body NAND strings 100 not within the same selected row will have their SGD devices 101 driven to ground to turn off the SGD devices 101. To properly maintain the bi-stable behavior of the floating body cells 102 within these floating body NAND strings 100, the SGS devices 103 in the unselected strings 100 can be driven high and ground can be provided through the source side without impacting the bit line 110 voltage. An exemplary waveform diagram of the write 1 including the inhibit operation is provided in FIG. 9. Note that the source line can alternatively be biased to a high potential such as 1.8V to avoid potential leakage out from the FB NAND string 100 as shown in FIG. 10.

Figure 11:
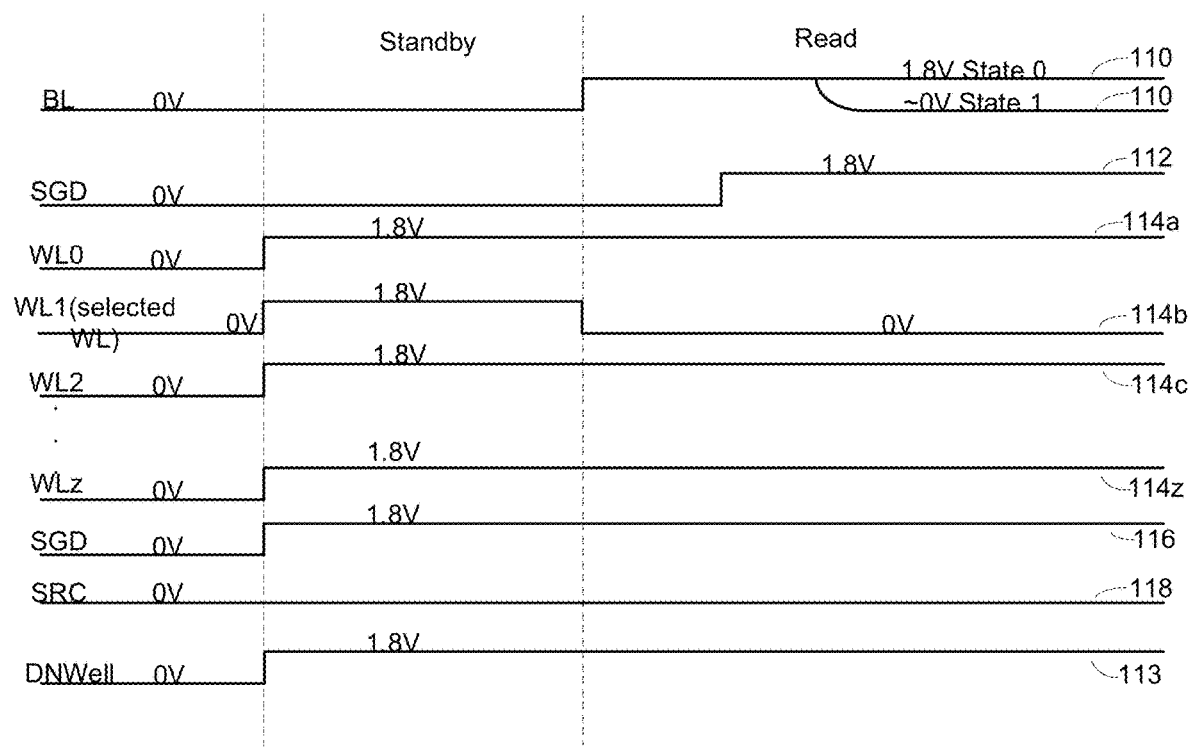
FIG. 11 is a waveform diagram of a read operation according to an embodiment of the present invention.

An exemplary read operation is shown in FIG. 11. In this operation the bit line 110 is driven to a high potential to allow conduction of current through the FB NAND String 100. Note the bit line bias can be actively supplied or pre-charged to a high potential. The selected word line (114b in FIG. 11 example) is driven to a low potential which turns off the selected transistor of FBMC 102b. The SGD device 101 is also turned on by applying high potential via 112, to allow conduction through the FB NAND string 100. In the case where the FBMC 102 is set to state "1", the high bias of the floating body 24 will turn on the lateral bipolar transistor (formed by the drain region 20a or 20b, floating body region 24, and the source region (the other of 20a or 20b) shown in FIG. 1 as described, for example, in PCT/US13/26466 to Widjaja et al., titled "Memory Cell Comprising First and Second Transistors and Methods of Operating" ("Widjaja-3"), which is hereby incorporated herein, in its entirety, by reference thereto), thus allowing for a strong conduction between source and drain which will in turn cause a current through the bit line 110, causing a voltage drop on the bit line 110 or discharge of the bit line 110. In the case where the FBMC 102 is set to state "0", the bias of the floating body 24 will be low, which will not enable the lateral bipolar. A device 102 set to state "0" will appear off without any conduction which will have little to no active current through the bit line 110 nor will it discharge the bit line 110. From here, a large variety of methods to sense the FBMC 102 state can be easily employed such as bit line voltage sensing or bit line current sensing. An example of this operation is shown in the waveform in FIG. 11.

Figure 12:
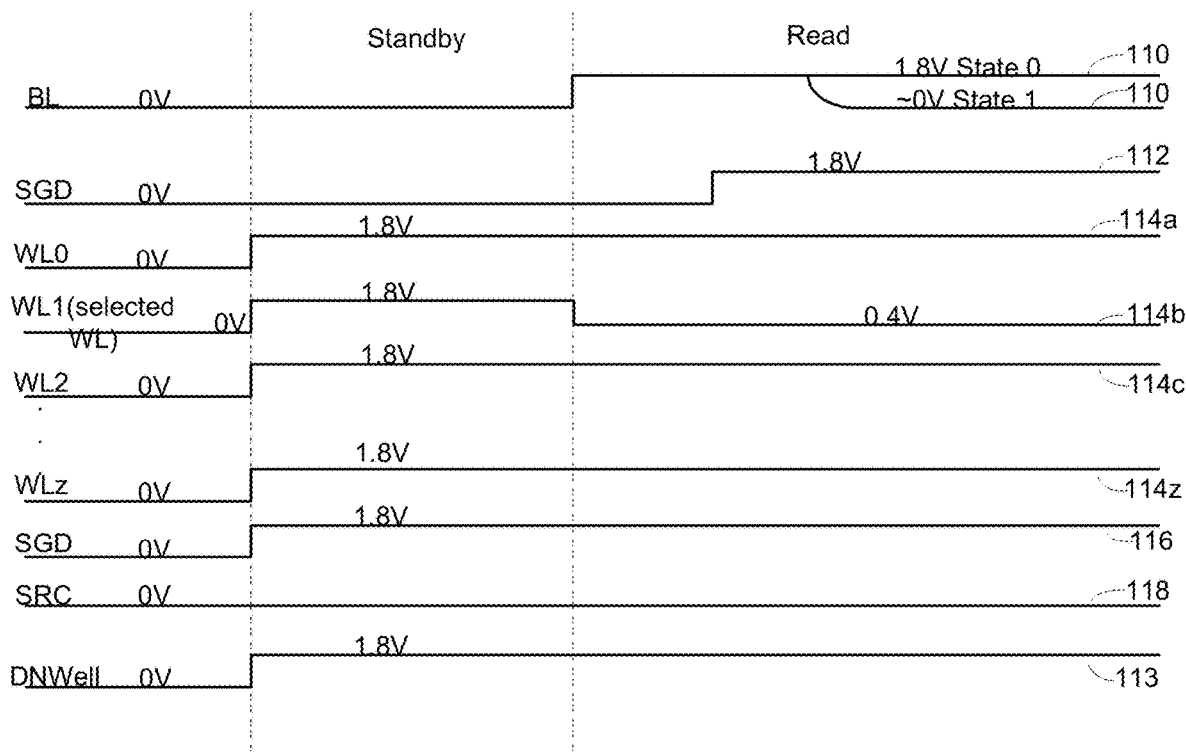
FIG. 12 is a waveform diagram of an alternate method to perform a read operation utilizing the transistor back bias, according to an embodiment of the present invention

An alternate method to read the FB NAND string 100 is illustrated in FIG. 12. In this alternate method the transistor is biased to the point where the FBMC 102 at state "1" will strongly turn on, but a FBMC 102 at state "0" will not have the transistor strongly conducting. In this read operation, the selected word line 114b is driven to an exemplary voltage of 0.4V. Similar to the previous read method in FIG. 11, the state of the FBMC 102 can be read on the bit line 110 through numerous methods which will be understood by those skilled in the art. Methods may include but are not limited to, bit line current sensing, active current voltage level detecting, and capacitive voltage discharge sensing.

Figure 13:
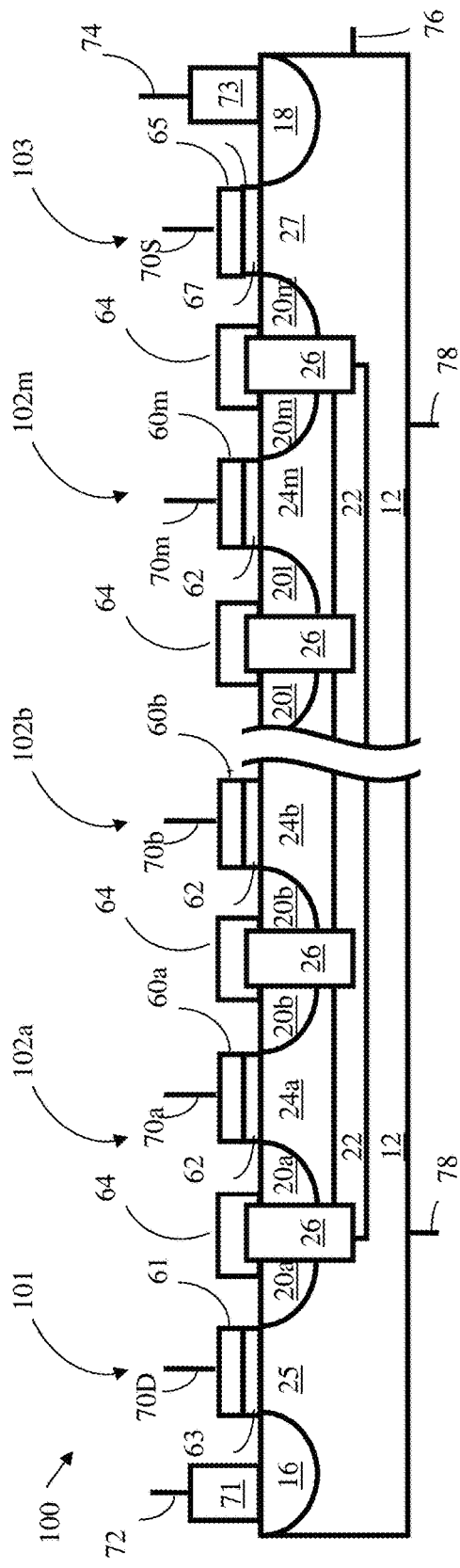
FIG. 13 is a cross-sectional illustration of an entire floating body NAND string, according to an embodiment of the present invention.
Figure 14:
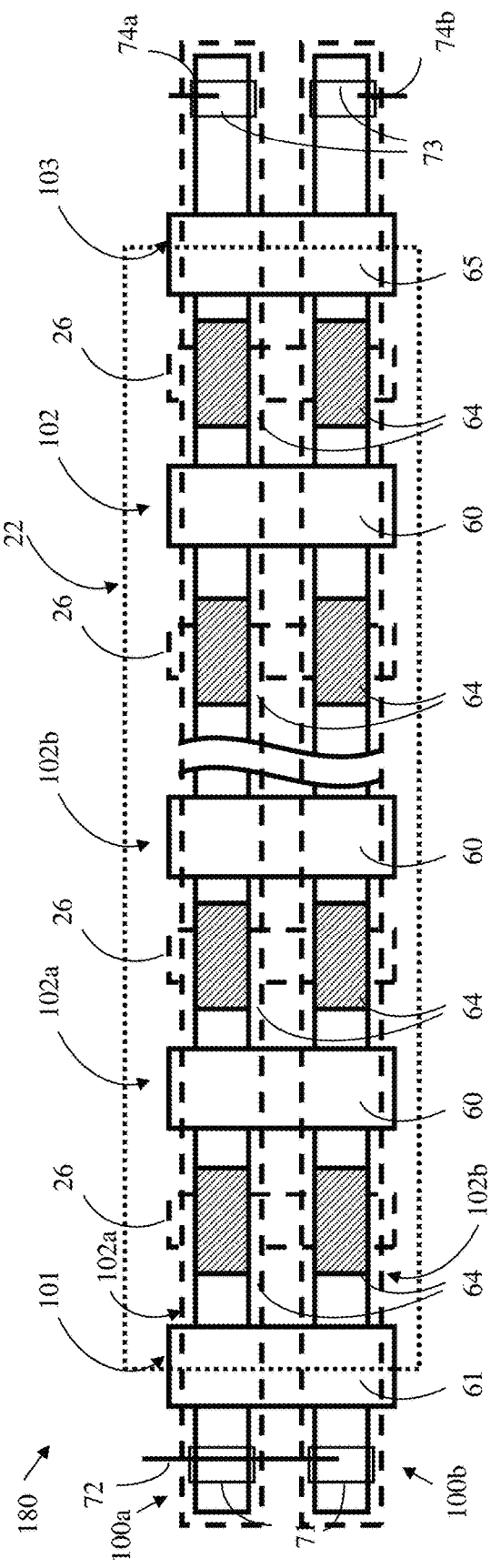
FIG. 14 is a layout view of a floating body NAND string, according to an embodiment of the present invention.

FIG. 13 is a schematic, cross-sectional illustration of an entire floating body NAND string 100, according to an embodiment of the present invention. FIG. 14 is a top view illustration of a pair of floating body NAND strings 100a, 100b. Within these two diagrams, device 101 is the SGD device, while 103 is the SGS device. Reference numeral 70D indicates the gate connection terminal for the SGD device 101, 61 is the gate of the SGD device 101, which is typically made from polysilicon or metal, 63 is the gate dielectric of the SGD device 101, region 25 is the p-type well for the SGD NMOS transistor of device 101, and 16 and 20a are the n+ regions of the transistor of device 101. Terminal 70S is the gate connection for the SGS device 103, 65 is the gate material of the SGS device 103, often made from polysilicon or metal, 67 is the gate dielectric (for example made of silicon oxide or other material described above with regard to gate dielectric 63), of the NMOS transistor, 18 and 20m represent the n+ regions of the SGS NMOS transistor of device 103 and 27 is the p-type well of the SGS NMOS device. Between devices 101 and 103 and connected thereto are a plurality of floating body memory cells 102a through 102m. Reference numerals 20a through 20m represent the n+ regions of the NMOS transistors of the floating body memory cells 102a-102m, respectively. Regions 24a through 24m represent the p-type floating bodies of the floating body memory cells 102a to 102m. Region 26 is the shallow trench isolation or STI. Region 22 is the buried well layer region. Region 12 is the substrate connection, while 78 is the substrate terminal electrically connected to the substrate 12. Node 64 is a conductive connection between adjacent floating body memory cells which creates the serial string of memory cells.

Figure 15:
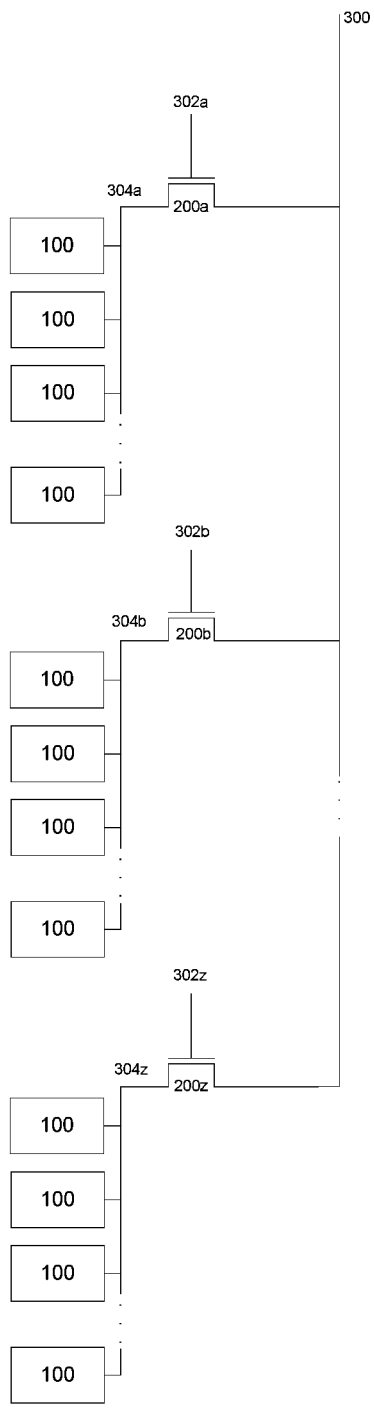
FIG. 15 illustrates a segmented local bit line array structure, according to an embodiment of the present invention.

To further reduce bit line capacitance and leakage a segmented local bit line array structure can be adopted as shown in FIG. 15, for example. Additional NMOS transistors 200a, 200b to 200z can be used to isolate the primary bit line 300 from a plurality of local bit lines 304a, 304b to 304z. The local bit lines are attached to multiple floating body memories such as but not limited to FB NAND strings 100. Examples of floating body memory cells that can be used in FB NAND strings include, but are not limited to: single transistor (1T) floating body memory cells, such as described for example in Widjaja-1, Widjaja-2, Tack, Okhonin, Ohsawa, Villaret, Ranica, and Pulicani, and two transistors (2T) floating body memory cells, such as described for example in Widjaja-3, which is hereby incorporated herein, in its entirety, by reference thereto. In FIG. 15 the local bit lines 304a, 304b, . . . , 304z are each shown to be connected to a plurality of FB NAND strings 100. Note that this segmenting is not only limited to what is shown in FIG. 15, but, for example, can be further repeated where primary bit line 300 is also connected to another NMOS device which will have a higher level bit line which would be connected to multiple primary bit lines 300. Additionally local bit lines may also contain biasing transistors which could bias the bit lines to voltages to reduce bit leakage, and provide proper biasing for bi-stable operation. These biasing transistors are not shown but can be easily understood by those skilled in the art.

Figure 16:
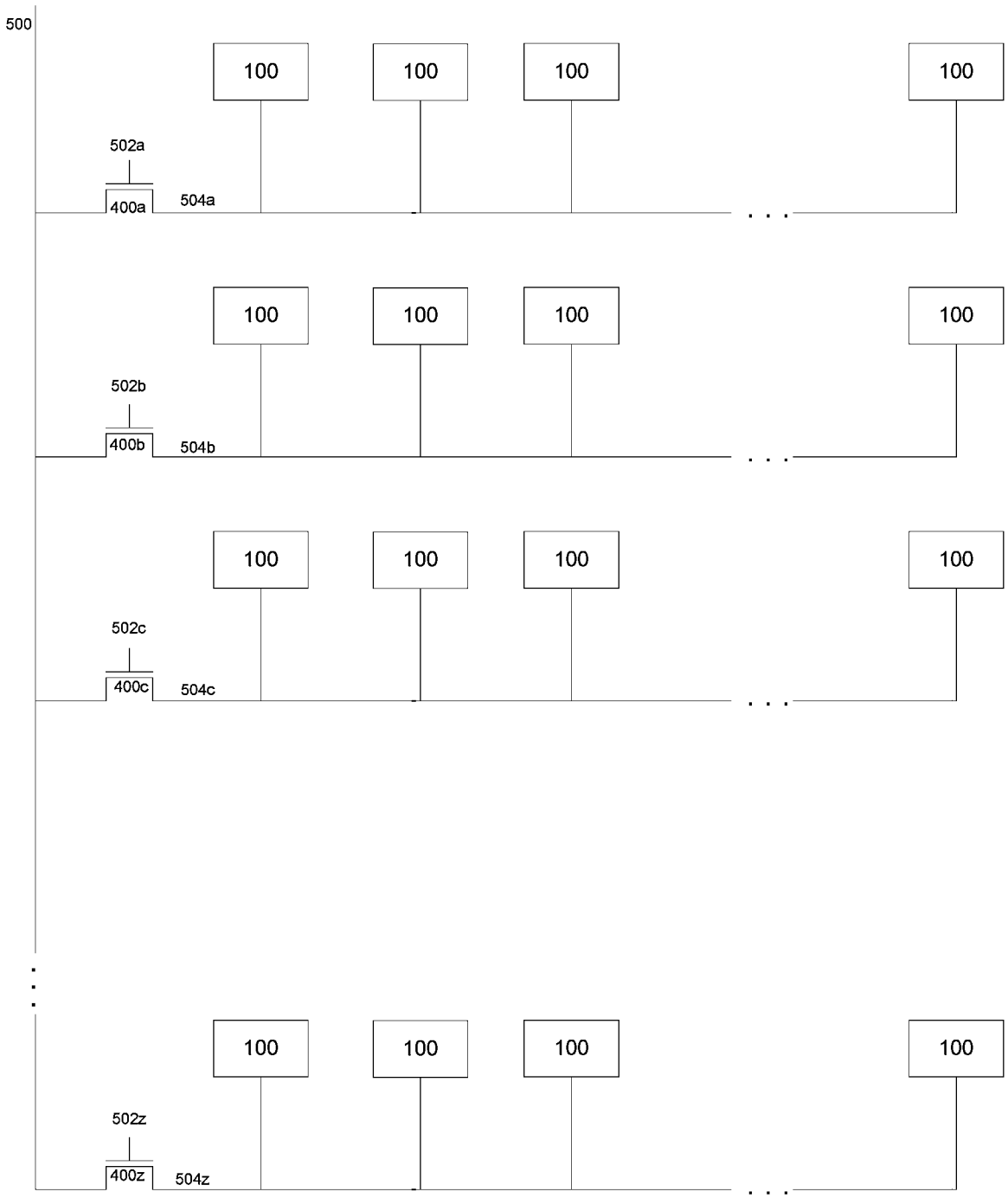
FIG. 16 illustrates a segmented local source line array structure, according to an embodiment of the present invention.
Figure 17:
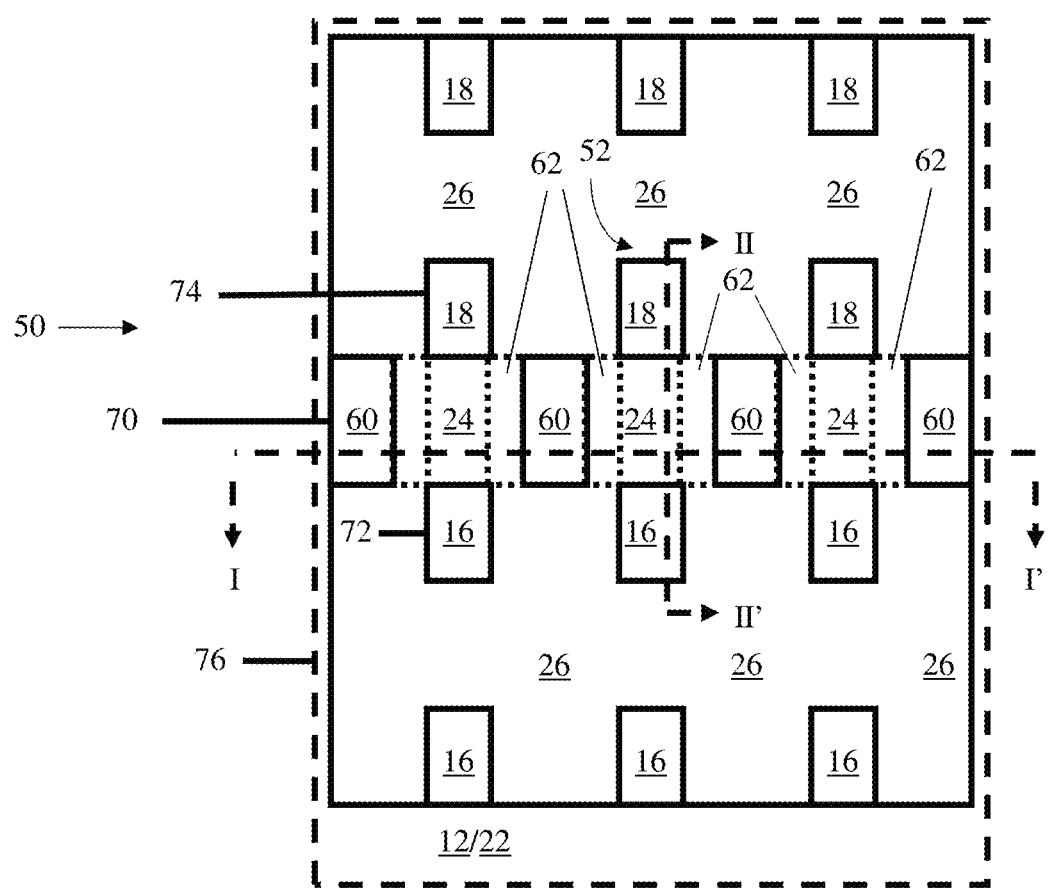
FIG. 17 is a schematic, top view of a memory device according to an embodiment of the present invention.

The source lines can also be segmented into local source line structures as shown in FIGS. 16. 504a, 504b, 504c, to 504z are a plurality of local source lines connected to a plurality of FB NAND strings 100. NMOS transistors 400a, 400b, 400c to 400z are isolation transistors which can electrically isolate the local source lines from the primary source line 500. Gate signals 502a to 502z can be used to electrically connect the local source line to the primary source line. Note that further segmenting of the source line 500 is also possible but is not shown here. To add a further level of segmenting, an additional isolation NMOS transistor can be connected to primary source line 500. This in turn can be connected to a higher level source line which would be connected to multiple primary source lines 500. It is noted that biasing transistors can also be provided in the local source lines but are not shown here and are easily understood by those skilled in the art. The source lines segmentation may also be applied for other floating body memory cells, such as described in Widjaja-1, Widjaja-2, Tack, Okhonin, Ohsawa, Villaret, Ranica, Pulicani, and Widjaja-3.

Figure 19:
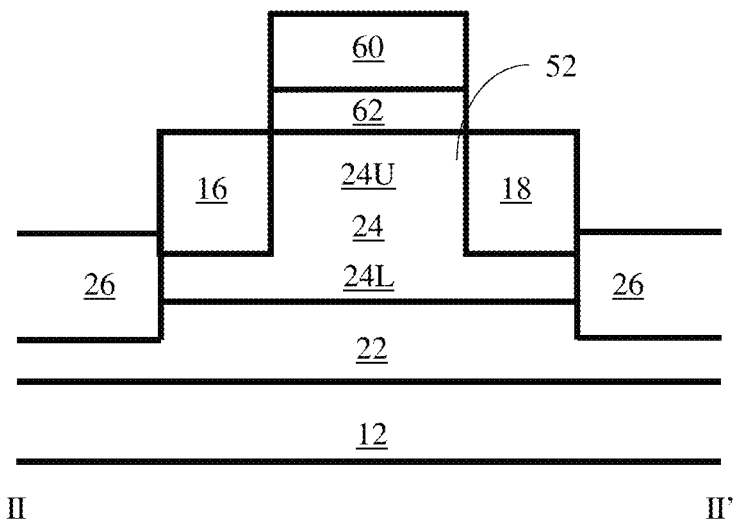
FIG. 19 is a schematic, cross-sectional view of the memory device of FIG. 17 taken along line II-II'.
Figure 20:
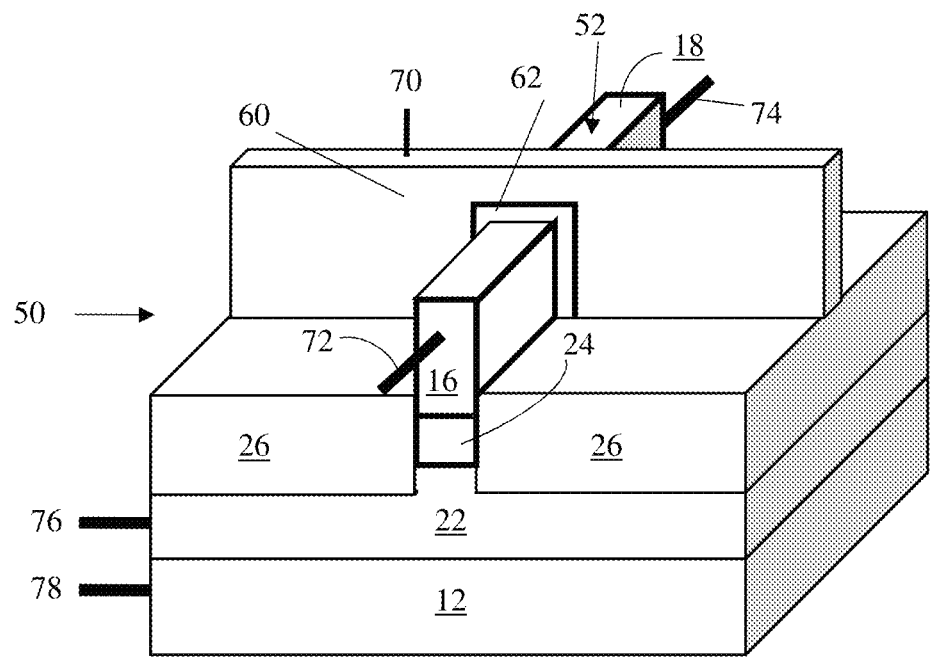
FIG. 20 is a schematic, three-dimensional view of the memory device of FIG. 17.
Figure 21:
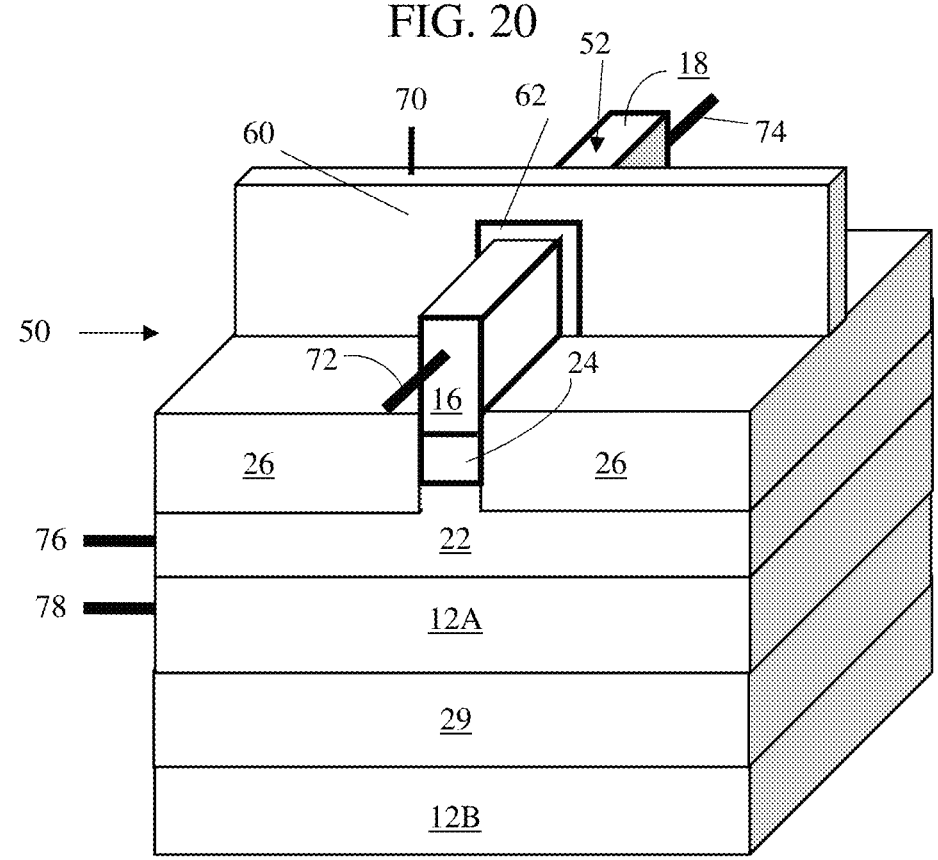
FIG. 21 is a schematic, three dimensional view of a variation of the memory device shown in FIG. 20.

Schematic views showing a top-view, cross-sectional views, and three-dimensional views of a memory device 50 according to an embodiment of the present invention are shown in FIGS. 17-21, respectively. Memory cell 50 has a fin structure 52 fabricated on substrate 12 of a first conductivity type such as p-type for example, so as to extend from the surface of the substrate to form a three-dimensional structure, with fin 52 extending substantially perpendicular to and above the top surface of the substrate 12. Fin structure 52 is semiconductive and is built on buried well layer 22 of a second conductivity type such as n-type for example, which is itself built on top of substrate 12. Alternatively, buried well 22 could be a diffusion region inside substrate 12 with the rest of the fin 52 constructed above it, or buried well 22 could be a conductive layer on top of substrate 12 connected to all the other fin 52 structures in a manner similar to memory cell 50 described above. Fin 52 is typically made of silicon, but may comprise germanium, silicon germanium, gallium arsenide, carbon nanotubes, or other semiconductor materials known in the art. In other embodiments, substrate 12A can be a well of the first conductivity type embedded in either a well 29 of the second conductivity type or, alternatively, in the bulk of the semiconductor wafer of the second conductivity type, such as n-type, for example as shown in FIG. 21. To simplify the description, the substrate 12 will usually be drawn as the semiconductor bulk material as it is in FIGS. 18-20.

Buried well layer 22 may be formed by an ion implantation process on the material of substrate 12. Alternatively, buried well layer 22 may be grown epitaxially above substrate 12. Buried well layer 22, which has a second conductivity type (such as n-type conductivity type), electrically isolates the floating body region 24, which has a first conductivity type (such as p-type conductivity type), from the bulk substrate 12 also of the first conductivity type. Fin structure 52 includes bit line region 16 and source line region 18 having a second conductivity type (such as n-type conductivity type).

Figure 18:
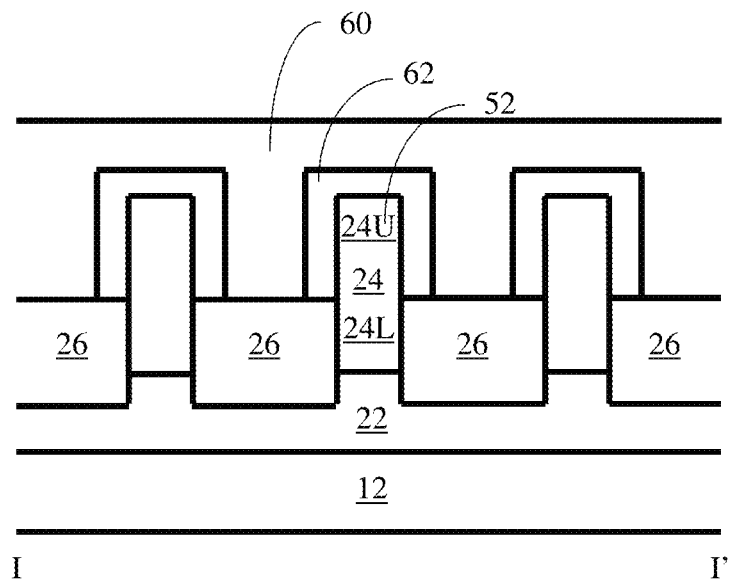
FIG. 18 is a schematic, cross-sectional view of the memory device of FIG. 17 taken along line I-I'.

Memory cell 50 further includes gate 60 enclosing the upper portion 24U of the floating body region, as illustrated in FIGS. 18-20. The gate 60 is positioned between the bit line region 16 and the source line region 18, adjacent to the floating body region 24, as best seen in FIGS. 19-20. The gate 60 is insulated from the floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

The floating body region 24 of the first conductivity type is bounded by insulating layer 62, source line region 16, drain region 18. on the bottom by buried layer 22, and by insulating layers 26. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments. The floating body region 24U comprises the upper portion of the floating body region 24 that is surrounded by the gate region 60, while the lower portion of the floating body region is indicated as region 24L. The doping concentrations between the upper and lower portion of the floating body regions 24U and 24L may be the same. However, the upper and lower portion of the floating body regions 24U and 24L may have different doping concentrations. For example, the lower portion of the floating body region 24L may be more highly doped than the upper portion of the floating body region 24U. In one embodiment, the upper portion of the floating body region 24U may comprise an intrinsic-type floating body region, where no significant amount of dopant species is present, and the lower portion of the floating body region 24L may have a first conductivity type, such as p-type, for example.

A source line region 16 having a second conductivity type, such as n-type, for example, is provided in fin 52. Source line region 16 may be formed by an implantation process on the material making up fin 52, according to any implantation process known and typically used in the art. Alternatively, a solid state diffusion or a selective epitaxial growth process could be used to form source line region 16.

A bit line region 18 having a second conductivity type, such as n-type, for example, is also provided in fin 52. Bit line region 18 may be formed by an implantation process on the material making up fin 52, according to any implantation process known and typically used in the art. Alternatively, a solid state diffusion or a selective epitaxial growth process could be used to form bit line region 18.

Insulating layers 26 (like, for example, shallow trench isolation (STI)), may be made of silicon oxide, for example, though other insulating materials may be used. The bottom of insulating layer 26 may reside inside the buried region 22 allowing buried region 22 to be continuous as shown in FIG. 18-20. Alternatively, the bottom of insulating layer 26 may reside below the buried region 22 (not shown). This requires a shallower insulating layer 28, which insulates the floating body region 24, but allows the buried layer 22 to be continuous in the direction of the cross-sectional view shown in FIG. 19. For simplicity, only memory cell 50 with continuous buried region 22 in all directions will be shown from hereon. Further alternatively, the bottom of insulating layer 26 may reside above the buried layer region 22.

Cell 50 includes several terminals: word line (WL) terminal 70 electrically connected to gate 60, bit line (BL) terminal 74 electrically connected to bit line region 18, source line (SL) terminal 72 electrically connected to source line region 16, buried well (BW) terminal 76 electrically connected to buried layer 22, and substrate (SUB) terminal 78 electrically connected to the substrate 12 (see FIGS. 20-21).

Several operations can be performed by memory cell 50 such as holding, read, write logic-1 and write logic-0 operations.

The memory cell states are represented by the charge such as holes in the floating body region 24 of the first conductivity. In one embodiment, the charge is stored uniformly across the floating body region 24. In another embodiment, the upper portion of the floating body region 24U is fully depleted, and the charge is preferentially stored in the lower portion of the floating body region 24L. If cell 50 has holes stored in the floating body region 24, then the memory cell 50 will have a lower threshold voltage (gate voltage where transistor is turned on) compared to when cell 50 does not store holes in floating body region 24. Alternatively, if cell 50 has holes stored in the floating body region 24, then the memory cell 50 will conduct a higher current (from the bit line region 18 to the source line region 16, for example) compared to when cell 50 does not store holes in the floating body region 24.

The positive charge stored in the floating body region 24 will decrease over time due to the p-n diode leakage formed by the floating body region 24 and regions 16, 18, and 22, and due to charge recombination. A holding operation may be applied in parallel to memory cells 50, which is performed by applying a positive back bias to the BW terminal 76, zero or low negative bias on the WL terminal 70, and zero bias on the SL terminal 72, BL terminal 74, and SUB terminal 78. The positive back bias applied to the buried layer region 22 connected to the BW terminal 76 will maintain the state of the memory cell 50 that it is connected to by maintaining the charge stored in the floating body region 24.

Figure 22:
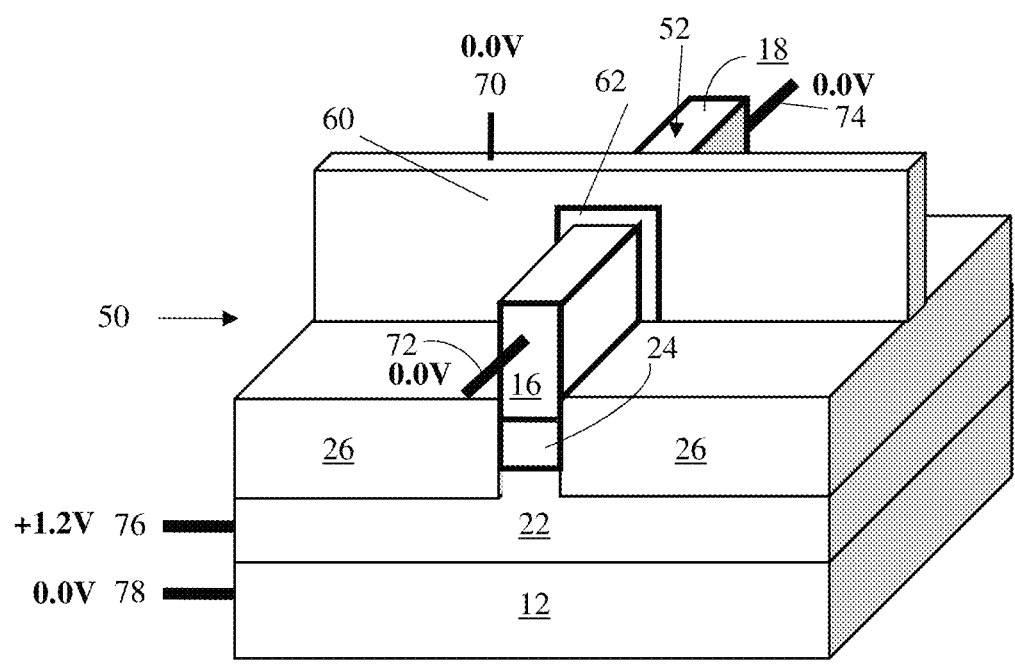
FIG. 22 is a schematic, three-dimensional view like FIG. 20, but showing exemplary bias conditions.

FIG. 22 illustrates one example of bias conditions for performing a holding operation, where the following voltages are applied to memory cell 50: 0.0 volts is applied to WL terminal 70, SL terminal 72, BL terminal 74, and SUB terminal 78, and a positive voltage like, for example, +1.2 volts is applied to BW terminal 76. In other embodiments, different voltages may be applied to the various terminals of memory cell 50 as a matter of design choice and the exemplary voltages described are not limiting in any way.

Figure 23:
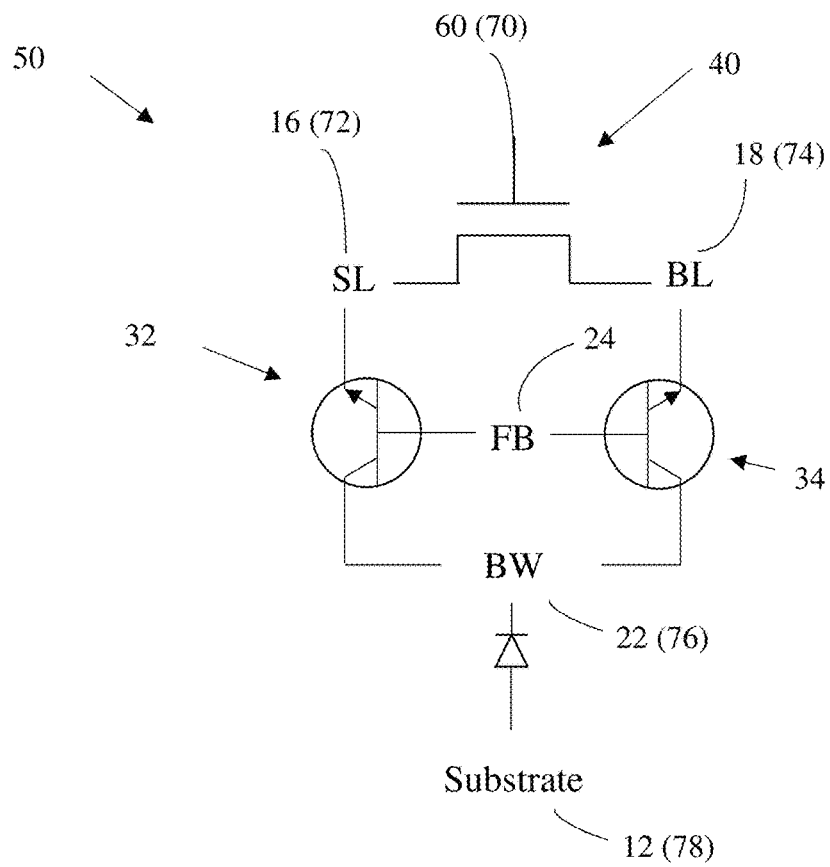
FIGS. 23 and 24 illustrate equivalent circuit representations of a memory cell, according to an embodiment of the present invention.
Figure 24:
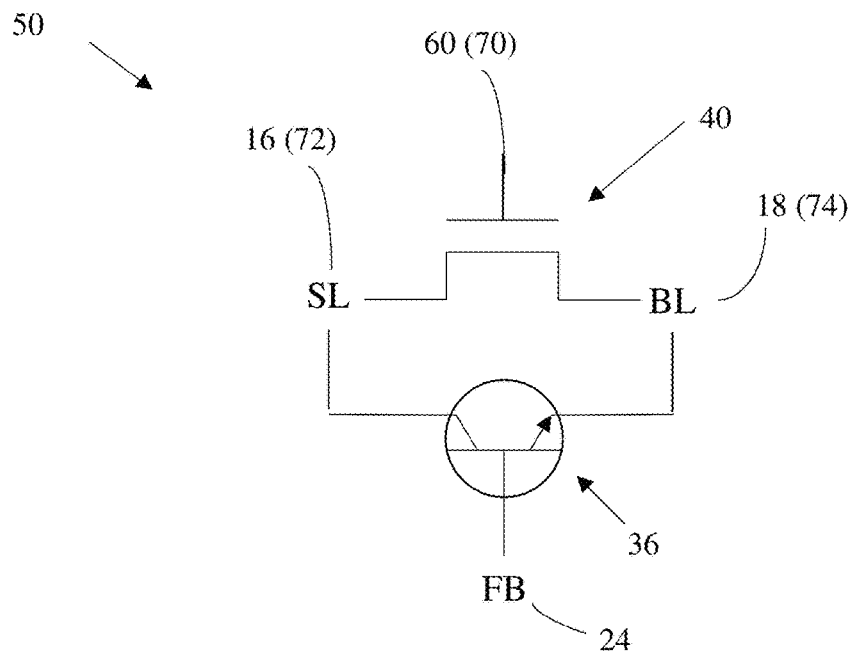

The principles of the holding operation performed on memory cell 50 may be illustrated through the equivalent circuit representation of the memory cell 50 shown in FIG. 23. FIG. 23 illustrates the equivalent circuit representation of memory cell 50, showing the intrinsic bipolar transistors 32 and 34 formed by the buried well region 22, the floating body region 24, and the source line region 16 or the bit line region 18, respectively. Also inherent in memory cell 50 is the bipolar device 36, formed by the source line region 16, floating body region, 24, and the drain region 18. For drawings clarity, bipolar device 36 is shown separately in FIG. 24.

Figure 25A:
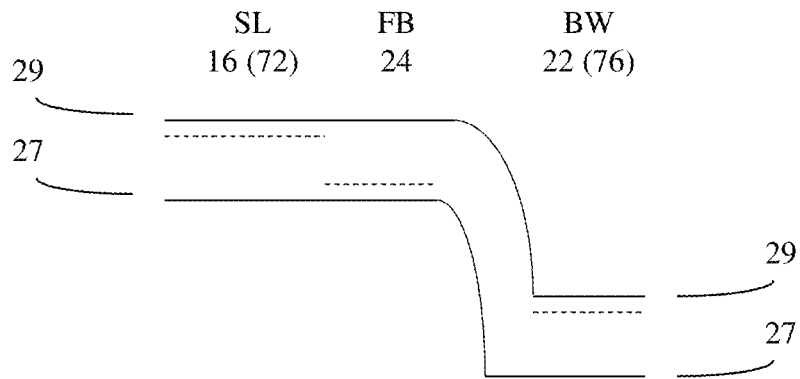
FIG. 25A shows a band diagram of a bipolar device of a memory cell when the floating body region (or the lower portion of the floating body region) is positively charged and a positive bias is applied to the buried region, according to an embodiment of the present invention.

FIG. 25A shows the band diagram of the bipolar device 32 when the floating body region 24 (or the lower portion of the floating body region 24L) is positively charged and a positive bias is applied to the buried region 22. The energy band diagram of the bipolar device 34 is similar to the one shown in FIG. 25A, with the drain region 18 replacing the source line region 16. The dashed lines indicate the Fermi levels in the various regions of the bipolar device 32. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic-1, the bipolar transistors 32 and 34 will be turned on as the positive charge in the floating body region lowers the energy barrier of electron flow into the base region. Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. When the following condition is met: $\beta \times (M-1) \approx 1-$ where $\beta$ is the forward common-emitter current gain of the bipolar transistor 32 or 34 and M is the impact ionization coefficient—the amount of holes injected into the floating body region 24 compensates for the charge lost due to p-n junction forward bias current between the floating body region 24 and the source line region 16 or bit line region 18 and due to holes recombination. As a result of a positive-feedback mechanism, this process maintains the charge (i.e. holes) stored in the floating body region 24 which will keep the n-p-n bipolar transistors 32 and 34 on for as long as a positive bias is applied to the buried well region 22 through BW terminal 76.

The region where the product $\beta \times (M-1)$ approaches 1 and is characterized by hole current moving into the base region of a bipolar transistor is sometimes referred to as the reverse base current region and has been described for example in "A New Static Memory Cell Based on Reverse Base Current (RBC) Effect of Bipolar Transistor", K. Sakui et al., pp. 44-47, International Electron Devices Meeting, 1988 ("Sakui-1"), "A New Static Memory Cell Based on the Reverse Base Current Effect of Bipolar Transistors", K. Sakui et al., pp. 1215-1217, IEEE Transactions on Electron Devices, vol. 36, no. 6, June 1989 ("Sakui-2"), "On Bistable Behavior and Open-Base Breakdown of Bipolar Transistors in the Avalanche Regime—Modeling and Applications", M. Reisch, pp. 1398-1409, IEEE Transactions on Electron Devices, vol. 39, no. 6, June 1992 ("Reisch"), all of which are hereby incorporated herein, in their entireties, by reference thereto.

The latching behavior based on the reverse base current region has also been described in a biristor (i.e. bi-stable resistor) for example in "Bistable resistor (Biristor)—Gateless Silicon Nanowire Memory", J.-W. Han and Y.-K. Choi, pp. 171-172, 2010 Symposium on VLSI Technology, Digest of Technical Papers, 2010 ("J.-W. Han"), which is hereby incorporated herein, in its entirety, by reference thereto. In a two-terminal biristor device, a refresh operation is still required. J.-W. Han describes a 200 ms data retention for the silicon nanowire biristor memory. In memory cell 50, the state of the memory cell is maintained due to the vertical bipolar transistors 32 and 34, while the remaining cell operations (i.e. read and write operations) are governed by the lateral bipolar transistor 36 and/or MOS transistor 40. Hence, the holding operation does not require any interruptions to the memory cell 50 access.

If floating body 24 is neutrally charged (the voltage on floating body 24 being equal to the voltage on grounded source line region 16), a state corresponding to logic-0, no current will flow through bipolar transistors 32 and 34. The bipolar devices 32 and 34 will remain off and no impact ionization occurs. Consequently memory cells in the logic-0 state will remain in the logic-0 state.

Figure 25B:
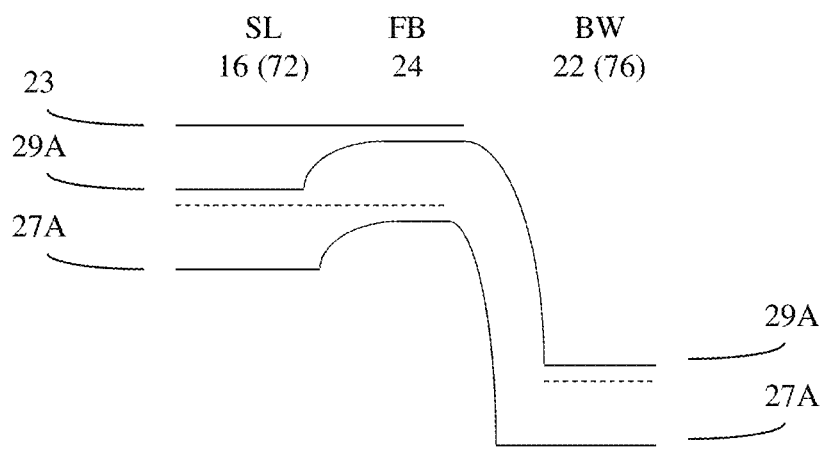
FIG. 25B shows an energy band diagram of an intrinsic bipolar device when the floating body region is neutrally charged and a bias voltage is applied to the buried well region, according to an embodiment of the present invention.

FIG. 25B shows the energy band diagram of the intrinsic bipolar device 32 when the floating body region 24 is neutrally charged and a bias voltage is applied to the buried well region 22. In this state the energy level of the band gap bounded by solid lines 27A and 29A is different in the various regions of bipolar device 32. Because the potential of the floating body region 24 and the source line region 16 is equal, the Fermi levels are constant, resulting in an energy barrier between the source line region 16 and the floating body region 24. Solid line 23 indicates, for reference purposes, the energy barrier between the source line region 16 and the floating body region 24. The energy barrier prevents electron flow from the source line region 16 (connected to SL terminal 72) to the floating body region 24. Thus the bipolar device 32 will remain off.

An autonomous refresh for a floating body memory, without requiring to first read the memory cell state, has been described for example in "Autonomous Refresh of Floating Body Cell (FBC)", Ohsawa et al., pp. 801-804, International Electron Device Meeting, 2008 ("Ohsawa"), U.S. Pat. No. 7,170,807 "Data Storage Device and Refreshing Method for Use with Such Device", Fazan et al. ("Fazan"), which are hereby incorporated herein, in their entireties, by reference thereto. Ohsawa and Fazan teach an autonomous refresh method by applying periodic gate and drain voltage pulses, which interrupt access to the memory cells being refreshed. In memory cell 50, more than one stable state is achieved because of the vertical bipolar transistors 32 and 34. The read and write operations of the memory cell 50 are governed by the lateral bipolar transistor 36 and/or MOS transistor 40. Hence, the holding operation does not require any interruptions to the memory cell 50 access.

In the holding operation described in FIG. 22, there is no individually selected memory cell. Rather cells are selected in rows by the buried well terminals 76 and may be selected as individual rows, as multiple rows, or as all of the rows comprising the memory array.

Figure 25C:
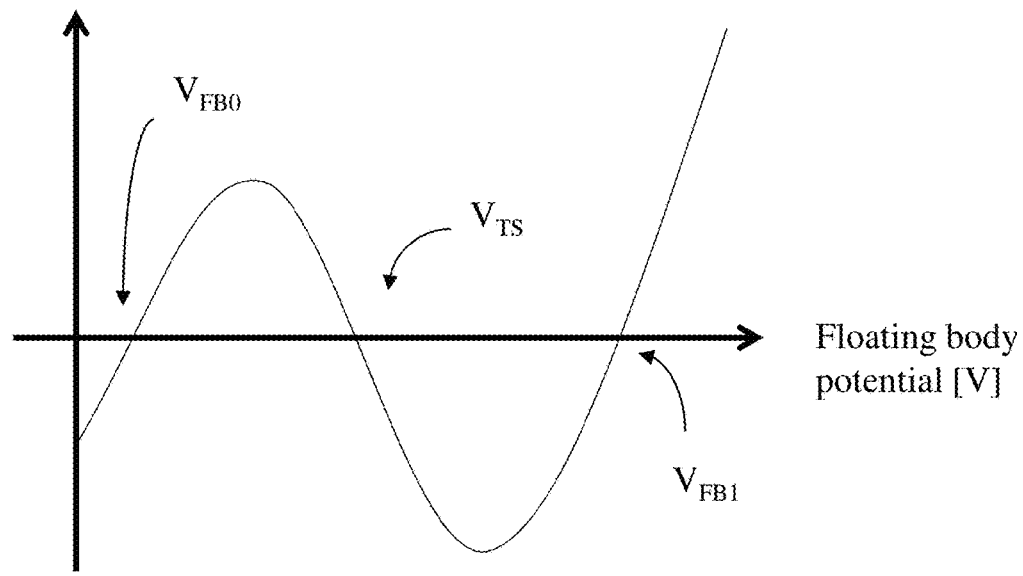
FIG. 25C shows a graph of net current I flowing into or out of a floating body region as a function of potential (voltage) V of the floating body (not drawn to scale), according to an embodiment of the present invention.

FIG. 25C shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 25C, the net current is flowing into the floating body region 24 as a result of the p-n diode formed by the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the buried well region 22, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 32 and 34.

Figure 25D:
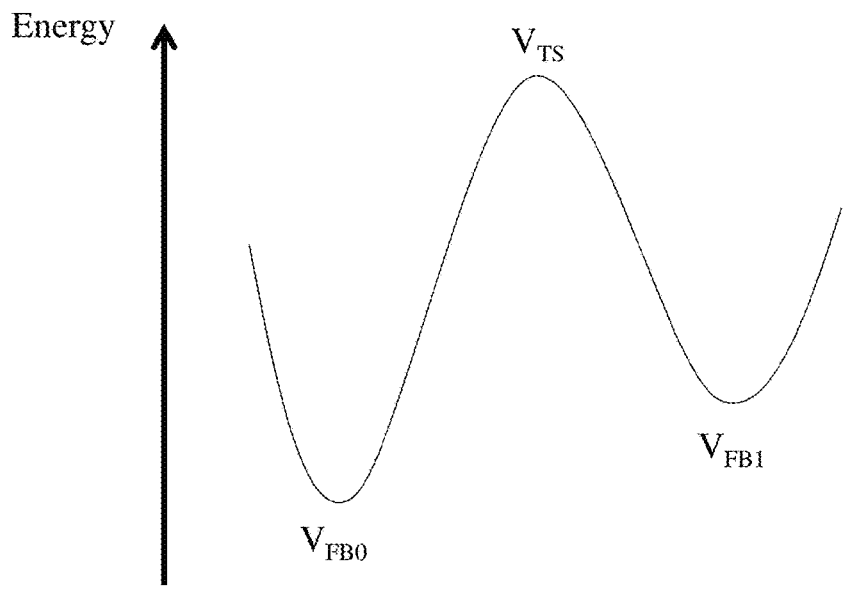
FIG. 25D shows a schematic curve of a potential energy surface (PES) of a memory cell, according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 25D shows a schematic curve of a potential energy surface (PES) of the memory cell 50, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 25E:
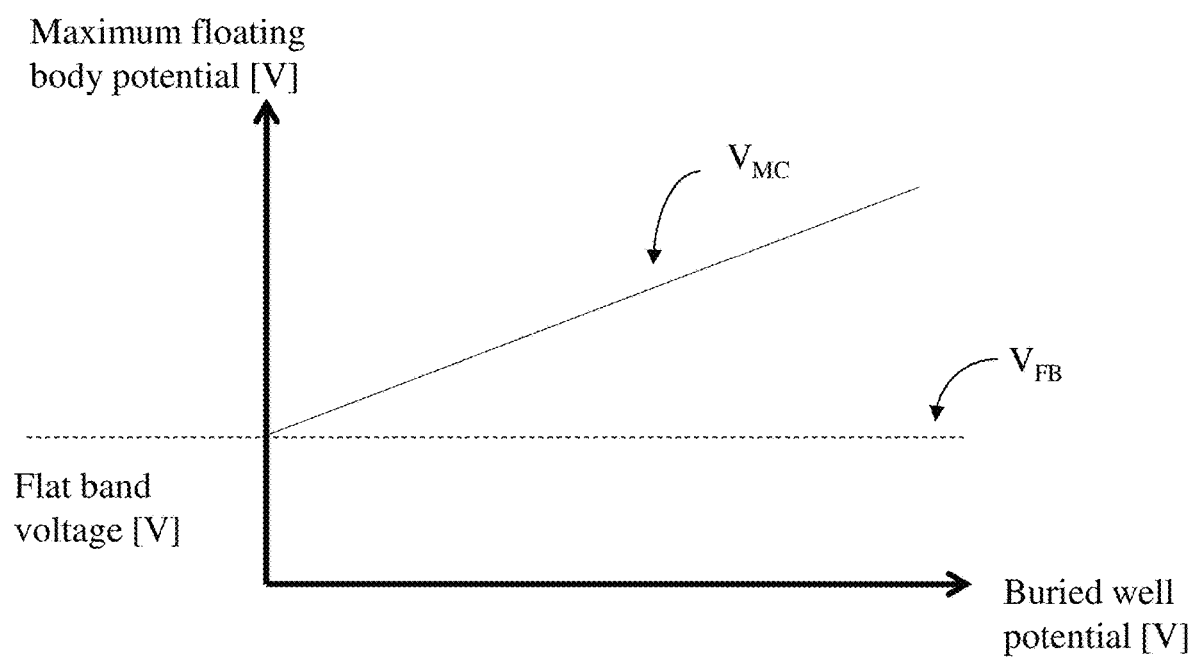
FIG. 25E shows an increase in maximum charge $V_{MC}$ stored in a floating body, as a result of applying a positive bias to the BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to BW terminal 76, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the BW terminal 76 as shown in FIG. 25E. The increase in the maximum charge stored in the floating body 24 results in a larger memory window.

Floating body DRAM cells described in Ranica, Villaret, and Pulicani only exhibit one stable state, which is often assigned as logic-0 state. Villaret describes the intrinsic bipolar transistors enhance the data retention of logic-1 state, by drawing the electrons which otherwise would recombine with the holes stored in the floating body region. However, only one stable state is observed because there is no hole injection into the floating body region to compensate for the charge leakage and recombination.

Figure 26:
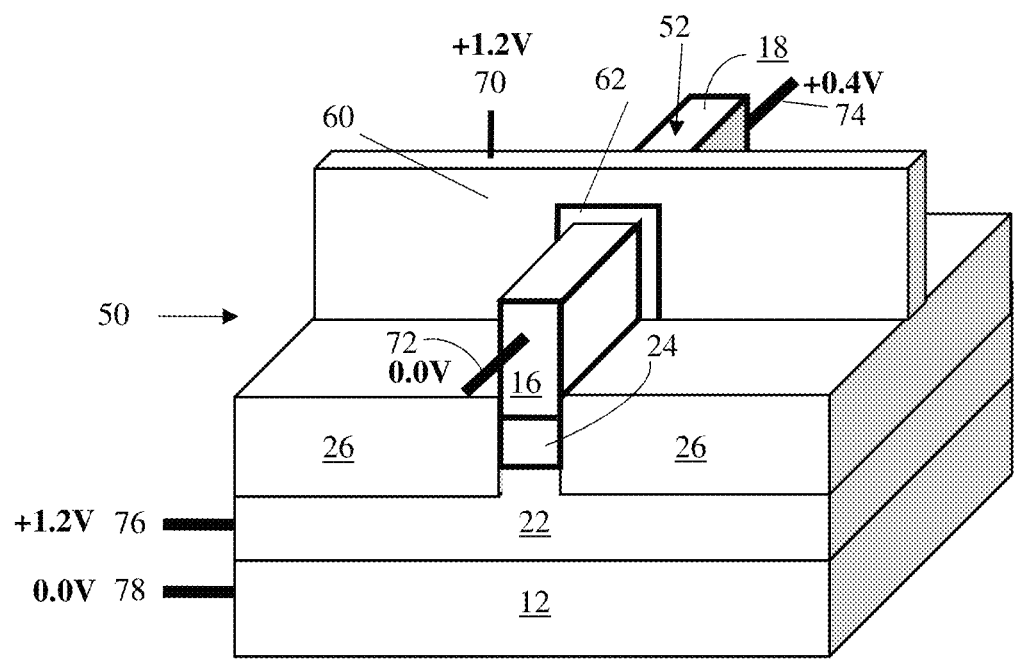
FIG. 26 illustrates exemplary bias conditions for a read operation on a memory cell according to an embodiment of the present invention.

A read operation of the memory cell 50, according to an embodiment of the present invention, is illustrated in FIG. 26. The amount of charge stored in the floating body region 24 may be sensed by monitoring the cell current of the memory cell 50. If memory cell 50 is in a logic-1 state having holes in the body region 24, then the memory cell 0 will have a higher cell current (e.g. current flowing from the BL terminal 74 to the SL terminal 72), compared to if cell 50 is in a logic-0 state having no holes in the body region 24. A sensing circuit typically connected to the BL terminal 74 can then be used to determine the data state of the memory cell 50.

A read operation for example can be performed on memory cell 50 by applying the following bias conditions: zero or positive bias is applied to the WL terminal 70, a positive voltage is applied to the BL terminal 74, zero voltage is applied to the SL terminal 72, zero or positive voltage is applied to the BW terminal 76, and zero voltage is applied to the SUB terminal 78. If memory cell 50 is in a logic-1 state having holes in the floating body region 24, then a higher current will flow from the BL terminal 74 to the SL terminal 72 of the selected memory cell 50, compared to if memory cell 50 is in a logic-0 state having no holes in the floating body region 24. Current may flow from the BL terminal 74 to the SL terminal 72 through the transistor 40 and/or the bipolar transistor 36 (where the current may flow through the lower portion of the floating body region 24L). In one particular embodiment, about +1.2 volts is applied to the WL terminal 70, about +0.4 volts is applied to the BL terminal 74, about 0.0 volts is applied to the SL terminal 72, about +1.2 volts is applied to the BW terminal 76, and about 0.0 volts is applied to the SUB terminal 78.

Figure 27:
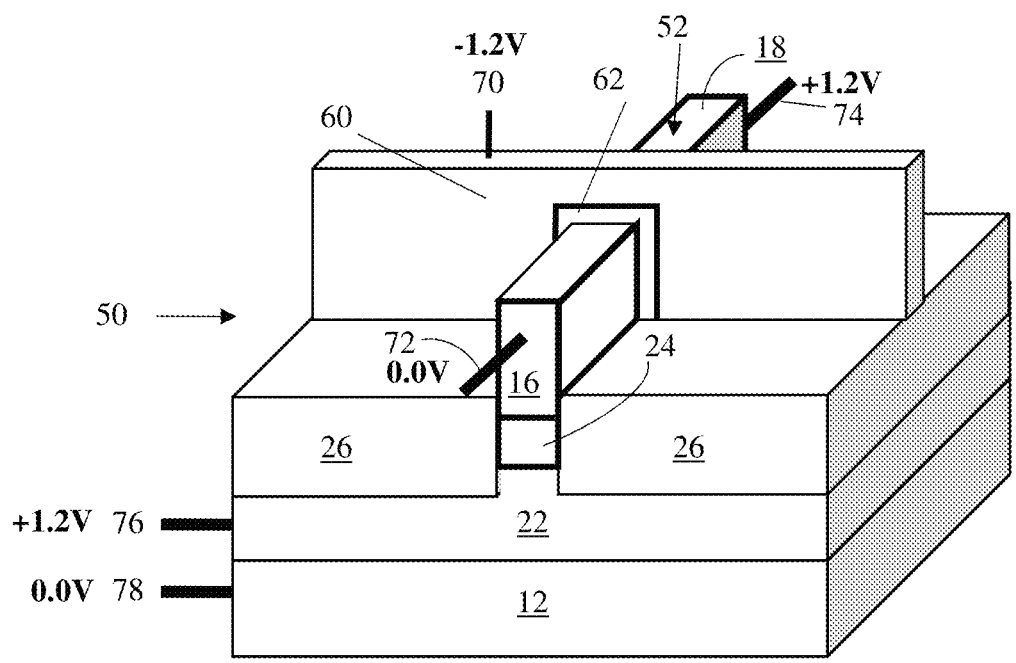
FIG. 27 illustrates an exemplary write logic-1 operation using a band-to-band tunneling mechanism, according to an embodiment of the present invention.

FIG. 27 illustrates an exemplary write logic-1 operation using a band-to-band tunneling mechanism, where the following bias conditions are applied: a negative voltage is applied to the WL terminal 70, a positive voltage is applied to the BL terminal 74, zero bias is applied to the SL terminal 72, zero or positive voltage is applied to the BW terminal 76, and zero bias is applied to the SUB terminal 78. The positive bias applied to the drain region of the memory cell 50 (connected to the BL terminal 74) along with the negative voltage applied to the gate 60 (connected to the WL terminal 70) will create a strong electric field around the junction area of the drain region 18 in the proximity of the gate 60. The strong electric field bends the energy band sharply upward near the gate 60 and drain region 18 junction overlap region, causing electrons to tunnel from the valence band of the floating body region 24 to the conduction band of the drain region 18, leaving holes in the valence band of the floating body region 24. The electrons which tunnel across the energy band become the drain region 18 leakage current, while the holes are injected into floating body region 24 and become the hole charge that creates the logic-1 state.

In one particular non-limiting embodiment, about −1.2 volts is applied to the WL terminal 70, about +1.2 volts is applied to the BL terminal 74, about 0.0 volts is applied to the SL terminal 72, about +1.2 volts is applied to the BW terminal 76, and about 0.0 volts is applied to the SUB terminal 78, as shown in FIG. 27.

Figure 28:
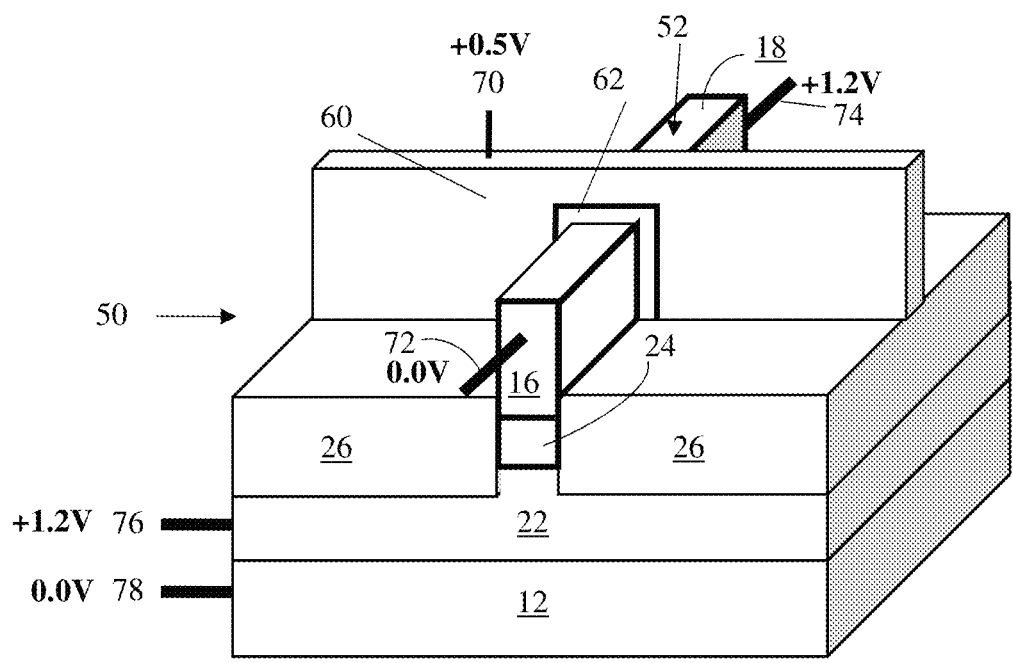
FIG. 28 illustrates exemplary bias conditions for a write logic-1 operation through an impact ionization mechanism according to an embodiment of the present invention.

FIG. 28 illustrates exemplary bias conditions for a write logic-1 operation through an impact ionization mechanism according to an embodiment of the present invention, where the following bias conditions are applied: a positive voltage is applied to the WL terminal 70, a positive voltage is applied to the BL terminal 74, zero voltage is applied to the SL terminal 72, zero or positive voltage is applied to the BW terminal 76, and zero voltage is applied to the SUB terminal 78. The positive voltage applied to the WL terminal 70 and the BL terminal 74 is configured to maximize hole generation through the impact ionization process, where the voltage on the bit line region 18 of the memory cell 50 is typically greater than the voltage applied to the gate 60.

In one particular non-limiting embodiment, about +0.5 volts is applied to the WL terminal 70, about +1.2 volts is applied to the BL terminal 74, about 0.0 volts is applied to the SL terminal 72, about +1.2 volts is applied to the BW terminal 76, and about 0.0 volts is applied to the SUB terminal 78. These voltage levels are exemplary only and may vary from embodiment to embodiment. Thus the exemplary embodiments, features, bias levels, etc., described are not limiting.

Figure 29:
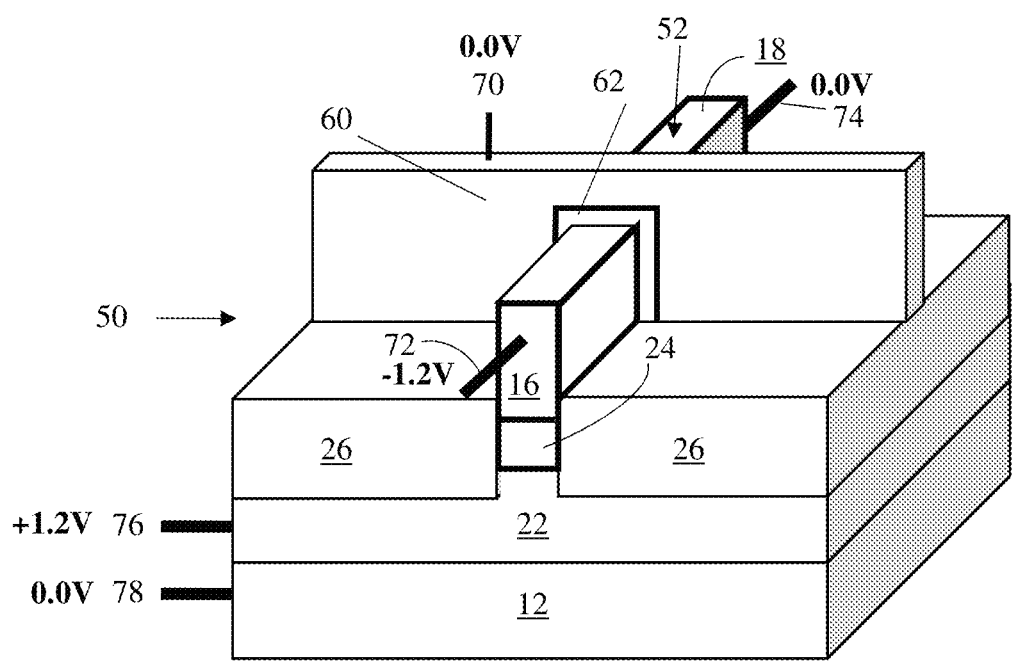
FIG. 29 illustrates exemplary bias conditions for a write logic-0 operation according to an embodiment of the present invention.

FIG. 29 illustrates exemplary bias conditions for a write logic-0 operation according to an embodiment of the present invention: a negative voltage is applied to the SL terminal 72, zero voltage is applied to the WL terminal 70, BL terminal 74, and SUB terminal, and zero or positive voltage is applied to the BW terminal 76. Under these conditions, the p-n junction between the floating body 24 and the source line region 16 is forward-biased, evacuating holes from the floating body 24. All memory cells sharing the same SL terminal 72 will be written to simultaneously. To write arbitrary binary data to different memory cells 50, a write logic-0 operation is first performed on all the memory cells to be written, followed by one or more write logic-1 operations on the memory cells that must be written to logic-1.

In one particular non-limiting embodiment, about −1.2 volts is applied to the selected SL terminal 72, about 0.0 volts is applied to the WL terminal 70, BL terminal 74, and SUB terminal 78, and about +1.2 volts is applied to the BW terminal 76. These voltage levels are exemplary only and may vary from embodiment to embodiment. Thus the exemplary embodiments, features, bias levels, etc., described are not limiting.

Figure 30:
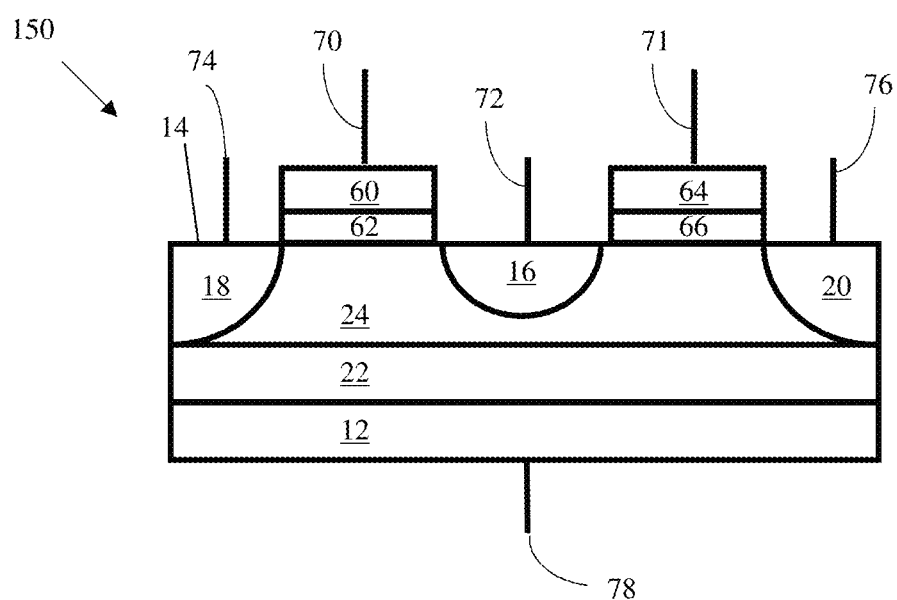
FIG. 30 illustrates a memory cell according to another embodiment of the present invention.

FIG. 30 illustrates memory cell 150 according to another embodiment of the present invention. Cell 150 is formed in and/or on a substrate 12 of a first conductivity type, such as a p-type conductivity type, for example. Substrate 12 may include any suitable substrate, an illustrative, non-exclusive example of which includes a silicon on insulator (SOI) substrate. Similarly, substrate 12 may be formed from any suitable semiconductor material. Illustrative, non-exclusive examples of suitable semiconductor materials include silicon, germanium, silicon germanium, gallium arsenide, carbon nanotubes, and/or other semiconductor materials.

Substrate 12 has a surface 14 and includes a buried insulator layer 22. Buried insulator layer 22 may include any suitable dielectric material, an illustrative, non-exclusive example of which includes silicon oxide.

Memory cell 150 includes a first region 18 having a second conductivity type, such as an n-type conductivity type, that is formed in substrate 12, a second region 16 having the second conductivity type that is formed in substrate 12 and spaced apart from the first region 18, and a third region 20 having the second conductivity type that is formed in substrate 12 and spaced apart from the first and second regions 18 and 16, respectively. First, second and third regions 18, 16 and 20, respectively, may be exposed at and/or proximal to surface 14 and may be formed using any suitable method and/or process, illustrative, non-exclusive examples of which include ion implantation and/or solid state diffusion and/or epitaxial growth.

A floating body region 24, having a first conductivity type, such as a p-type conductivity type, is bounded by surface 14, first, second and third regions 18, 16, and 20, respectively, and by buried insulator layer 22. Floating body region 24 may be formed using any suitable method and/or process, illustrative, non-exclusive examples of which include an ion implantation process and/or epitaxial growth.

Referring back to FIG. 30, the method and/or process utilized to form first and third regions 18 and 20, respectively, may be optimized such that the regions 18 and 20 reach buried insulator layer 22 and electrically isolate floating body 24 from a neighboring floating body 24 of an adjacent cell when multiple cells 150 are joined in an array. On the other hand, the method and/or process utilized to form second region 16 may be optimized such that region 16 does not reach buried insulator layer 22. Therefore, floating body 24 is not isolated on the side by the second region 16.

A first gate 60 may be positioned in between the regions 16 and 18, and above the surface 14. Cell 150 may or may not comprise a second gate 64, When included, gate 64 may be positioned in between the regions 16 and 20, and above the surface 14, as shown in FIG. 30. Gate 60 is insulated from surface 14 by a first insulating layer 62 and gate 64 is insulated from surface 14 by a second insulating layer 66. Insulating layers 62 and 66 may be formed from any suitable dielectric material. Illustrative, non-exclusive examples of suitable dielectric materials include silicon oxide, high-K dielectric materials, tantalum peroxide, titanium oxide, zirconium oxide, hafnium oxide, and/or aluminum oxide. Gates 60 and 64 may be made from any suitable conductive material. Illustrative, non-exclusive examples of a suitable conductive material include a polysilicon material, a metal gate electrode, tungsten, tantalum, titanium and/or their nitrides.

Cell 150 further includes a WL terminal 70 electrically connected to gate 60, a second word line WL2 terminal 71 electrically connected to gate 64, a source line (SL) terminal 72 electrically connected to region 16, a bit line (BL) terminal 74 electrically connected to region 18, a second bit line (BL2) terminal 76 electrically connected to region 20, and a SUB terminal 78 electrically connected to substrate 12.

As discussed in more detail herein, the conductivity types described above are exemplary conductivity types and other conductivity types and/or relative conductivity types are also within the scope of the present disclosure. As an illustrative, non-exclusive example, memory cell 150 may have and/or include an n-type conductivity type as the first conductivity type and a p-type conductivity type as the second conductivity type.

Several operations can be performed by memory cell 150 such as holding, read, write logic-1 and write logic-0 operations.

A holding operation may be performed on memory cell 150 following the same principle as the holding operation of memory cell 50, where the holding operation is performed by applying a positive bias to the BL2 terminal 76, zero or low negative bias on the WL terminal 70, zero or low positive bias on WL2 terminal 71, and zero bias on the SL terminal 72, BL terminal 74, and SUB terminal 78. The positive bias applied to the region 20 connected to the BL2 terminal 76 will maintain the state of the memory cell 150 that it is connected to by maintaining the charge stored in the floating body region 24.

Figure 31:
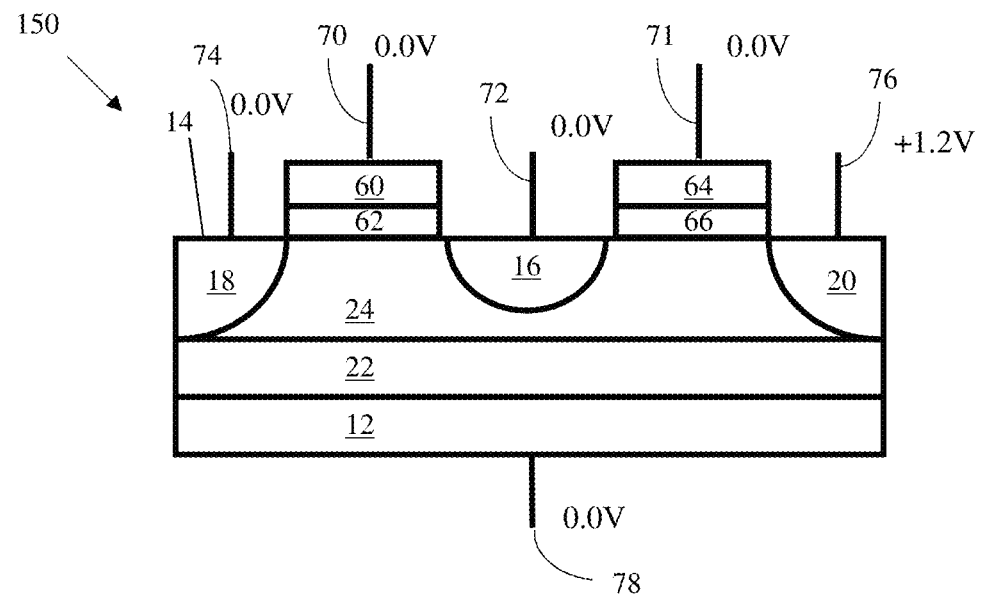
FIG. 31 illustrates one example of bias conditions for performing a holding operation according to an embodiment of the present invention.

FIG. 31 illustrates one example of bias conditions for performing a holding operation according to an embodiment of the present invention, where the following voltages are applied to memory cell 150: 0.0 volts is applied to WL terminal 70, WL2 terminal 71, SL terminal 72, BL terminal 74, and SUB terminal 78, and a positive voltage like, for example, +1.2 volts is applied to BL2 terminal 76. In other embodiments, different voltages may be applied to the various terminals of memory cell 150 as a matter of design choice and the exemplary voltages described are not limiting in any way.

Figure 32:
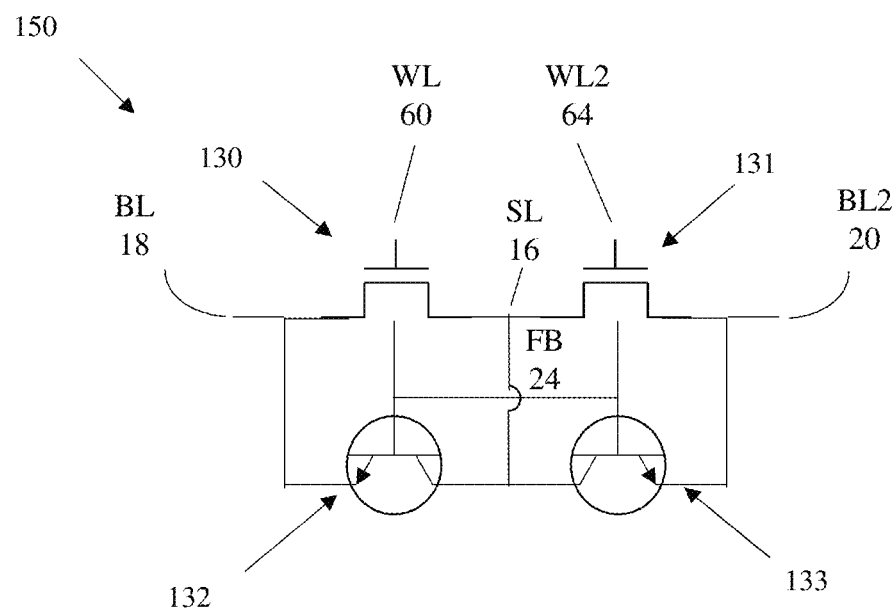
FIG. 32 illustrates an equivalent circuit representation of the memory cell of FIG. 30.

The principles of the holding operation performed on memory cell 150 may be illustrated through the equivalent circuit representation of the memory cell 150 shown in FIG. 32. FIG. 32 illustrates the equivalent circuit representation of memory cell 150, showing the intrinsic lateral bipolar transistors 132 and 133 formed by the source line region 16, the floating body region 24, and the bit line regions 18 and 20, respectively. The BL2 terminal 76 functions as the back-bias region or the collector region of the bipolar transistor which maintains the charge of the floating body region 24.

If the floating body region 24 is positively charged, the lateral bipolar transistor 133 will be turned on as the positive charge in the floating body region 24 lowers the energy barrier of electron flow into the base region (the floating body region 24). Once injected into the floating body region 24, the electrons will be swept into the region 20 (connected to BL2 terminal 76) due to the positive bias applied to the region 20. As a result of the positive bias, the electrons are accelerated and create additional hot carriers (hot hole and hot electron pairs) through an impact ionization mechanism. The resulting hot electrons flow into the BL2 terminal 76 while the resulting hot holes will subsequently flow into the floating body region 24. When the following condition is met: $\beta \times (M-1) \approx 1$ – where $\beta$ is the forward common-emitter current gain of the bipolar transistor 133 and M is the impact ionization coefficient—the amount of holes injected into the floating body region 24 compensates for the charge lost due to p-n junction forward bias current between the floating body region 24 and the source line region 16 or bit line region 18 and due to holes recombination. As a result of a positive-feedback mechanism, this process maintains the charge (i.e. holes) stored in the floating body region 24 which will keep the n-p-n bipolar transistors 133 on for as long as a positive bias is applied to the region 20 (connected to BL2 terminal 76).

If the floating body region 24 is neutral, the bipolar device 133 will remain off because the energy barrier between the floating body region 24 and the source line region 16 will prevent electron flow from source line region 16 (connected to SL terminal 72) to the floating body region 24. As a result, the floating body region 24 will remain neutral.

Figure 33:
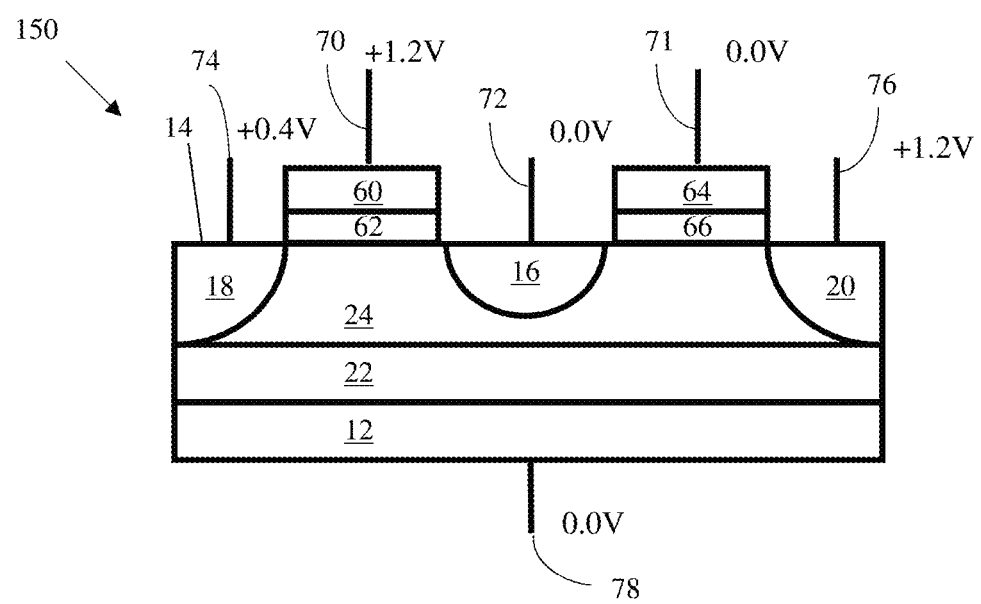
FIG. 33 illustrates a read operation performed on the memory cell of FIG. 30, according to an embodiment of the present invention

FIG. 33 illustrates a read operation performed on memory cell 150 according to an embodiment of the present invention, by applying the following bias conditions: zero or positive bias is applied to the WL terminal 70, zero or negative bias is applied to the WL2 terminal 71, a positive voltage is applied to the BL terminal 74, zero voltage is applied to the SL terminal 72, zero or positive voltage is applied to the BL2 terminal 76, and zero voltage is applied to the SUB terminal 78. If memory cell 150 is in a logic-1 state having holes in the floating body region 24, then a higher current will flow from the BL terminal 74 to the SL terminal 72 of the selected memory cell 150, compared to if memory cell 150 is in a logic-0 state having no holes in the floating body region 24. Current may flow from the BL terminal 74 to the SL terminal 72 through the transistor 130 and/or the bipolar transistor 132 (where the current may flow through the lower portion of the floating body region 24). In one particular embodiment, about +1.2 volts is applied to the WL terminal 70, about +0.4 volts is applied to the BL terminal 74, about 0.0 volts is applied to the WL2 terminal 71, about 0.0 volts is applied to the SL terminal 72, about +1.2 volts is applied to the BL2 terminal 76, and about 0.0 volts is applied to the SUB terminal 78.

Figure 34:
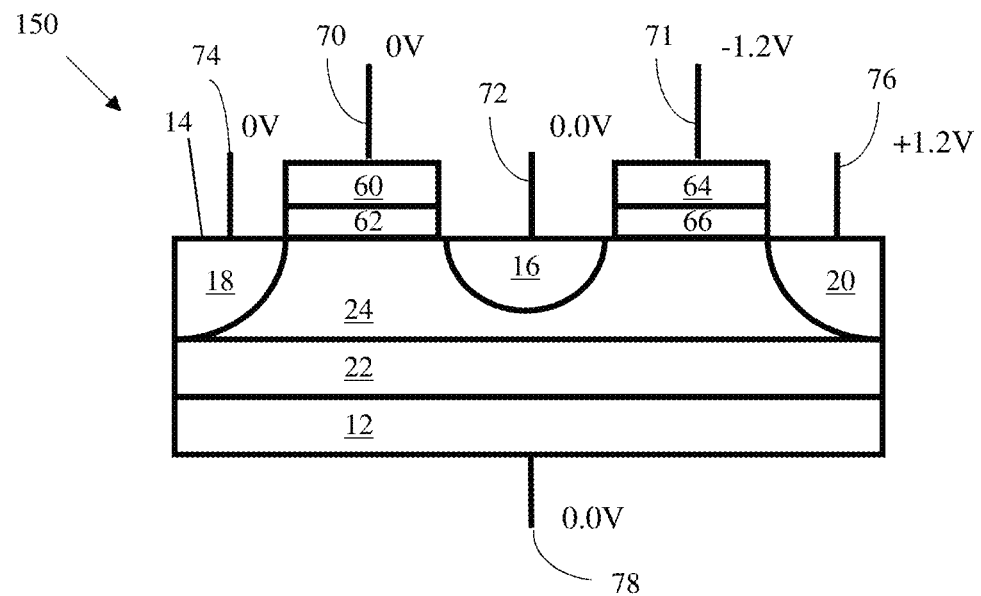
FIG. 34 illustrates an exemplary write logic-1 operation using band-to-band tunneling mechanism, according to an embodiment of the present invention

FIG. 34 illustrates an exemplary write logic-1 operation using band-to-band tunneling mechanism, according to an embodiment of the present invention, where the following bias conditions are applied: zero or negative bias is applied is applied to the WL terminal 70, a negative voltage to the WL2 terminal 71, zero bias is applied to the BL terminal 74 and the SL terminal 72, a positive voltage is applied to the BL2 terminal 76, and zero bias is applied to the SUB terminal 78. The positive bias applied to the drain region of the memory cell 150 (connected to the BL2 terminal 76) along with the negative voltage applied to the gate 64 (connected to the WL2 terminal 71) will create a strong electric field around the junction area of the drain region 20 in the proximity of the gate 64. The strong electric field bends the energy band sharply upward near the gate 64 and drain region 20 junction overlap region, causing electrons to tunnel from the valence band of the floating body region 24 to the conduction band of the drain region 20, leaving holes in the valence band of the floating body region 24. The electrons which tunnel across the energy band become the drain region 20 leakage current, while the holes are injected into floating body region 24 and become the hole charge that creates the logic-1 state.

In one particular non-limiting embodiment, about 0.0 volts is applied to the WL terminal 70, about −1.2 volts is applied to the WL2 terminal 71, about 0 volts is applied to the BL terminal 74, about 0.0 volts is applied to the SL terminal 72, about +1.2 volts is applied to the BL2 terminal 76, and about 0.0 volts is applied to the SUB terminal 78.

Figure 35:
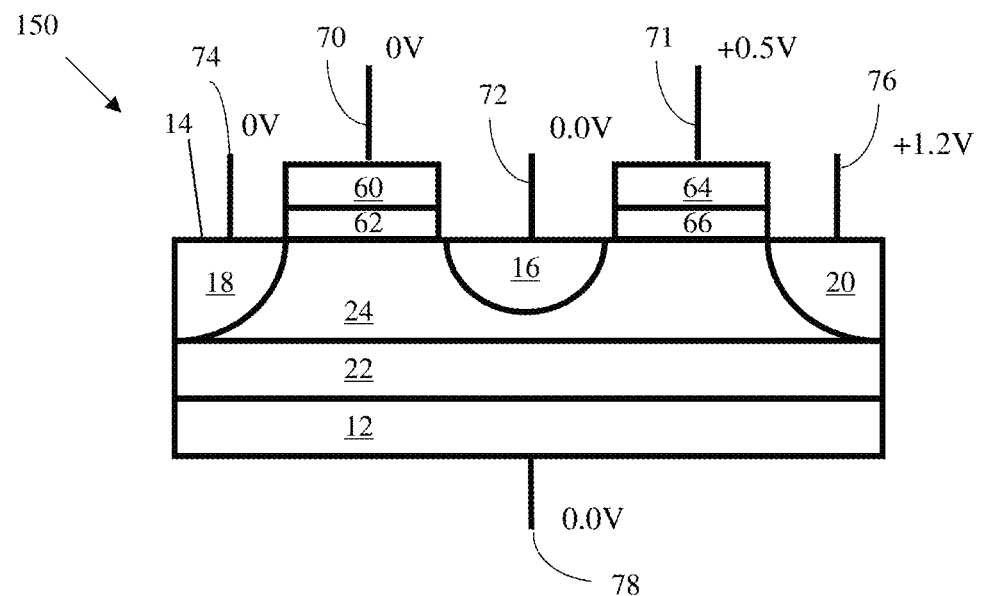
FIG. 35 illustrates exemplary bias conditions for a write logic-1 operation through an impact ionization mechanism, according to an embodiment of the present invention

FIG. 35 illustrates exemplary bias conditions for a write logic-1 operation through an impact ionization mechanism, according to an embodiment of the present invention, where the following bias conditions are applied: zero bias is applied to the WL terminal 70, a positive voltage is applied to the WL2 terminal 71, zero bias is applied to the BL terminal 74, zero voltage is applied to the SL terminal 72, a positive voltage is applied to the BL2 terminal 76, and zero voltage is applied to the SUB terminal 78. The positive voltage applied to the WL2 terminal 71 and the BL2 terminal 76 is configured to maximize hole generation through the impact ionization process, where the voltage on the bit line region 20 of the memory cell 150 is typically greater than the voltage applied to the gate 64.

In one particular non-limiting embodiment, about 0 volts is applied to the WL terminal 70, about +0.5 volts is applied to the WL2 terminal 71, about 0 volts is applied to the BL terminal 74, about 0.0 volts is applied to the SL terminal 72, about +1.2 volts is applied to the BL2 terminal 76, and about 0.0 volts is applied to the SUB terminal 78. These voltage levels are exemplary only and may vary from embodiment to embodiment. Thus the exemplary embodiments, features, bias levels, etc., described are not limiting.

Figure 36:
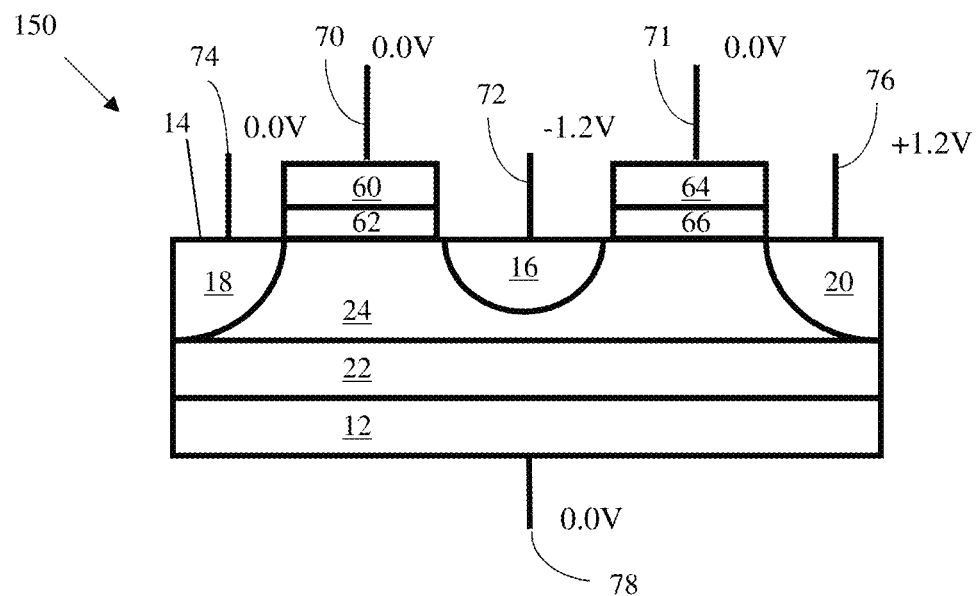
FIG. 36 illustrates exemplary bias conditions for performing a write logic-0 operation, according to an embodiment of the present invention

FIG. 36 illustrates exemplary bias conditions for performing a write logic-0 operation, according to an embodiment of the present invention, by applying the following bias conditions: a negative voltage is applied to the SL terminal 72, zero voltage is applied to the WL terminal 70, WL2 terminal 71, BL terminal 74, and SUB terminal 78, and zero or positive voltage is applied to the BL2 terminal 76. Under these conditions, the p-n junction between the floating body 24 and the source line region 16 is forward-biased, evacuating holes from the floating body 24. All memory cells sharing the same SL terminal 72 will be written to simultaneously. To write arbitrary binary data to different memory cells 150, a write logic-0 operation is first performed on all the memory cells to be written, followed by one or more write logic-1 operations on the memory cells that must be written to logic-1.

In one particular non-limiting embodiment, about −1.2 volts is applied to the selected SL terminal 72, about 0.0 volts is applied to the WL terminal 70, WL2 terminal 71, BL terminal 74, and SUB terminal 78, and about +1.2 volts is applied to the BL2 terminal 76. These voltage levels are exemplary only and may vary from embodiment to embodiment. Thus the exemplary embodiments, features, bias levels, etc., described are not limiting.

Figure 37A:
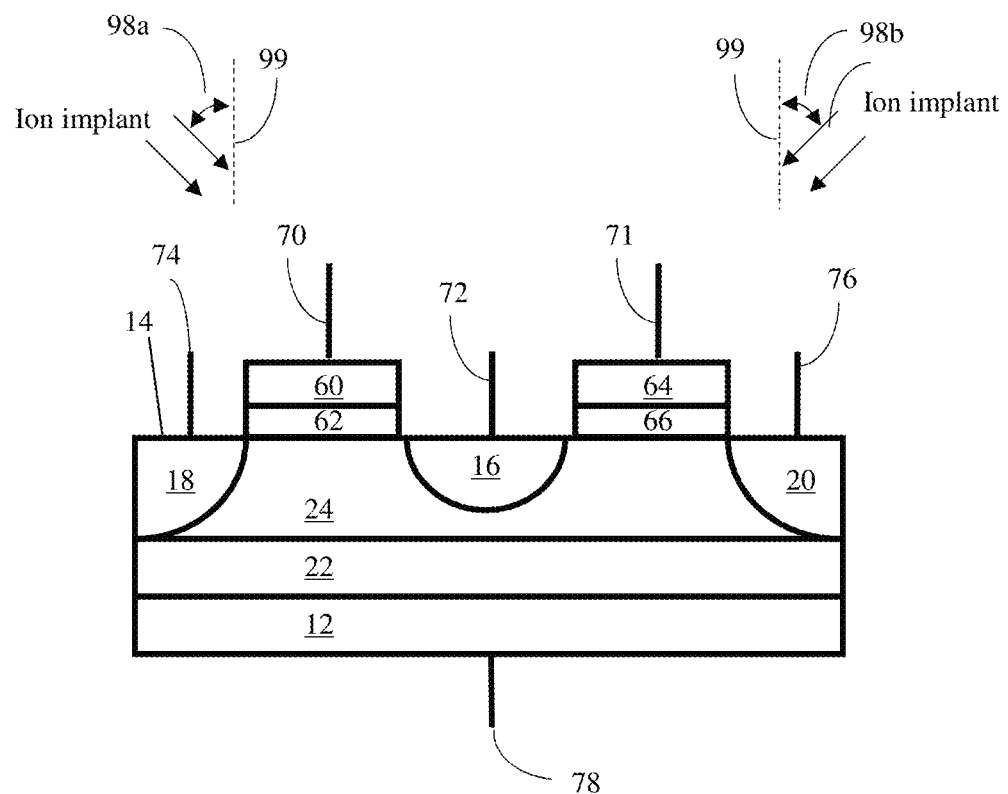
FIGS. 37A and 37B illustrate exemplary process steps to achieve a shallower region relative to deeper regions within a memory cell, according to various embodiment of the present invention.
Figure 37B:
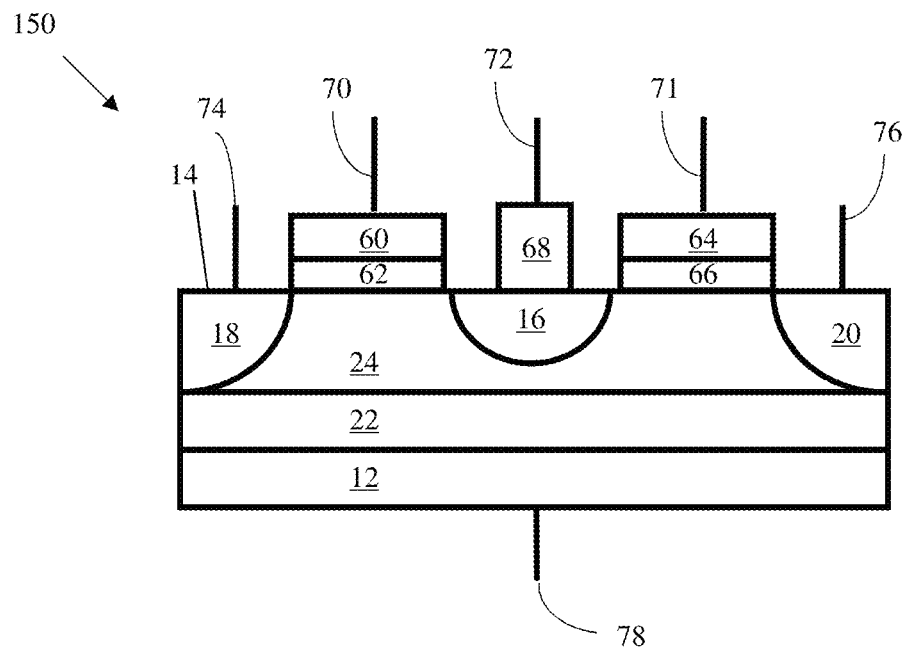

FIGS. 37A and 37B illustrate exemplary process steps to achieve shallower region 16 relative to the regions 18 and 20. FIG. 37A illustrates an ion implantation process, where the ion implantation is performed at angles 98a, 98b to the normal 99 to the surface 14. For example, ion implantation is performed from one side of device 150 (left side as shown in FIG. 37A) at an angle 98a between 0° and 45° (counter-clockwise, as shown in FIG. 37A), and ion implantation is performed from the other side of device 150 (right side as shown in FIG. 37A) at an angle 98b between 0° and 45° (clockwise, as shown in FIG. 37A, or between 315° and 360° if measured in the same direction as angle 98a). Typically the angles 98a and 98b are mirror images of one another on opposite sides of the normal 99, but this is not required. For example, an asymmetric shallow region 16 can be formed by making angle 98a not equal and opposite to angle 98b. The neighboring gate regions 60 and 64 will create a shadow region with respect to the ion implantation, resulting in a lower implant dose in the region in between the gate regions 60 and 64, which subsequently results in a shallower region 16. The separation distance between the gate regions 60 and 64 may also be optimized to create a smaller opening, which will subsequently result in a shallower region 16. For example, the narrower space between gate regions 60 and 64 may result in a shallower region 16. Furthermore, the higher thickness of the gate regions 60 and 62 may result in a shallower region 16.

FIG. 37B illustrates a process step to form a shallower region 16 according to another embodiment of the present invention. In this embodiment, regions 18 and 20 are made by the typical processes that have been described previously, such as by a normal ion implantation process, for example, and the region that is to be made into region 16 is left undoped, so that it is the same are region 24. Region 68 is made from polysilicon material doped with the second conductivity type such as n-type. Subsequent thermal annealing will result in dopant outdiffusion from the polysilicon region 68 to form a shallower region 16. Region 68 may also be made of other conductive material, illustrative, non-exclusive examples of which include a metal electrode, tungsten, tantalum, titanium and/or their nitrides, which will form a Schottky contact between the region 68 and the region 16.

Figure 38:
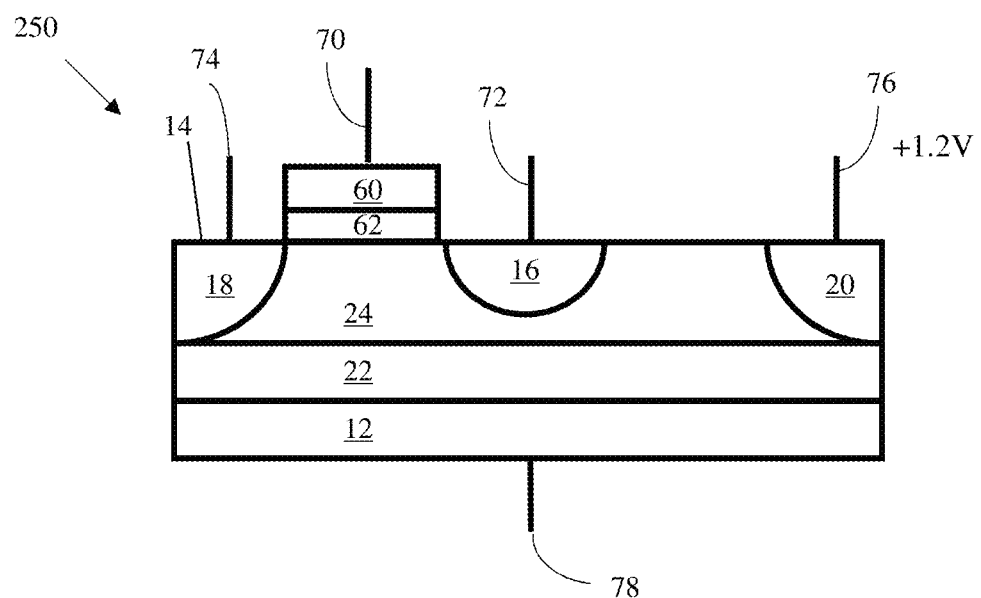
FIG. 38 schematically illustrates a memory cell according to another embodiment of present invention.

FIG. 38 illustrates memory cell 250 according to another embodiment of present invention. Memory cell 250 comprises only one gate region 60. The second gate region that is present in memory cell 150 (i.e. gate 64) is absent in memory cell 250.

Figure 39:
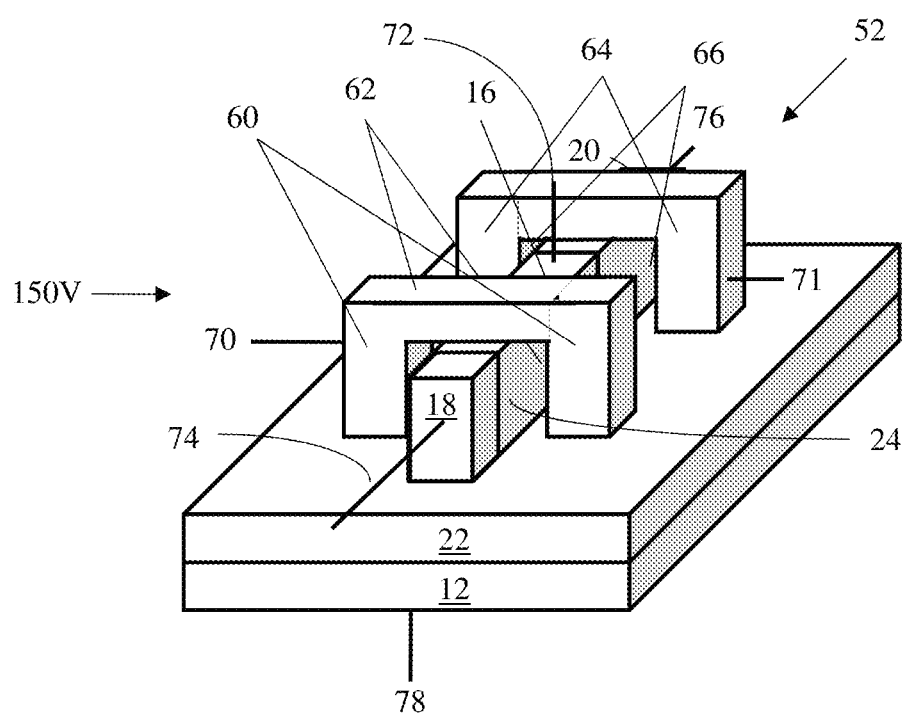
FIG. 39 illustrates a memory cell having a fin structure fabricated on a substrate, according to an embodiment of the present invention.

FIG. 39 illustrates memory cell 150V which has a fin structure 52 fabricated on substrate 12 of a first conductivity type, such as a p-type conductivity type, for example. Substrate 12 may include any suitable substrate, an illustrative, non-exclusive example of which includes a silicon on insulator (SOI) substrate. Similarly, substrate 12 may be formed from any suitable semiconductor material, illustrative, non-exclusive examples of which include silicon, germanium, silicon germanium, gallium arsenide, carbon nanotubes, and/or other semiconductor materials.

Substrate 12 has a surface and includes a buried insulator layer 22. Buried insulator layer 22 may include any suitable dielectric material, an illustrative, non-exclusive example of which includes silicon oxide.

Memory cell 150V includes a first region 18 having a second conductivity type, such as an n-type conductivity type, that is formed in fin 52, a second region 16 having the second conductivity type that is formed in fin 52 and spaced apart from the first region 18, and a third region 20 having the second conductivity type that is formed in fin 52 and spaced apart from the first and second regions 18 and 16, respectively. First, second and third regions 18, 16 and 20, respectively, may be exposed at and/or proximal to the surface and may be formed using any suitable method and/or process, illustrative, non-exclusive examples of which include ion implantation and/or solid state diffusion and/or epitaxial growth.

First and third regions 18 and 20, respectively, reach buried insulator layer 22 and insulate floating body 24 from a neighboring floating body 24 of an adjacent cell when multiple cells 150V are joined in an array. On the other hand, the method and/or process utilized to form second region 16 may be optimized such that region 16 does not reach buried insulator layer 22. Therefore, floating body 24 is not isolated on the side by the second region 16.

The operation of the memory cell 150V is similar to that of memory cell 150.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiments, methods, and examples, but by all embodiments and methods within the scope and spirit of the invention as claimed.

That which is claimed is:

1. A semiconductor memory array comprising:
 a plurality of NAND string configurations, each said NAND string configuration comprising:
  a plurality of semiconductor memory cells serially connected to one another to form a string of semiconductor memory cells;
  a select gate drain device connected at one end of said string of semiconductor memory cells, wherein said select gate drain device is not a semiconductor memory cell; and
  a select gate source device connected at an opposite end from said one end of said string of semiconductor memory cells, wherein said select gate source device is not a semiconductor memory device;
  wherein at least one of said plurality of semiconductor memory cells each comprise a substrate and a floating body region formed as part of said substrate and configured to store data as charge therein to define a state of said semiconductor memory cell; a first region in electrical contact with said floating body region; a second region in electrical contact with said floating body region and spaced apart from said first region; and a third region in electrical contact with said floating body region and spaced apart from said first and second regions;
  wherein said third region is configured to function as a collector region to maintain a charge of said floating body region, thereby maintaining said state of said floating body region;
  wherein said third region is commonly connected to at least two of said semiconductor memory cells;
  wherein each said at least one of said plurality of semiconductor memory cells has only one gate;
  wherein serial connections between at least two of said semiconductor memory cells are not connected to any terminals;
  wherein said select gate drain device is connected to a local bit line; and
 at least one transistor isolating said local bit line from a primary bit line.

2. The semiconductor memory array of claim 1, wherein each said NAND string configuration is configured to perform at least one of: injecting charge into or extracting charge out of a portion of at least one of said semiconductor memory cells to maintain a state of said at least one of said semiconductor memory cells.

3. The semiconductor memory array of claim 1, wherein said third region is configured to perform at least one of injecting charge into or extracting charge out of at least a portion of said floating body region.

4. The semiconductor memory array of claim 1, wherein said floating body region is provided in a fin structure that extends vertically above said third region.

5. The semiconductor memory array of claim 1, wherein a constant voltage bias is applied to said third region.

6. The semiconductor memory array of claim 1, wherein a periodic pulse of voltage is applied to said third region.

7. An integrated circuit comprising:
 a semiconductor memory array comprising:
  a plurality of semiconductor memory cells serially connected to one another to form a string of semiconductor memory cells;

a select gate drain device connected at one end of said string of semiconductor memory cells, wherein said select gate drain device is not a semiconductor memory cell; and a select gate source device connected at an opposite end of said string of semiconductor memory cells, wherein said select gate source device is not a semiconductor memory device;

wherein at least one of said plurality of semiconductor memory cells each comprise a substrate and a floating body region formed as part of said substrate and configured to store data as charge therein to define a state of said semiconductor memory cell; a first region in electrical contact with said floating body region; a second region in electrical contact with said floating body region and spaced apart from said first region; and a third region in electrical contact with said floating body region and spaced apart from said first and second regions;

wherein said third region is configured to function as a collector region to maintain a charge of said floating body region, thereby maintaining said state of said semiconductor memory cell;

wherein each of said at least one of said plurality of semiconductor memory cells has only one gate;

wherein serial connections between at least two of said semiconductor memory cells are not connected to any terminals;

wherein said select gate drain device is connected to a local bit line;

at least one transistor isolating said local bit line from a primary bit line; and a control circuit configured to provide electrical signals to said local bit line and said primary bit line.

8. The integrated circuit of claim 7, wherein said string of semiconductor memory cells is configured to perform at least one of: injecting charge into or extracting charge out of a portion of at least one of said semiconductor memory cells to maintain a state of said at least one semiconductor memory cell.

9. The integrated circuit of claim 7, wherein said third region is configured to perform said at least one of injecting charge into or extracting charge out of at least a portion of said floating body region.

10. The integrated circuit of claim 7, wherein said floating body region is provided in a fin structure that extends vertically above said third region.

11. The integrated circuit of claim 7, wherein a constant voltage bias is applied to said third region.

12. The integrated circuit of claim 7, wherein a periodic pulse of voltage is applied to said third region.

13. A semiconductor memory array comprising:

a plurality of NAND string configurations, each said NAND string configuration comprising:

a plurality of semiconductor memory cells serially connected to one another to form a string of semiconductor memory cells;

a select gate drain device connected at one end of said string of semiconductor memory cells, wherein said select gate drain device is not a semiconductor memory cell; and a select gate source device connected at an opposite end of said string of semiconductor memory cells, wherein said select gate source device is not a semiconductor memory device;

wherein at least one of said plurality of semiconductor memory cells each comprise a substrate and a floating body region formed as part of said substrate and configured to store data as charge therein to define a state of said semiconductor memory cell; a first region in electrical contact with said floating body region; a second region in electrical contact with said floating body region and spaced apart from said first region; a third region in electrical contact with said floating body region and spaced apart from said first and second regions;

wherein said third region is configured to function as a collector region to maintain a charge of said floating body region, thereby maintaining said state of said floating body region;

wherein said third region is commonly connected to at least two of said semiconductor memory cells;

wherein each said at least one of said plurality of semiconductor memory cells has only one gate;

wherein serial connections between at least two of said semiconductor memory cells are not connected to any terminals;

wherein said select gate source device is connected to a local source line; and at least one transistor isolating said local source line from a primary source line.

14. The semiconductor memory array of claim 13, wherein each said NAND string configuration is configured to perform at least one of: injecting charge into or extracting charge out of a portion of at least one of said semiconductor memory cells to maintain a state of said at least one semiconductor memory cell.

15. The semiconductor memory array of claim 13, wherein said third region is configured to perform said at least one of injecting charge into or extracting charge out of at least a portion of said floating body region.

16. The semiconductor memory array of claim 13, wherein said floating body region is provided in a fin structure that extends vertically above said third region.

17. The semiconductor memory array of claim 13, wherein a constant voltage bias is applied to said third region.

18. The semiconductor memory array of claim 13, wherein a periodic pulse of voltage is applied to said third region.

* * * * *